(12) United States Patent
Kim et al.

(10) Patent No.: US 12,376,476 B2
(45) Date of Patent: Jul. 29, 2025

(54) DISPLAY DEVICE

(71) Applicant: LG ELECTRONICS INC., Seoul (KR)

(72) Inventors: Kyeongdong Kim, Seoul (KR); Dongkyoon Han, Seoul (KR); Hoyoung Kim, Seoul (KR); Hyeongjun Kwon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 121 days.

(21) Appl. No.: 17/918,745

(22) PCT Filed: Apr. 13, 2020

(86) PCT No.: PCT/KR2020/004952
§ 371 (c)(1),
(2) Date: Oct. 13, 2022

(87) PCT Pub. No.: WO2021/210693
PCT Pub. Date: Oct. 21, 2021

(65) Prior Publication Data
US 2023/0247892 A1   Aug. 3, 2023

(51) Int. Cl.
*H05K 5/00* (2025.01)
*H05K 5/02* (2006.01)
(Continued)

(52) U.S. Cl.
CPC ......... *H10K 59/871* (2023.02); *H05K 5/0217* (2013.01); *H10K 2102/311* (2023.02)

(58) Field of Classification Search
None
See application file for complete search history.

(56) References Cited

U.S. PATENT DOCUMENTS 10,111,344 B2 * 10/2018 Han ..................... H05K 7/1427
10,201,103 B2 *  2/2019 Kim ....................... H04N 5/655
(Continued)

FOREIGN PATENT DOCUMENTS

EP          3557370       10/2019
JP        2013020057       1/2013
(Continued)

OTHER PUBLICATIONS

European Patent Office Application Serial No. 20931089.5, Search Report dated Dec. 8, 2023, 9 pages.

(Continued)

*Primary Examiner* — Anthony Q Edwards
*Assistant Examiner* — Rashen E Morrison
(74) *Attorney, Agent, or Firm* — LEE, HONG, DEGERMAN, KANG & WAIMEY

(57) ABSTRACT

A display device is disclosed. The display device of the present disclosure comprises: an elongated roller; a flexible display panel that is wound on or unwound from the roller; a module cover located at the rear of the display panel; a foldable link that is adjacent to the rear surface of the module cover and is folded or unfolded in the upward and downward directions by being pivoted about a pivot axis parallel to the forward and backward directions; and a sheet that is coupled to the foldable link between the module cover and the foldable link, wherein the coefficient of friction of the sheet is lower than the coefficient of friction of the foldable link.

12 Claims, 67 Drawing Sheets

(51) Int. Cl.
*H10K 59/80* (2023.01)
*H10K 102/00* (2023.01)

(56) References Cited

U.S. PATENT DOCUMENTS

| | | | |
|---|---|---|---|
| 10,531,582 B2* | 1/2020 | Park | H05K 5/0017 |
| 11,073,869 B2* | 7/2021 | Ahn | B32B 17/10 |
| 11,403,974 B2* | 8/2022 | Kim | G06F 1/1601 |
| 2019/0098774 A1* | 3/2019 | Park | G09F 9/301 |
| 2019/0324501 A1* | 10/2019 | Kim | H05K 5/0017 |
| 2020/0396850 A1* | 12/2020 | Kim | G02F 1/133305 |
| 2022/0269312 A1* | 8/2022 | Choi | G06F 1/1652 |
| 2023/0042596 A1* | 2/2023 | Park | G01K 3/005 |

FOREIGN PATENT DOCUMENTS

| | | |
|---|---|---|
| KR | 1020160047100 | 5/2016 |
| KR | 10-2016-0129669 | 11/2016 |
| KR | 1020180027318 | 3/2018 |
| KR | 1020190013002 | 2/2019 |
| KR | 10-2019-0034975 | 4/2019 |
| KR | 1020190122389 | 10/2019 |

OTHER PUBLICATIONS

PCT International Application No. PCT/KR2020/004952, Search Report dated Jan. 22, 2021, 3 pages.
Korean Intellectual Property Office Application No. 10-2022-7038933, Office Action dated Aug. 19, 2024, 5 pages.

* cited by examiner

[FIG. 1]
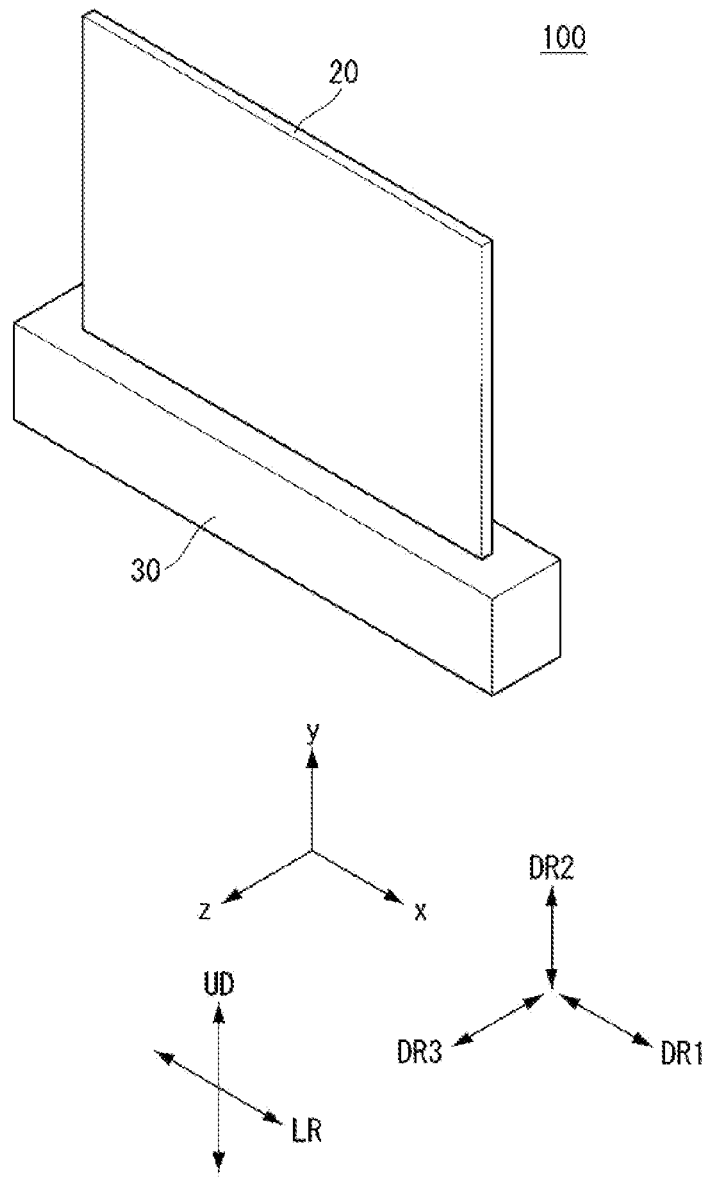

[FIG. 2]
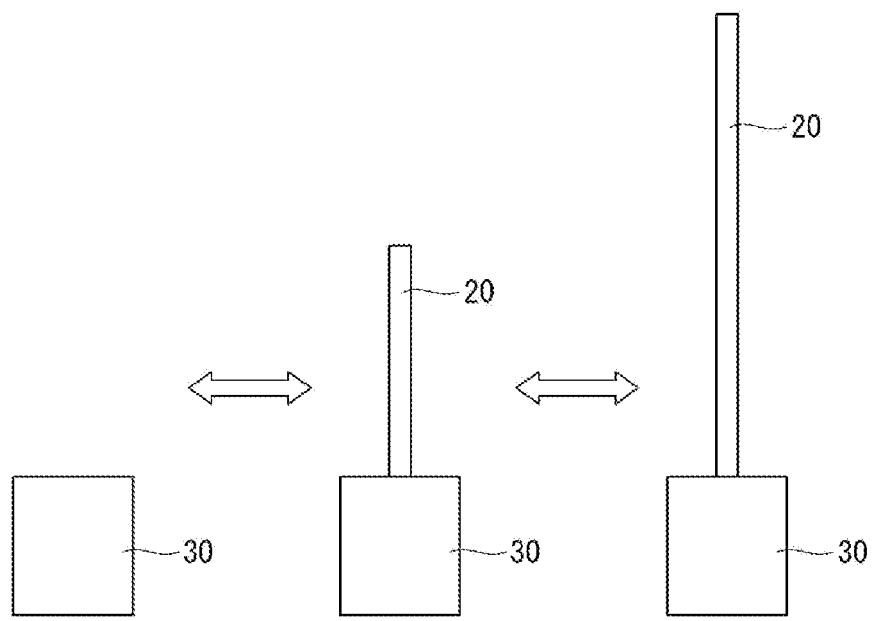

[FIG. 3]
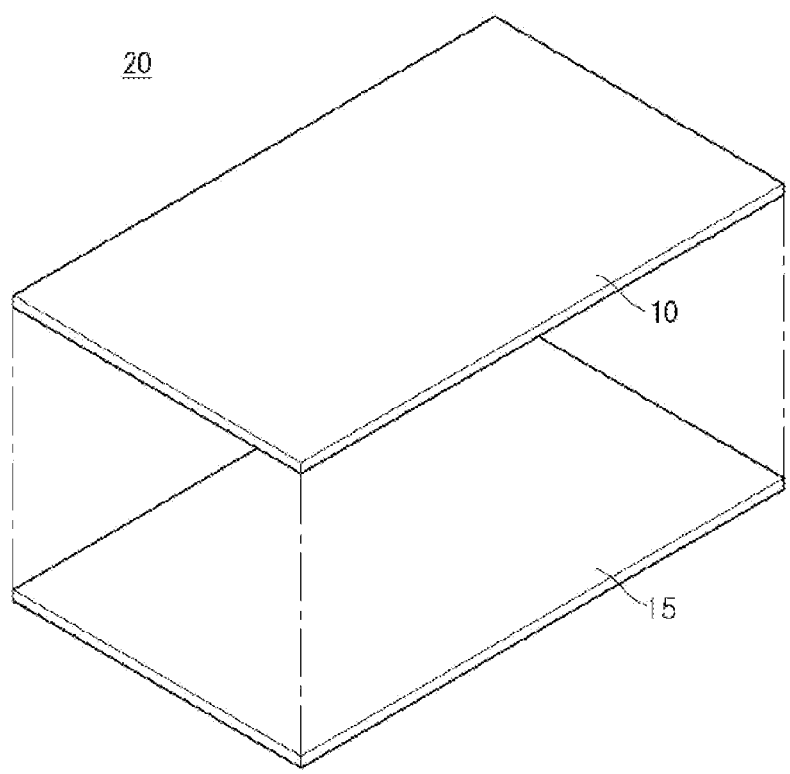

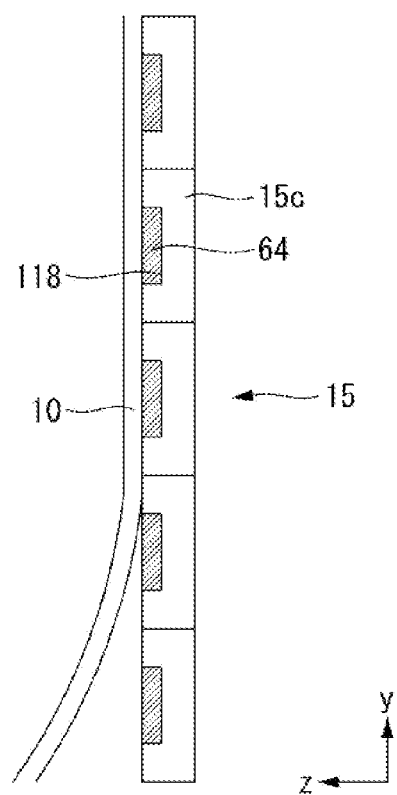
[FIG. 4]

[FIG. 5]
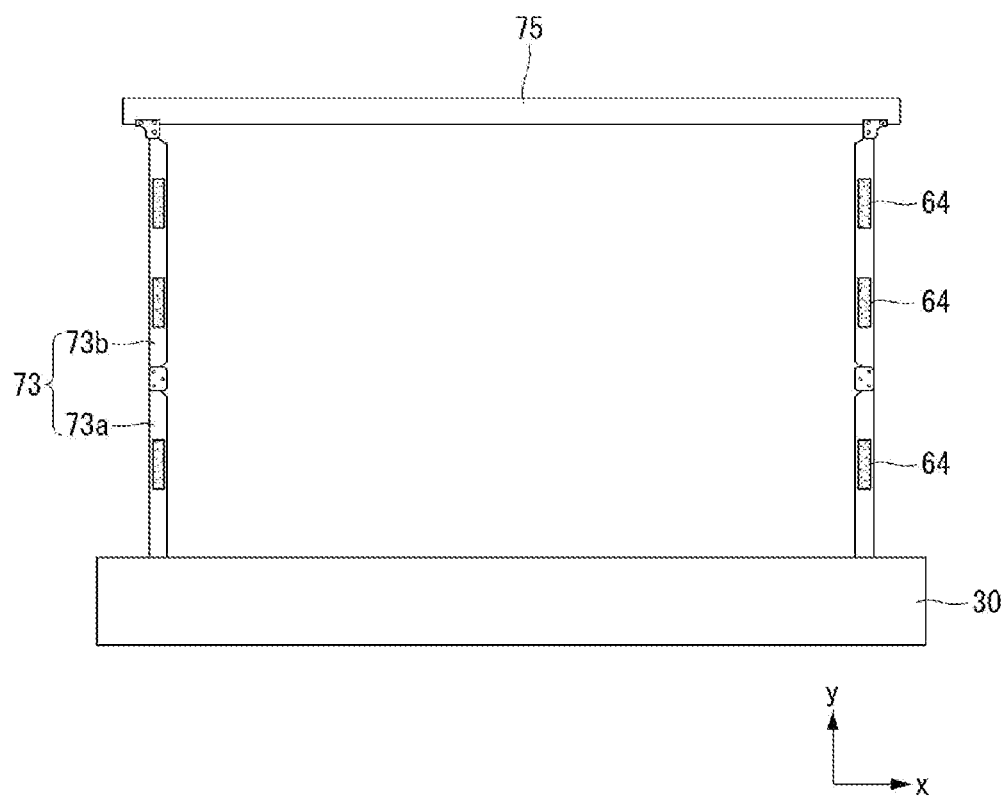

[FIG. 6]
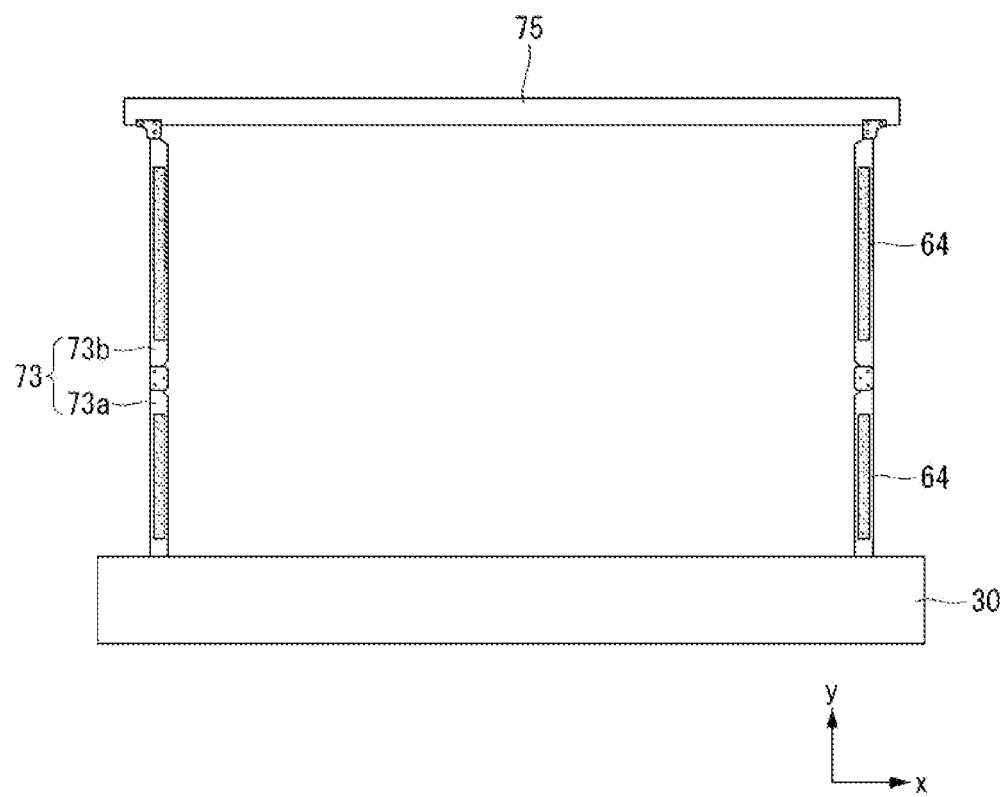

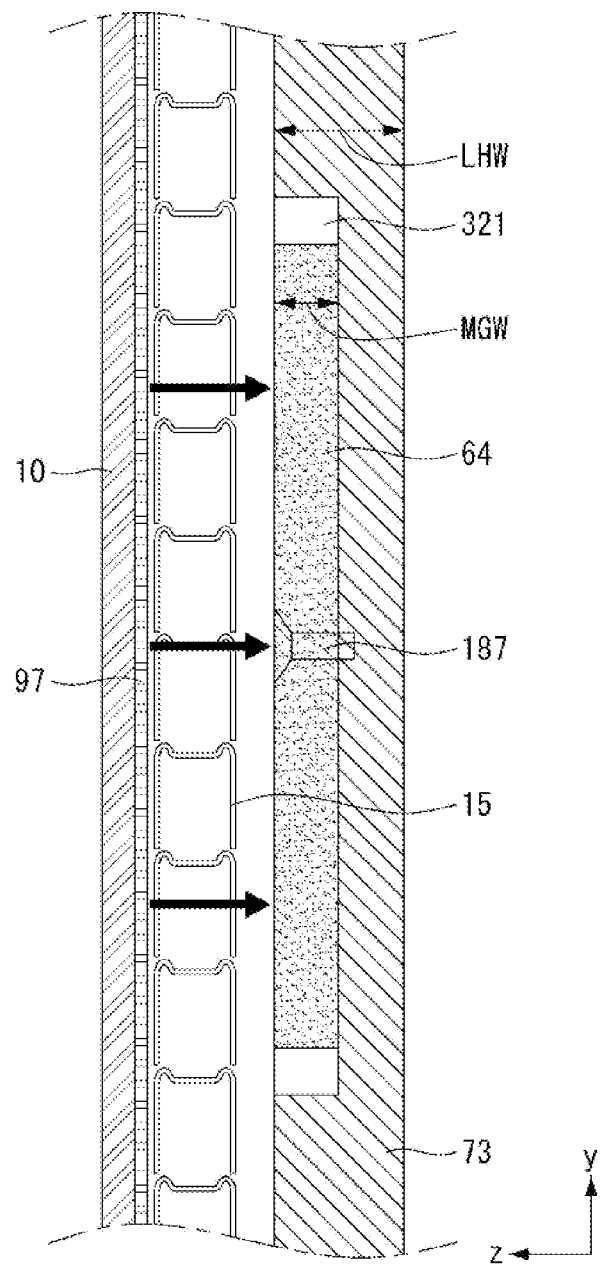
[FIG. 7]

[FIG. 8]
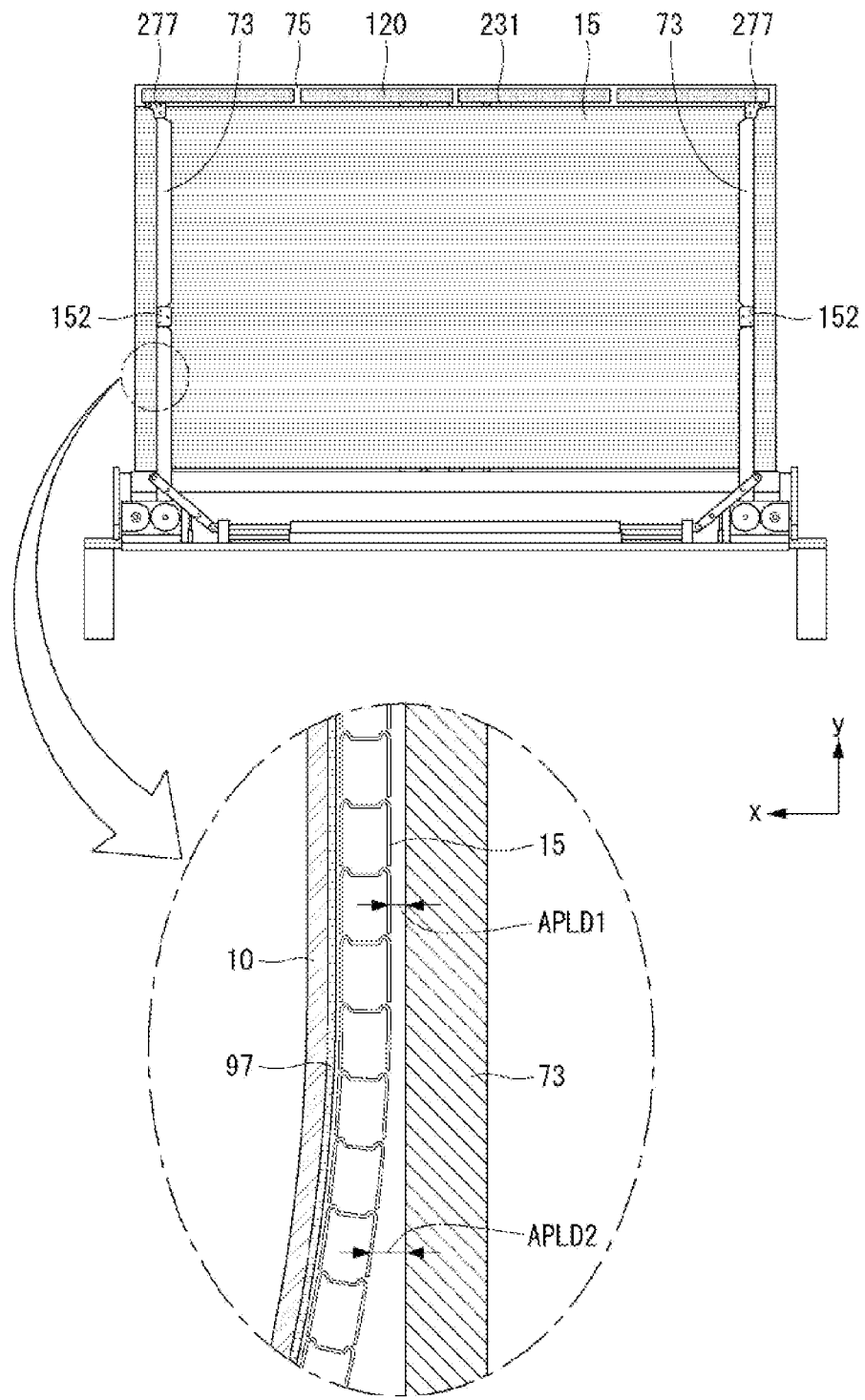

[FIG. 9]
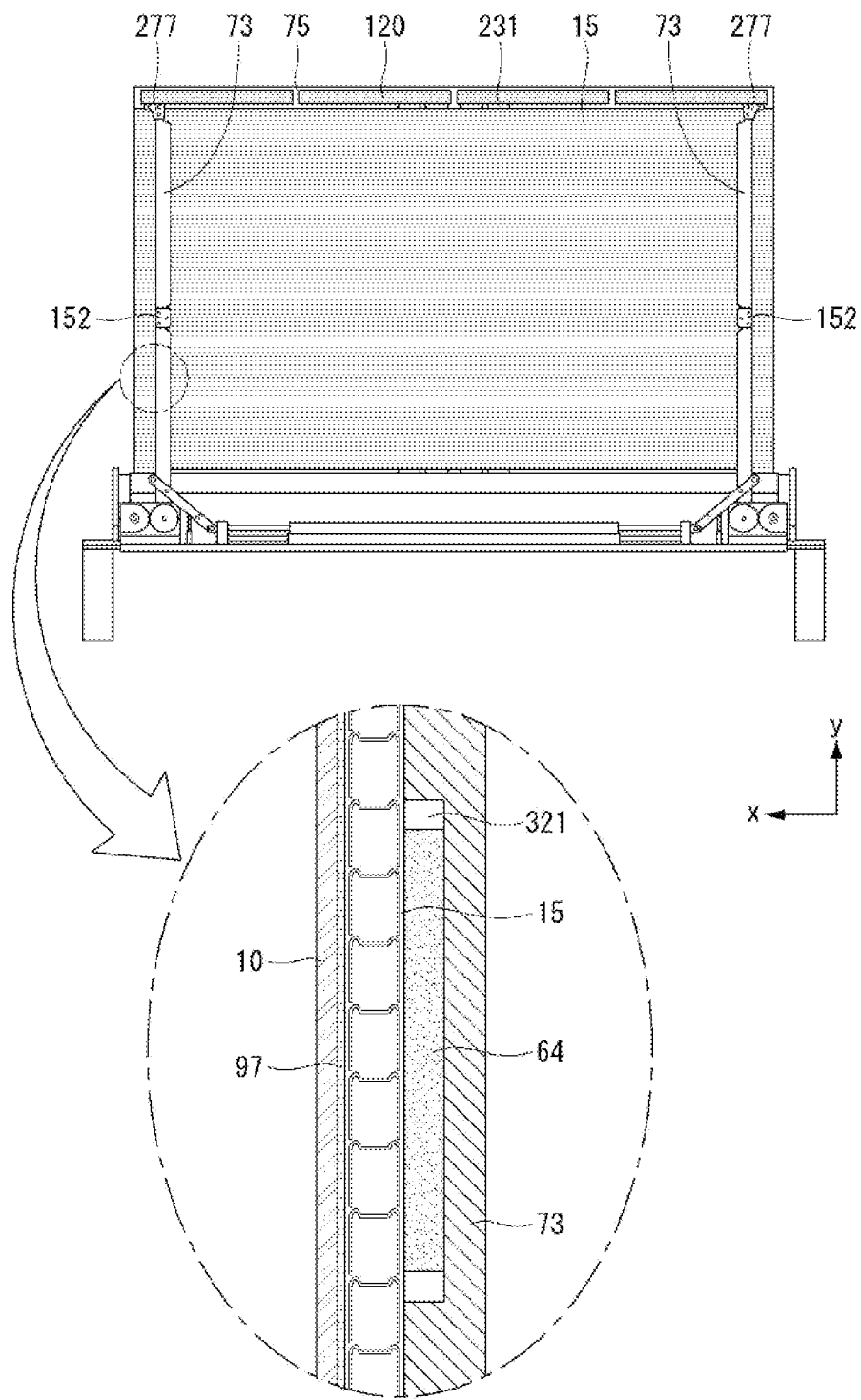

[FIG. 10]
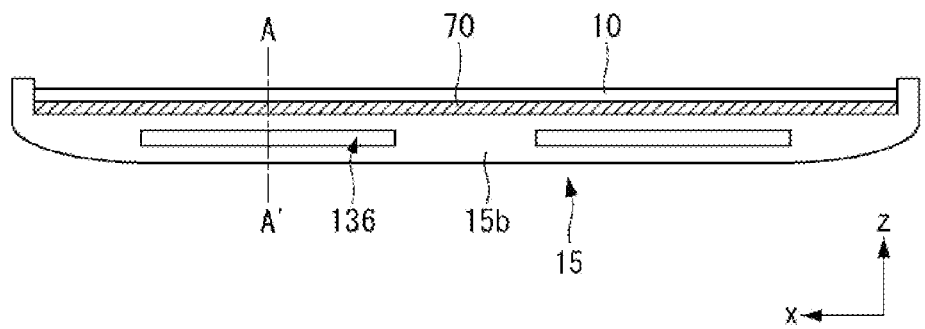
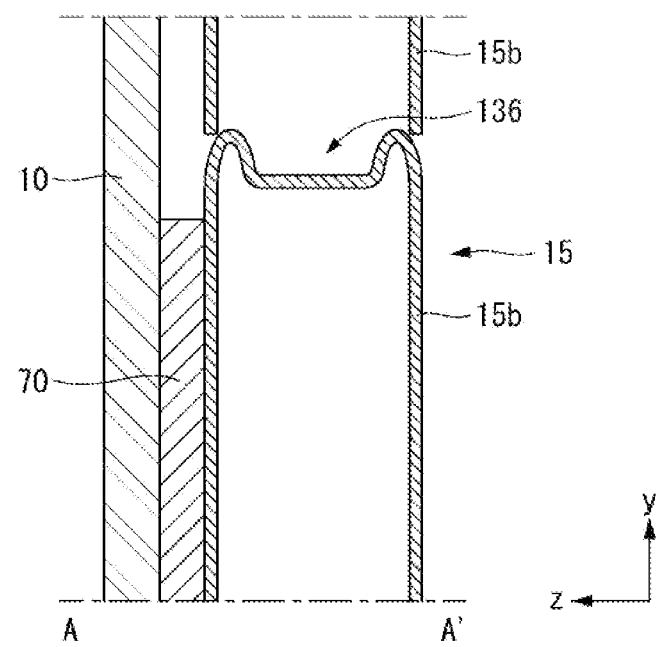

[FIG. 11]
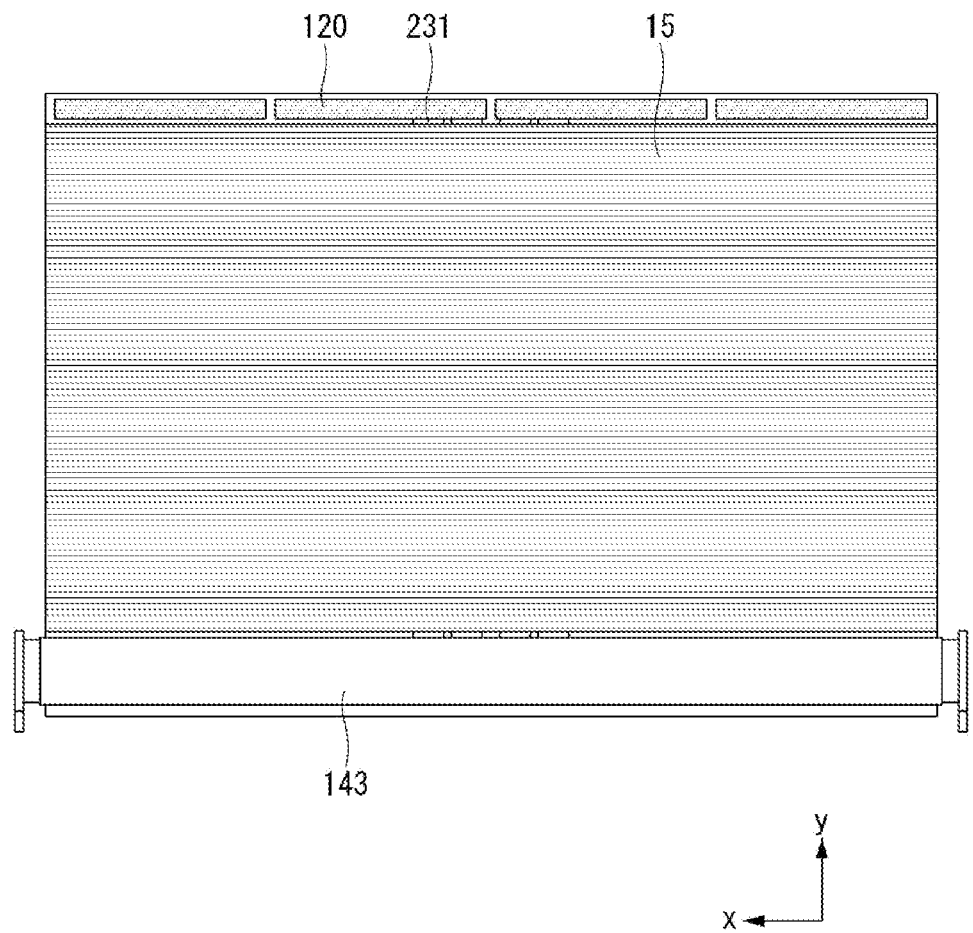

[FIG. 12]
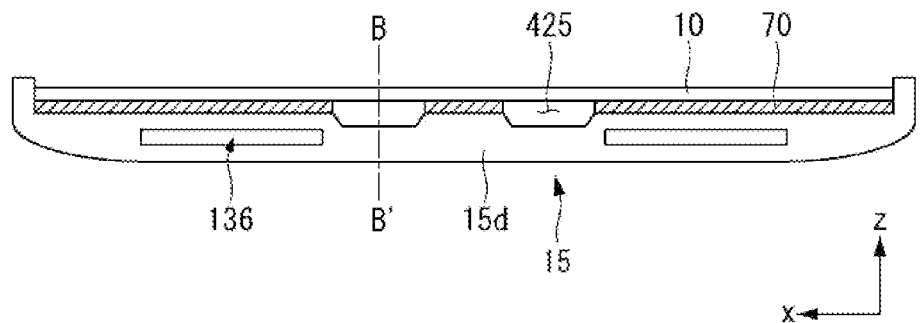
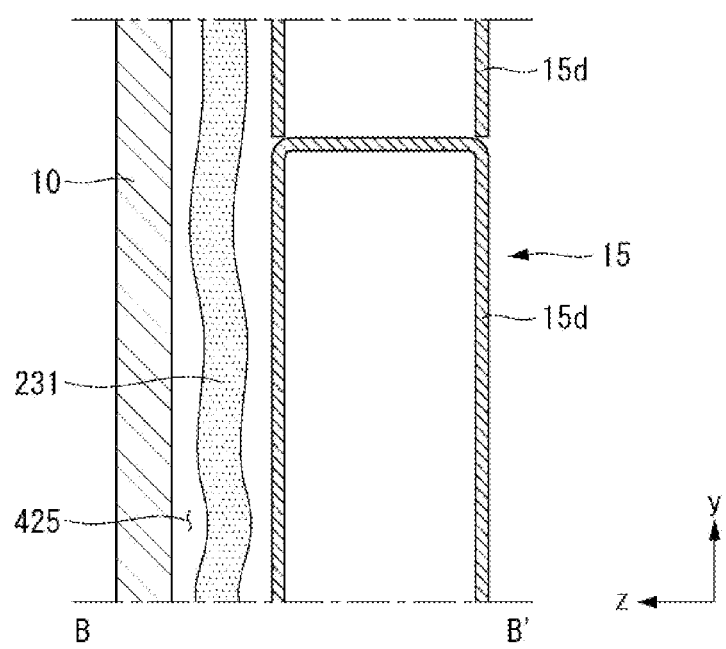

[FIG. 13]
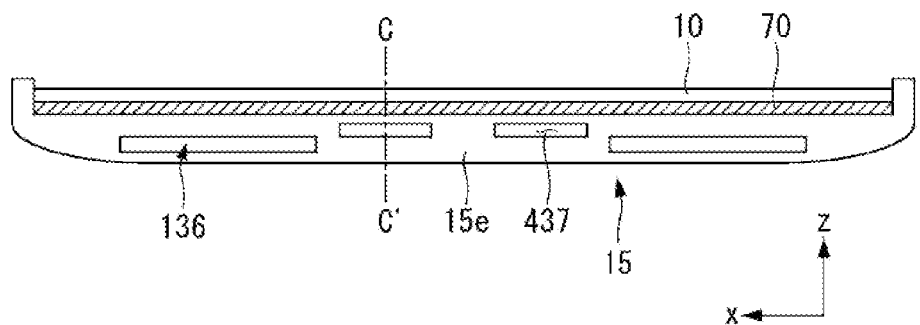
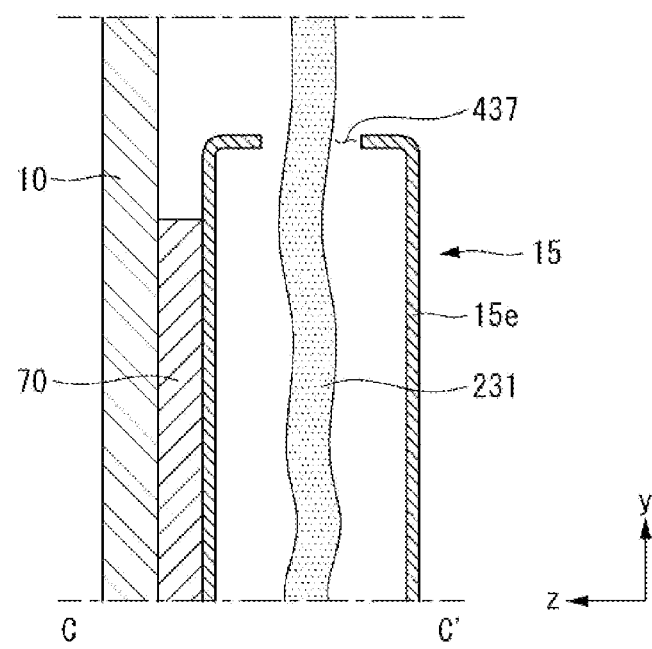

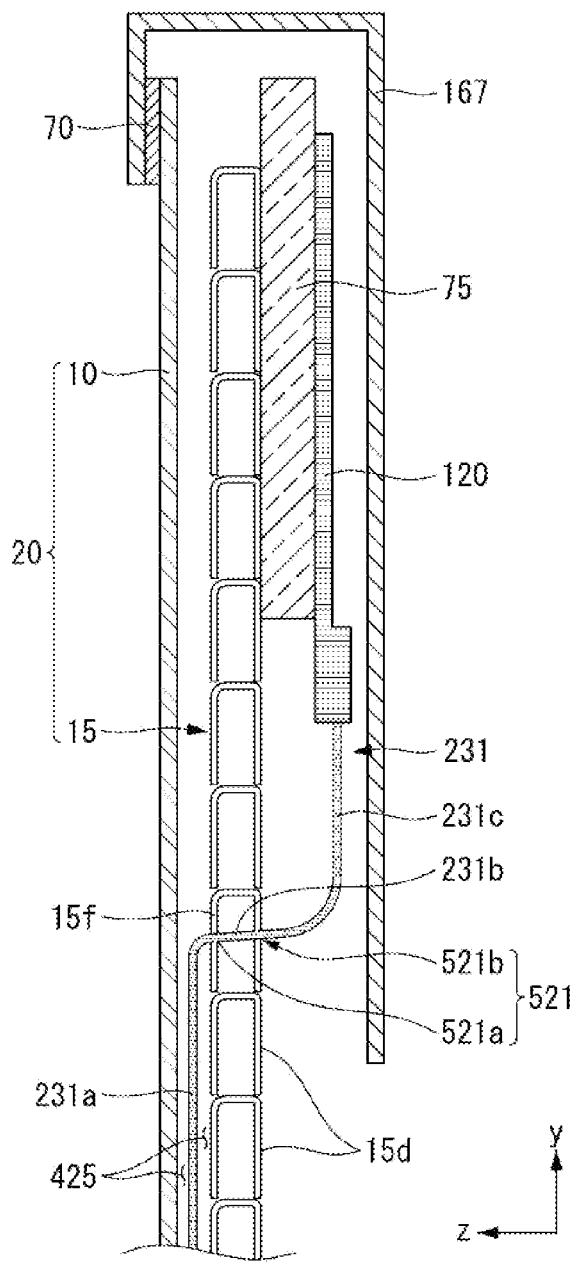
[FIG. 14]

[FIG. 15]
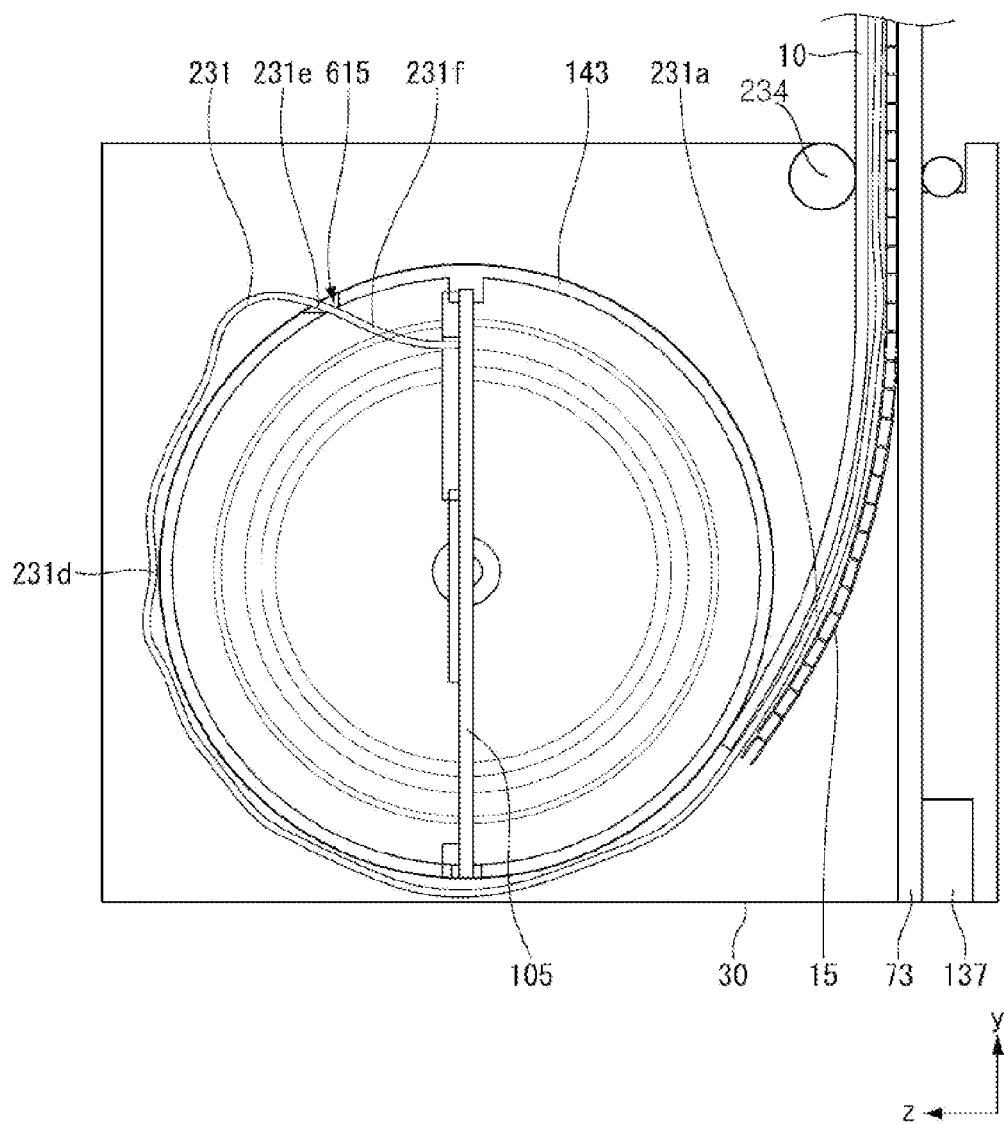

[FIG. 16]
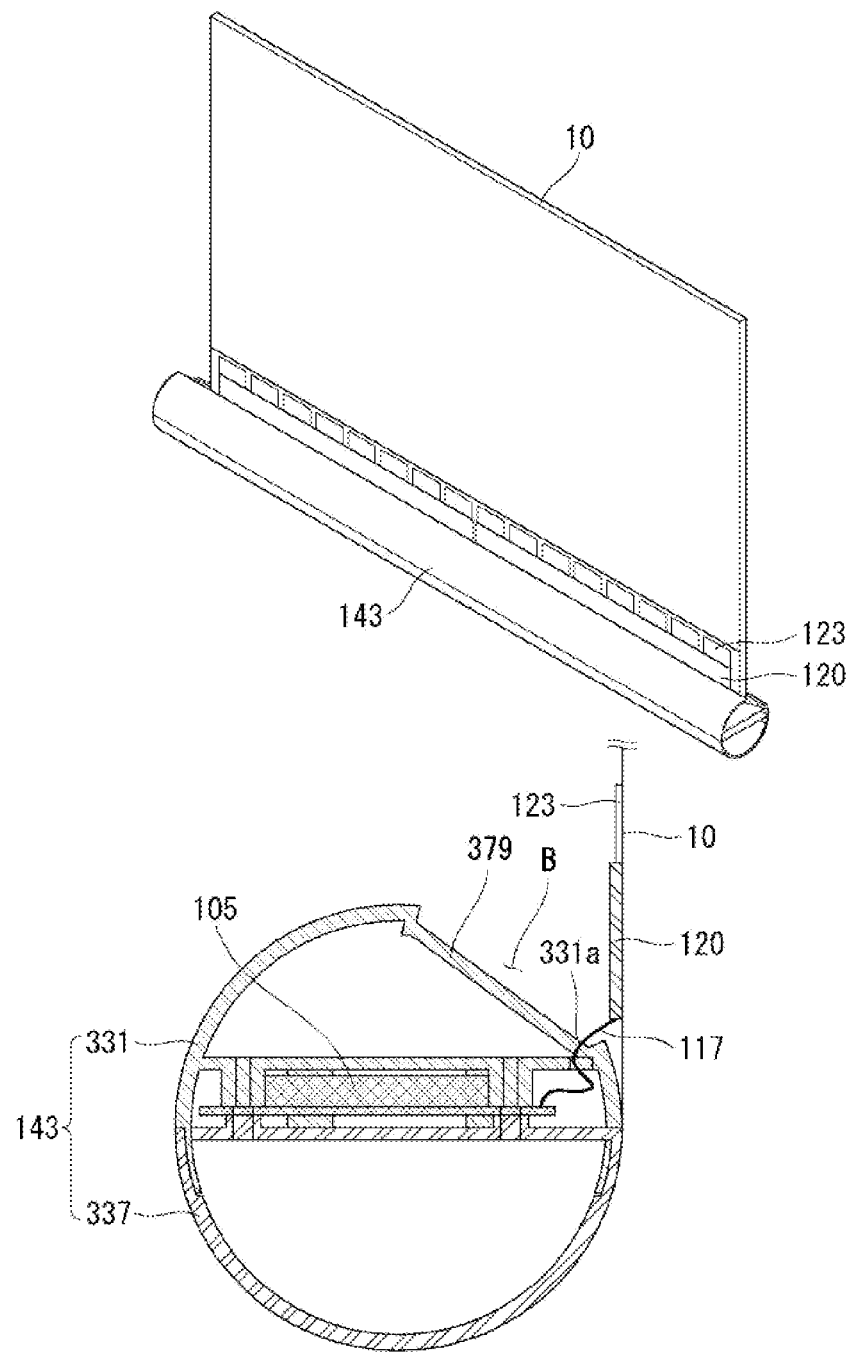

[FIG. 17]
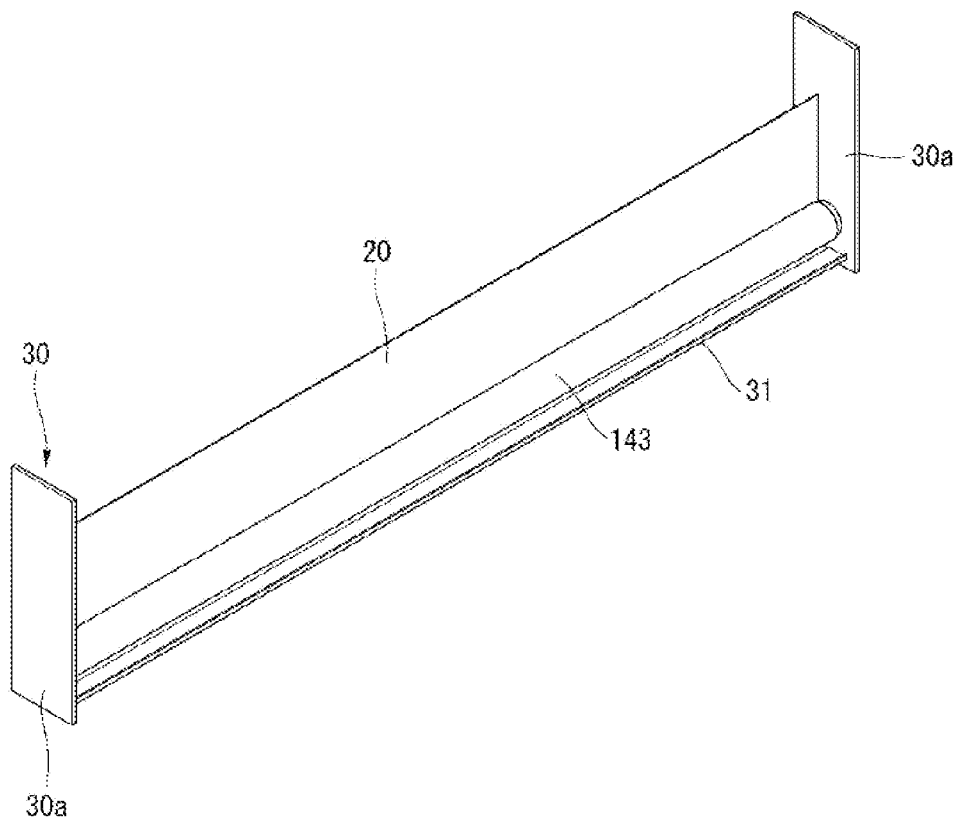

[FIG. 18]
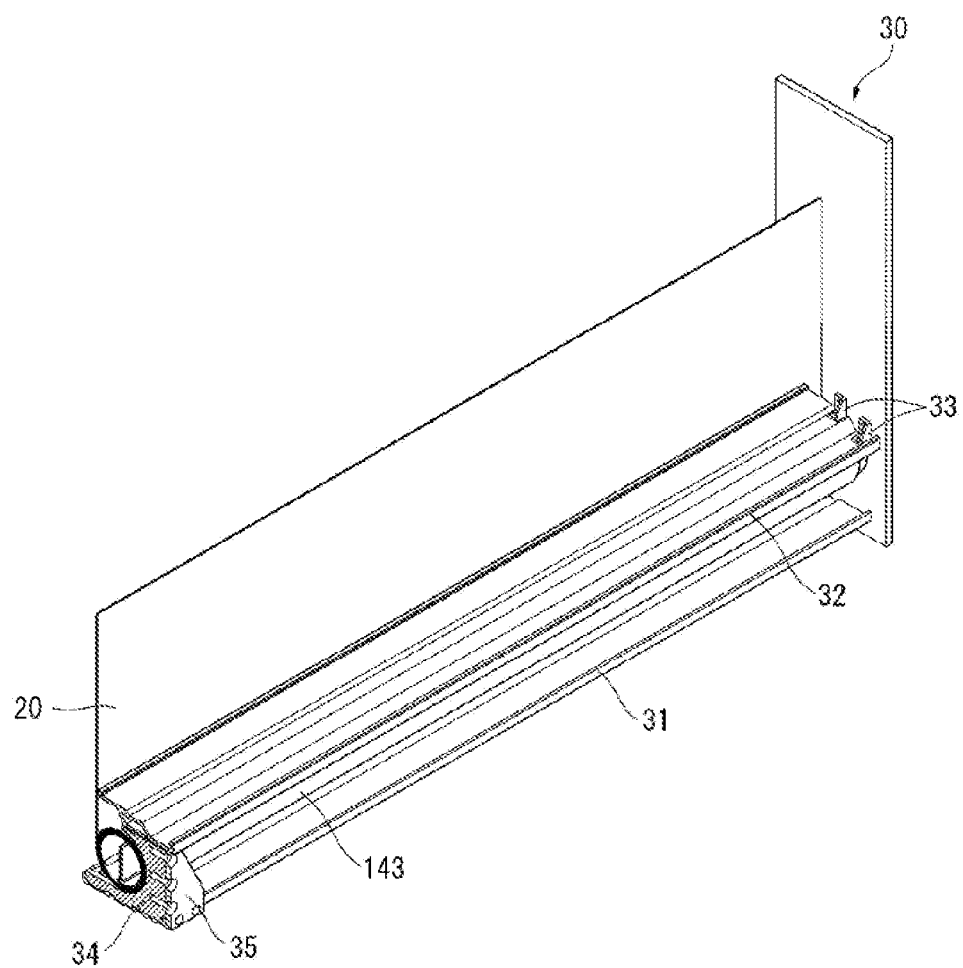

[FIG. 19]
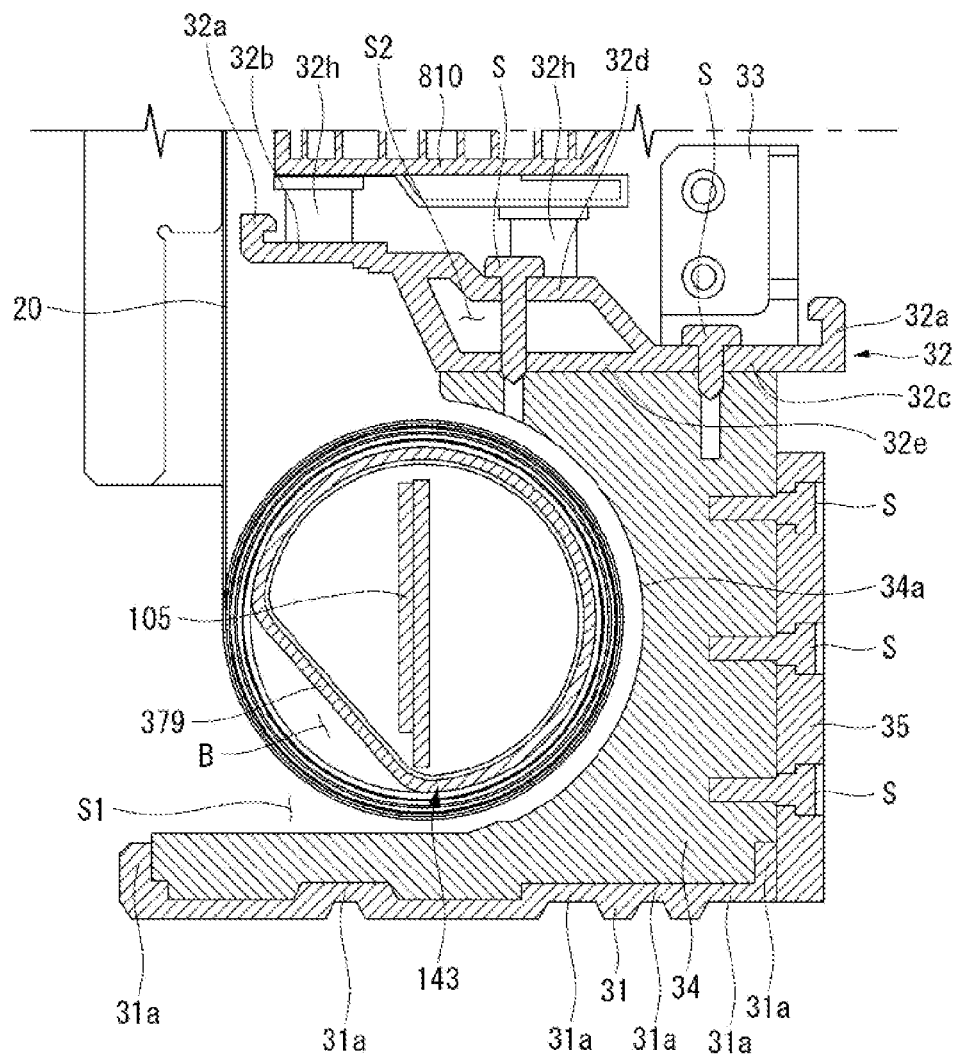

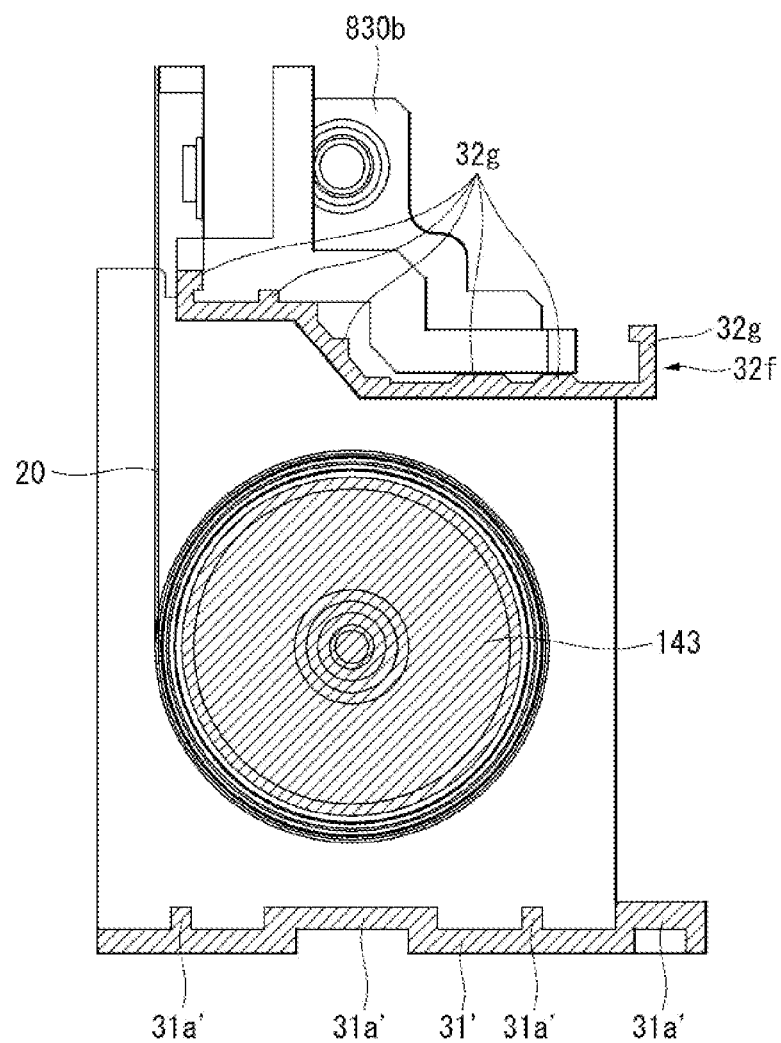
[FIG. 20]

[FIG. 21]
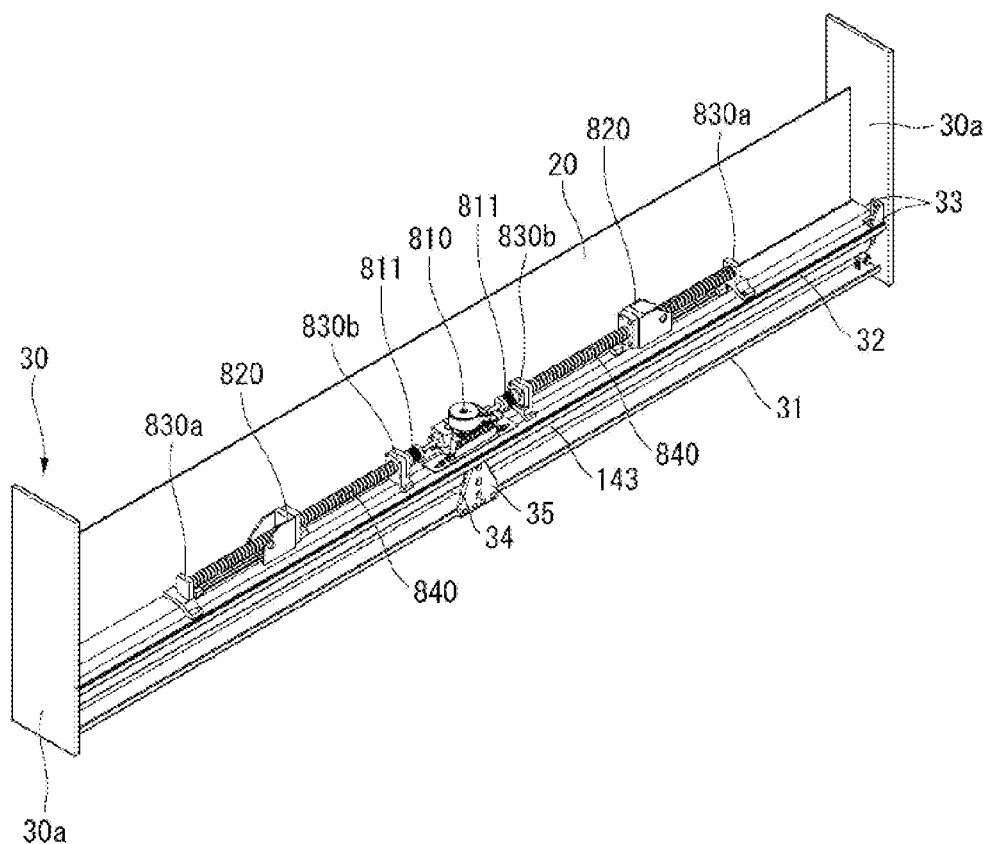

[FIG. 22]
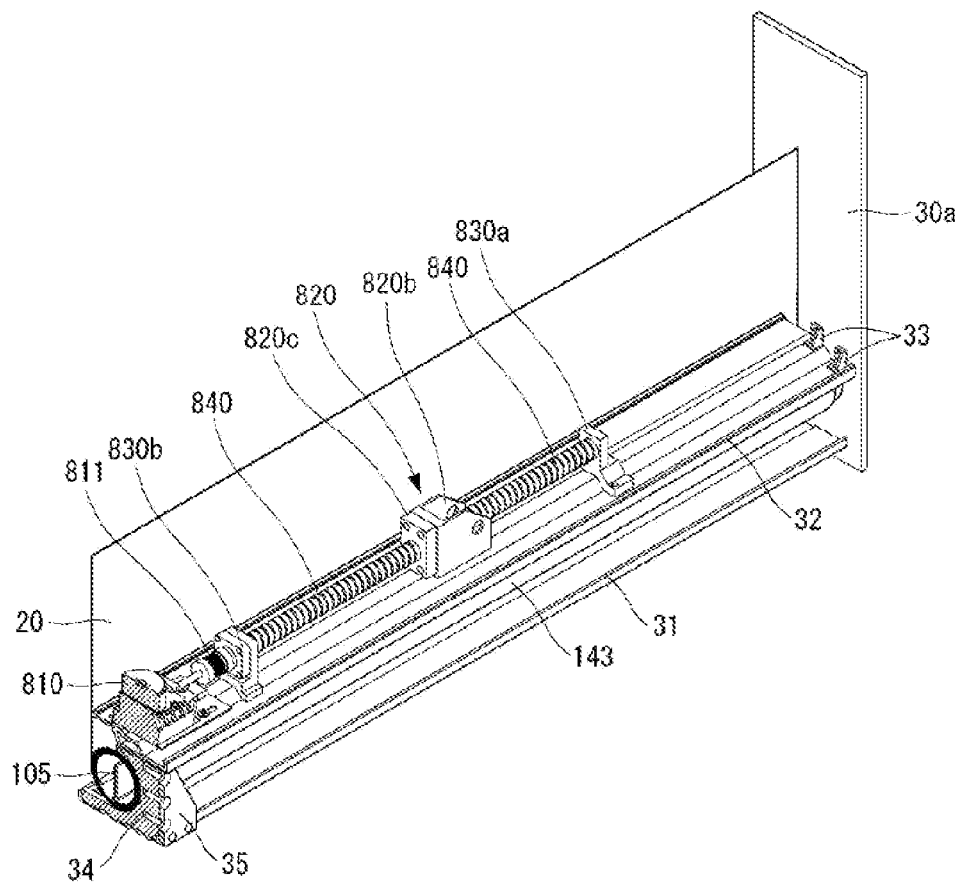

[FIG. 23]
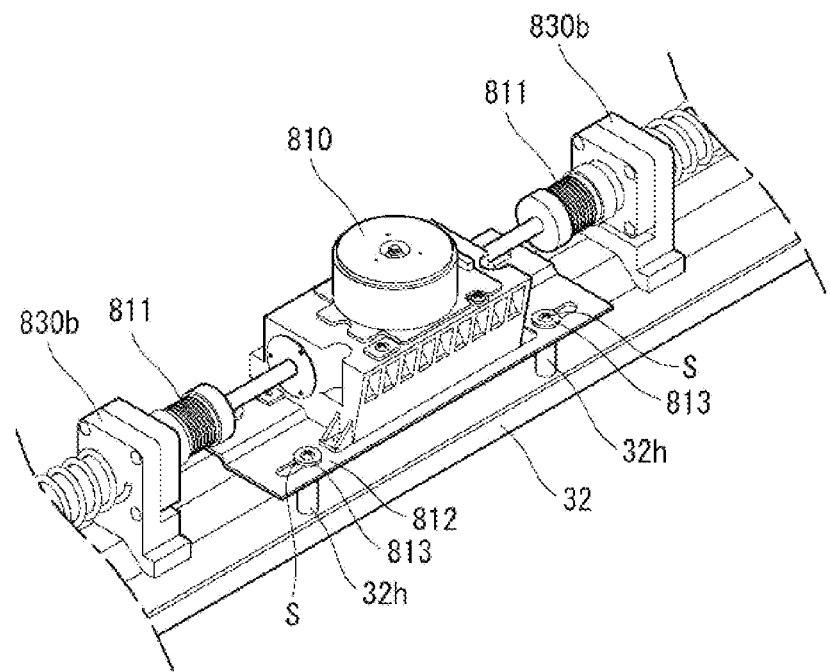

[FIG. 24]
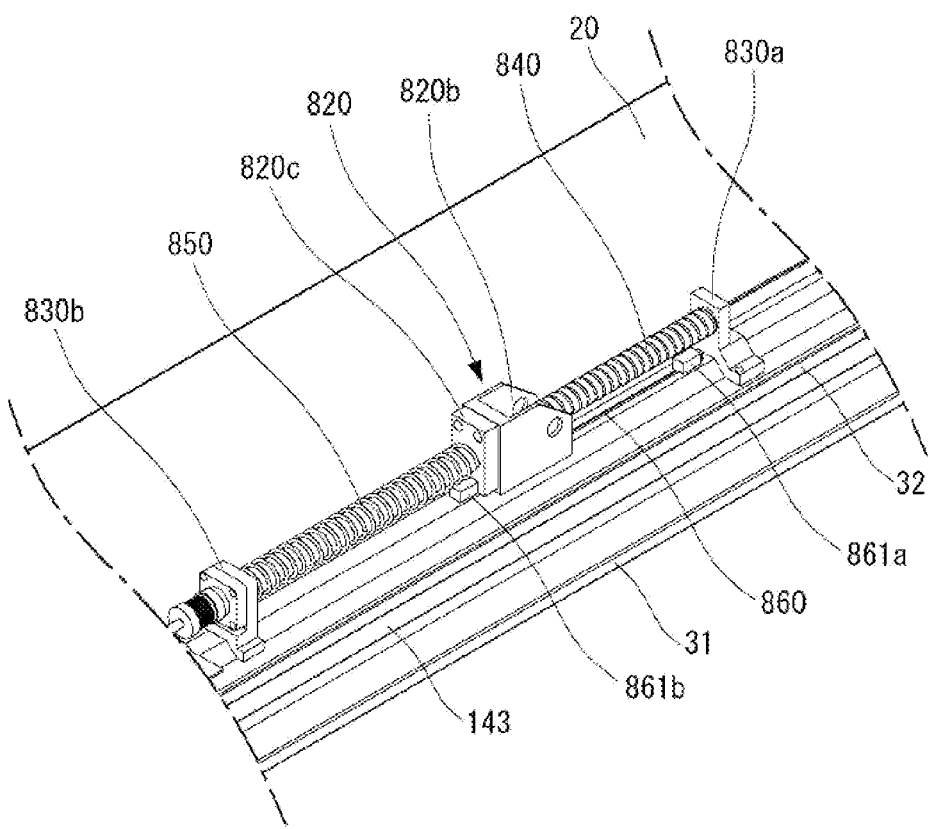

[FIG. 25]
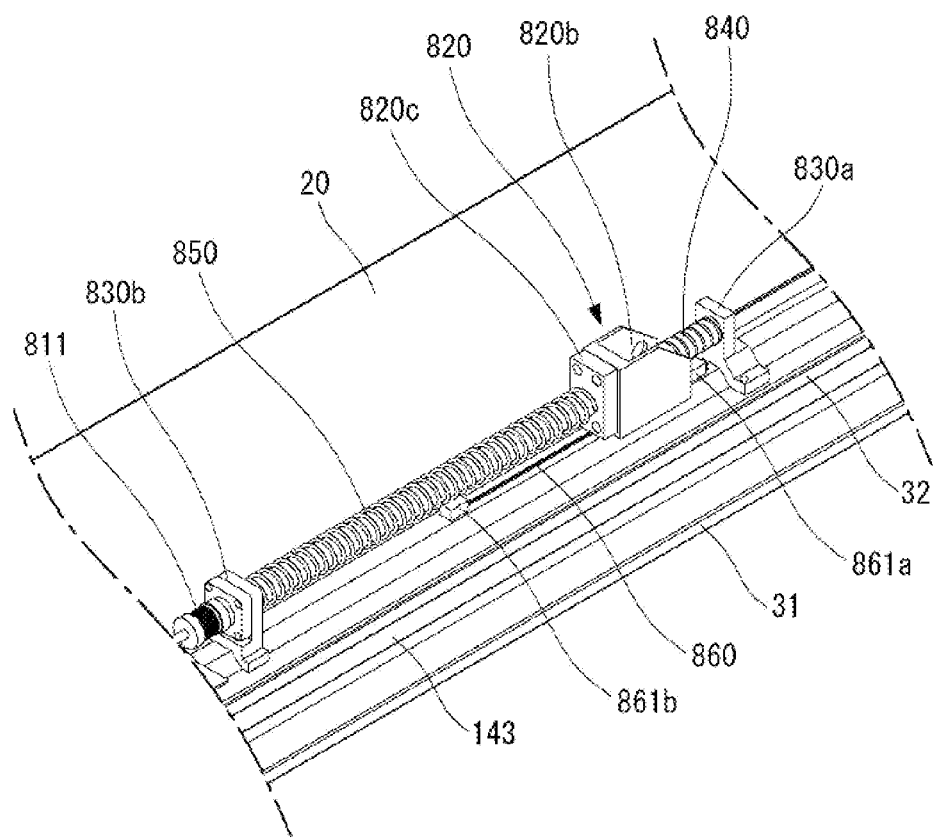

[FIG. 26]
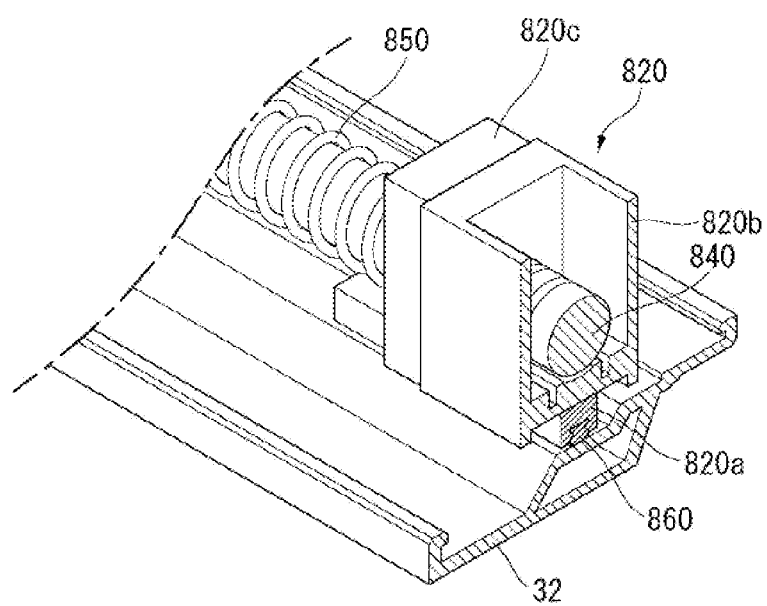

[FIG. 27]
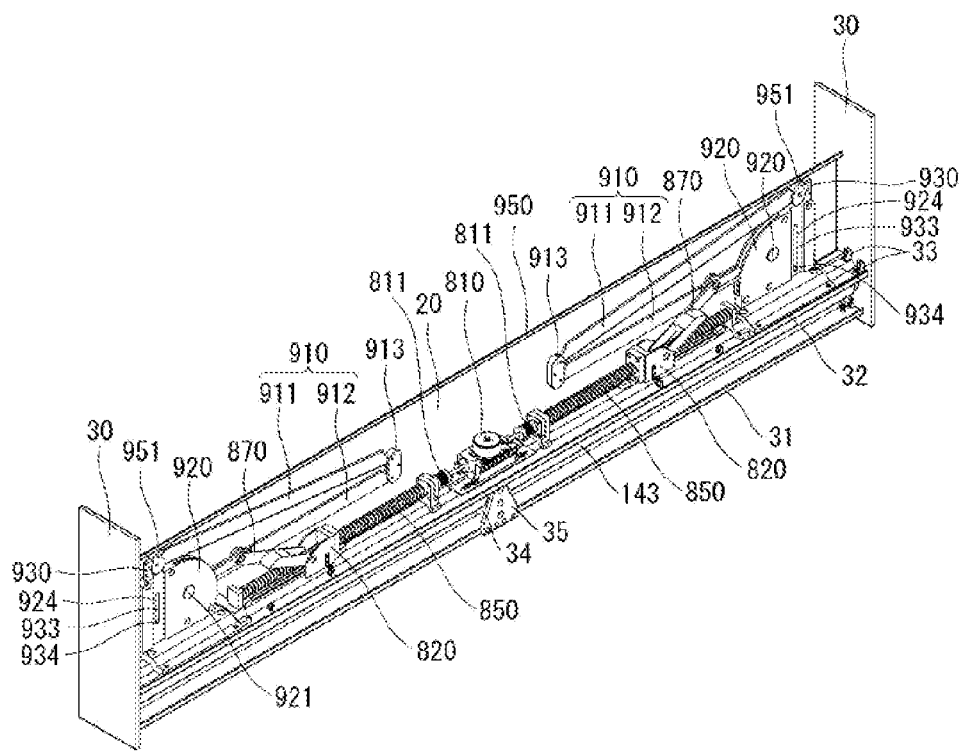

[FIG. 28]
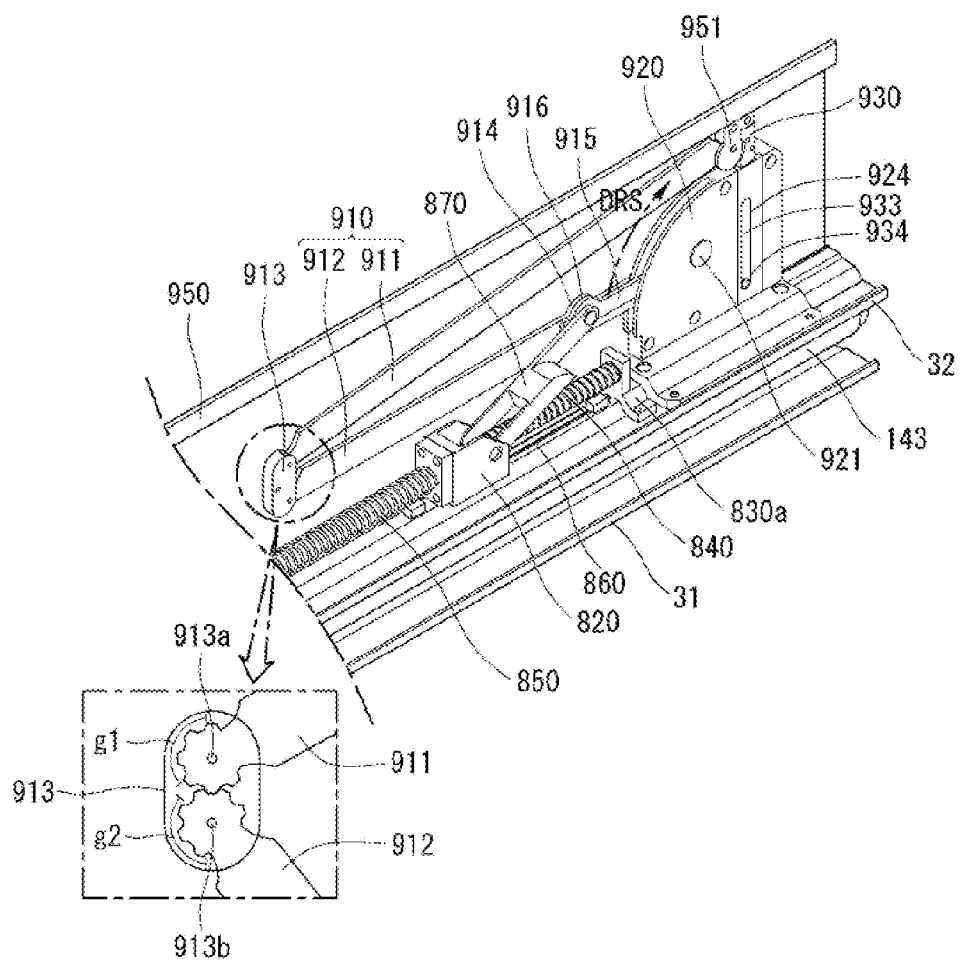

[FIG. 29]
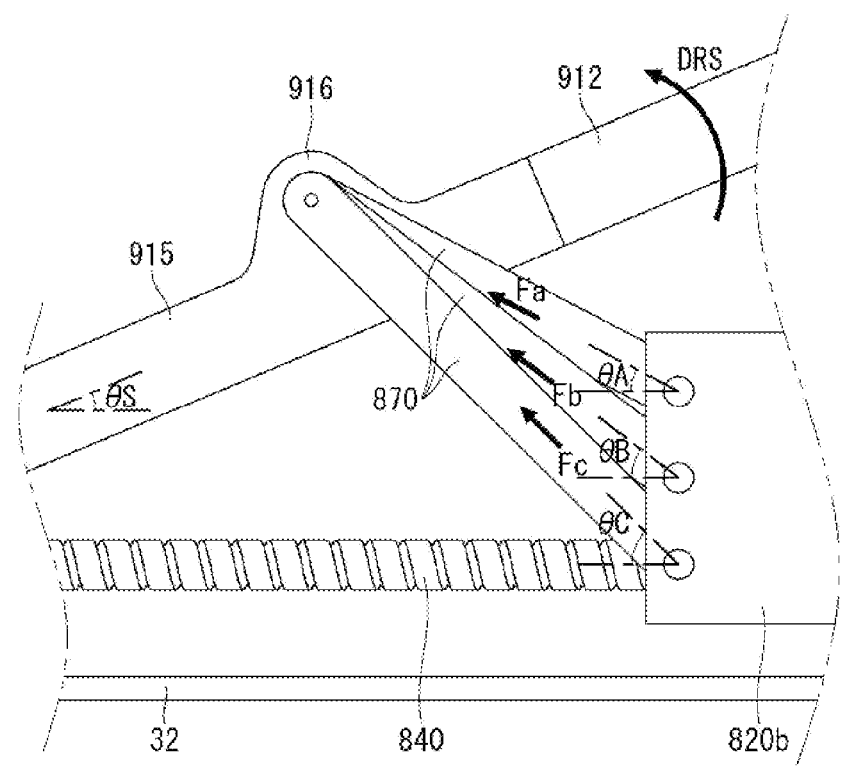

[FIG. 30]
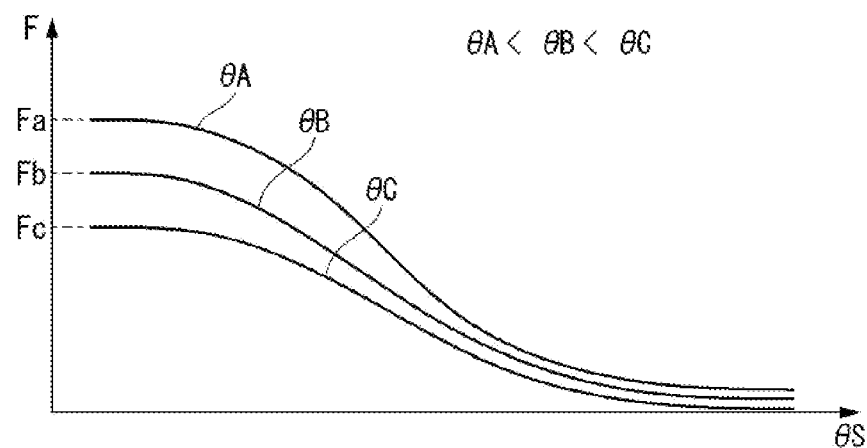

[FIG. 31]
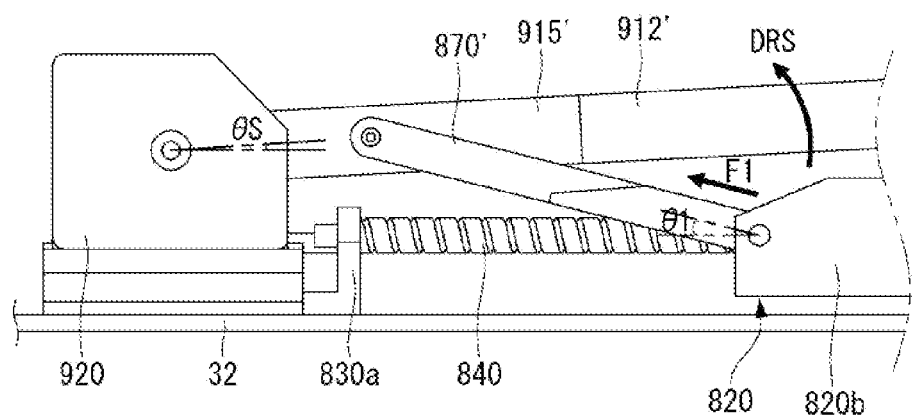

[FIG. 32]
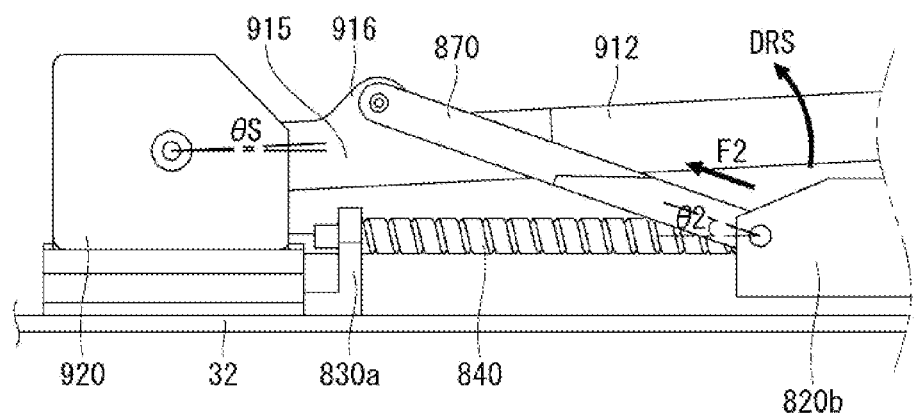

[FIG. 33]
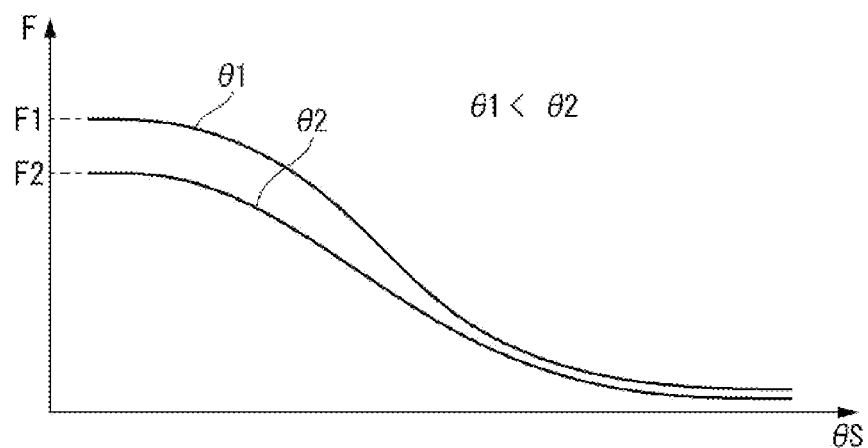

[FIG. 34]
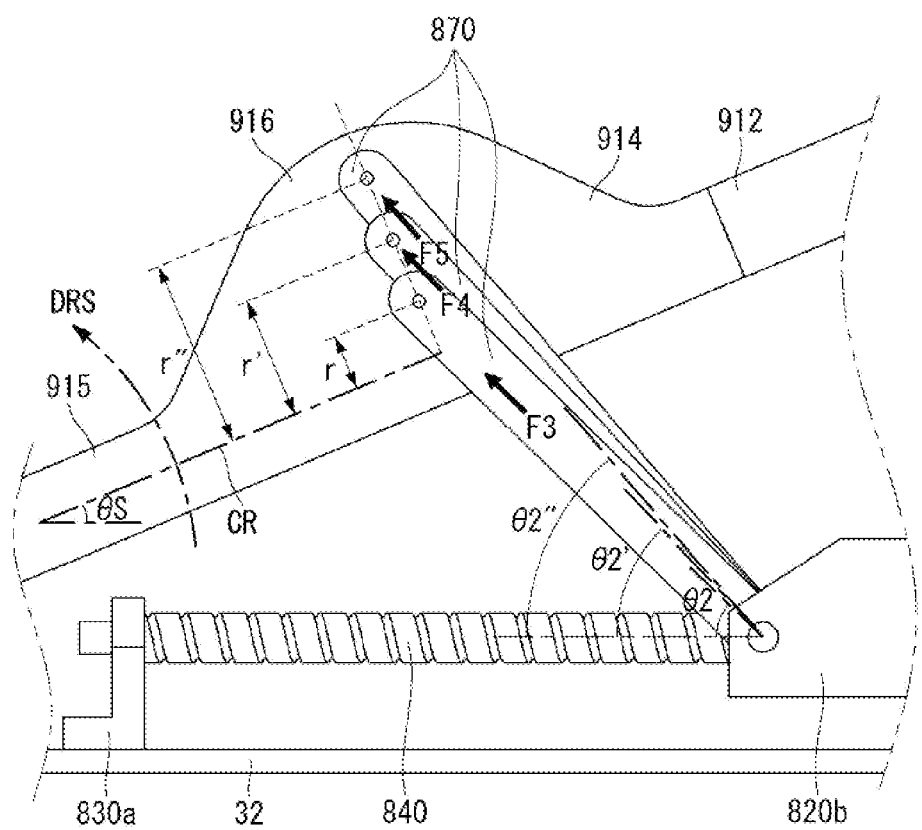

[FIG. 35]
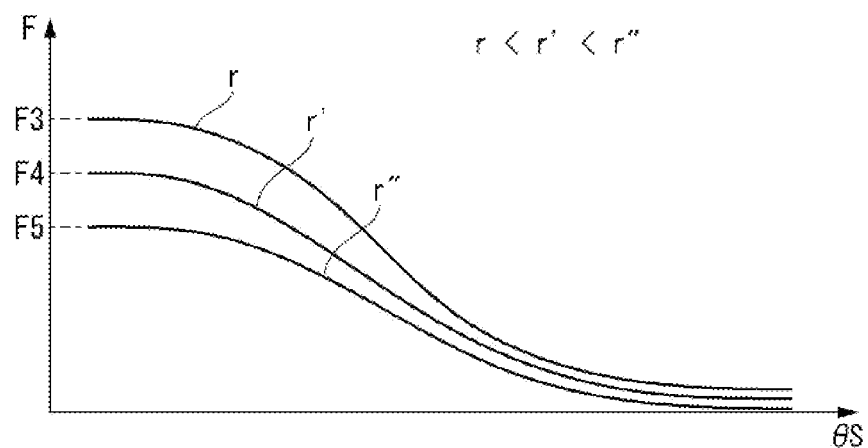

[FIG. 36]
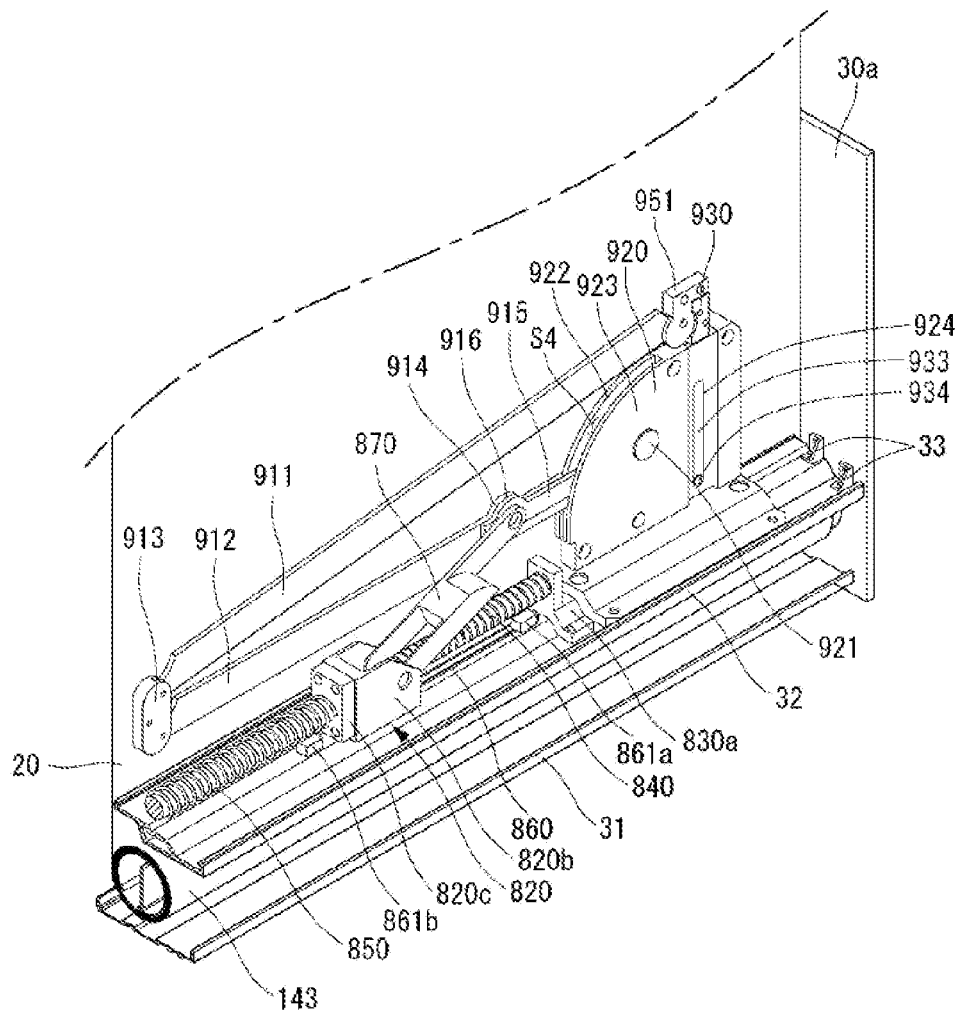

[FIG. 37]
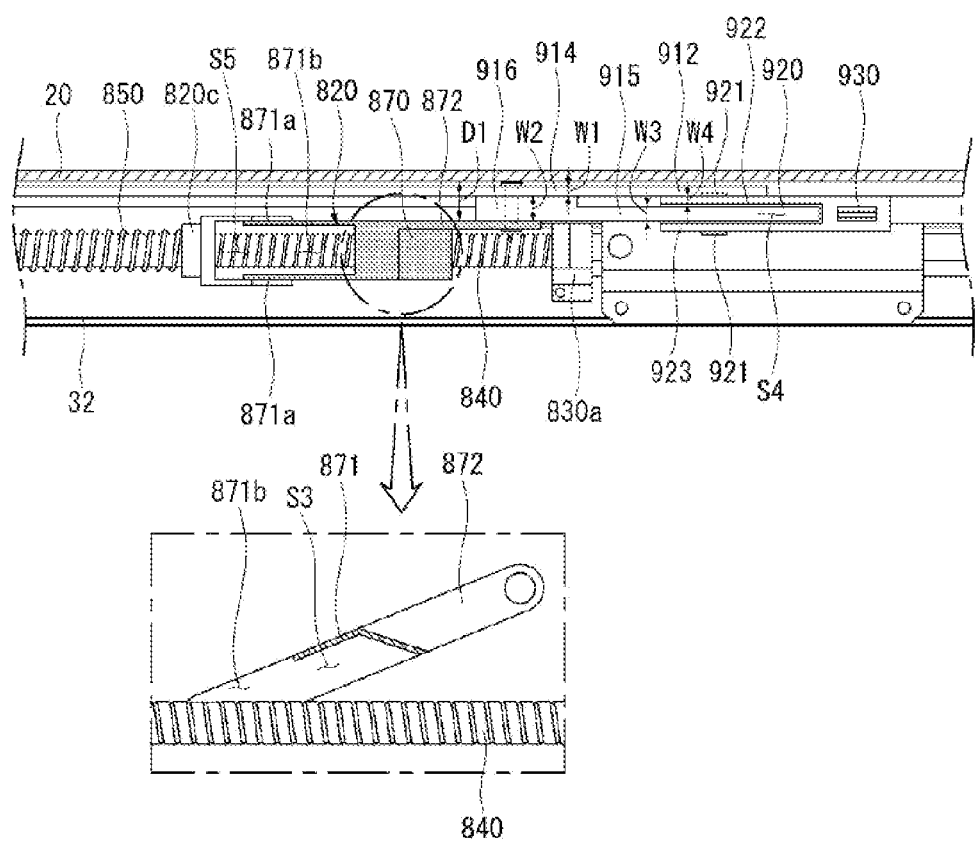

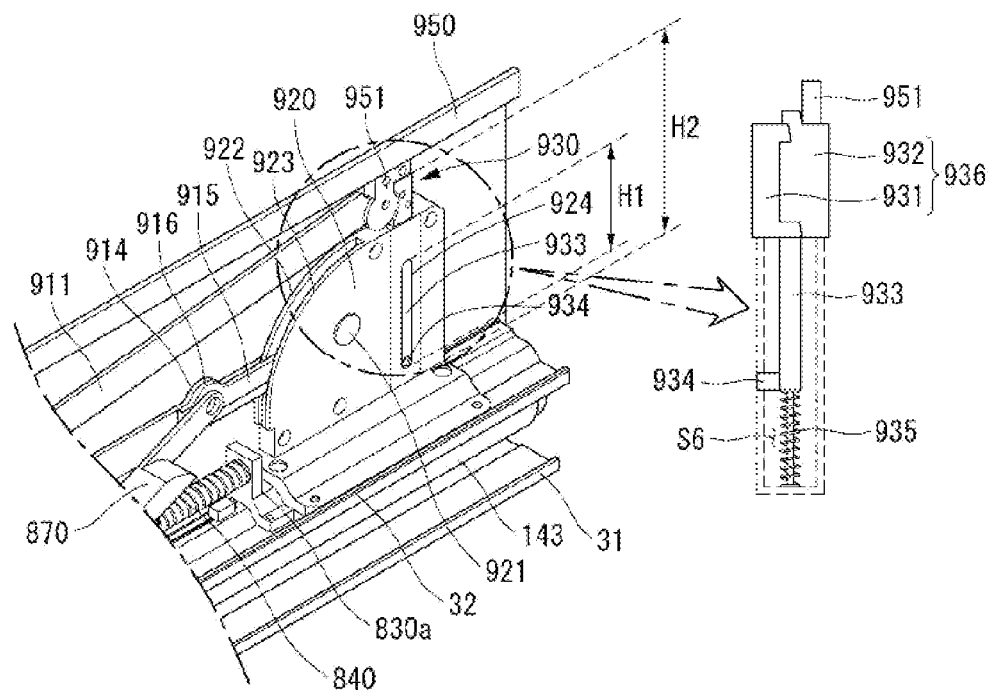
[FIG. 38]

[FIG. 39]
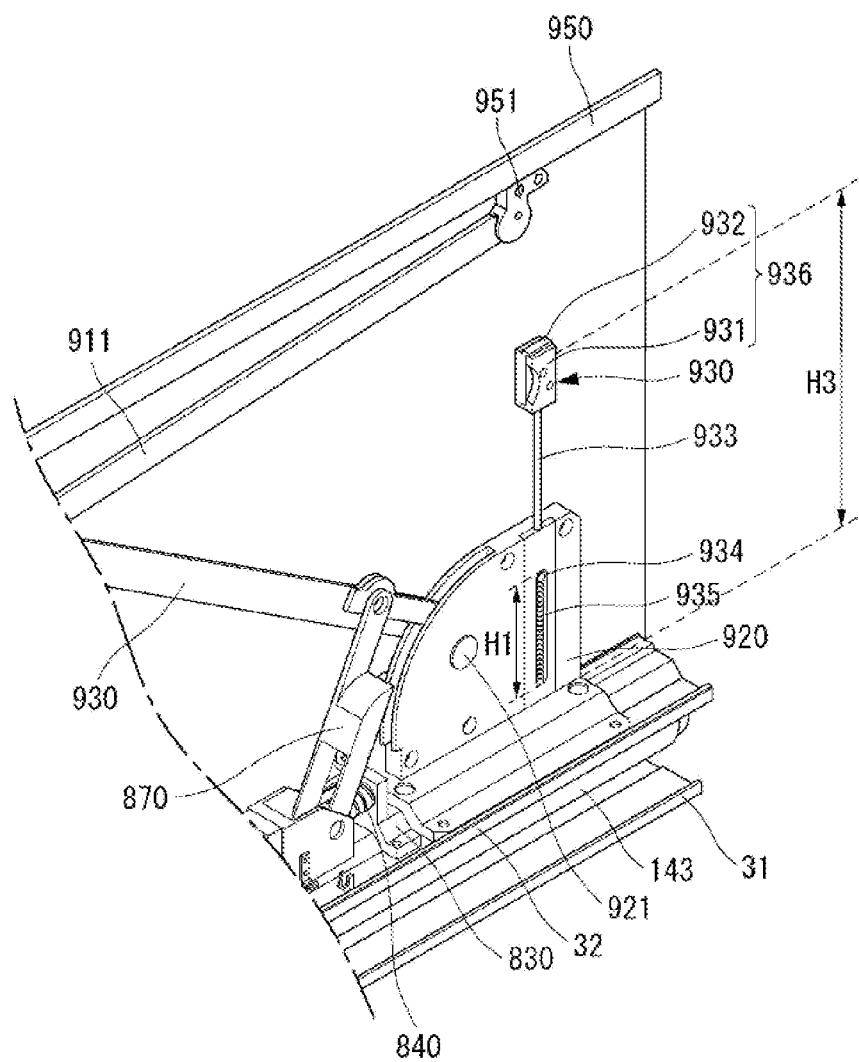

[FIG. 40]
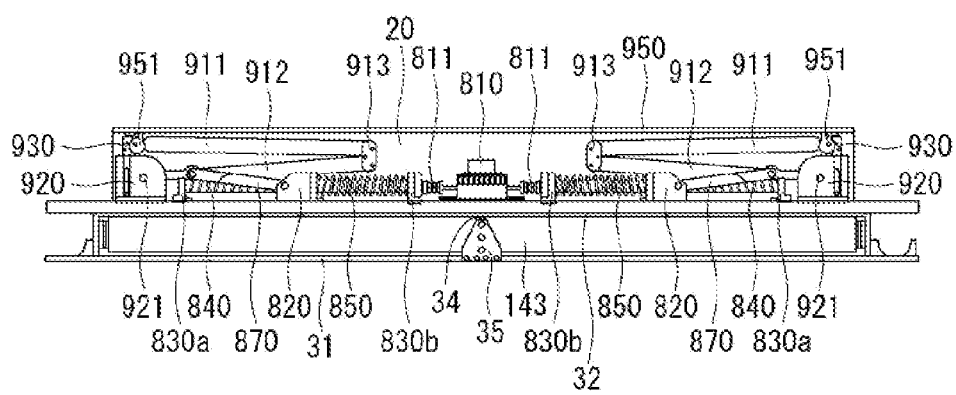

[FIG. 41]
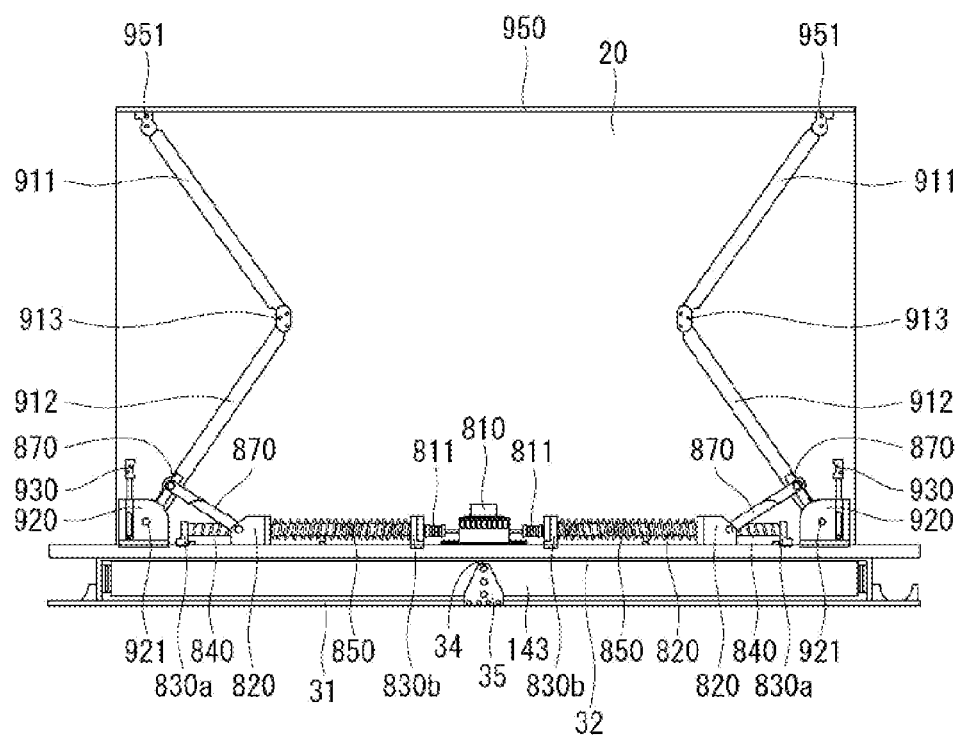

[FIG. 42]
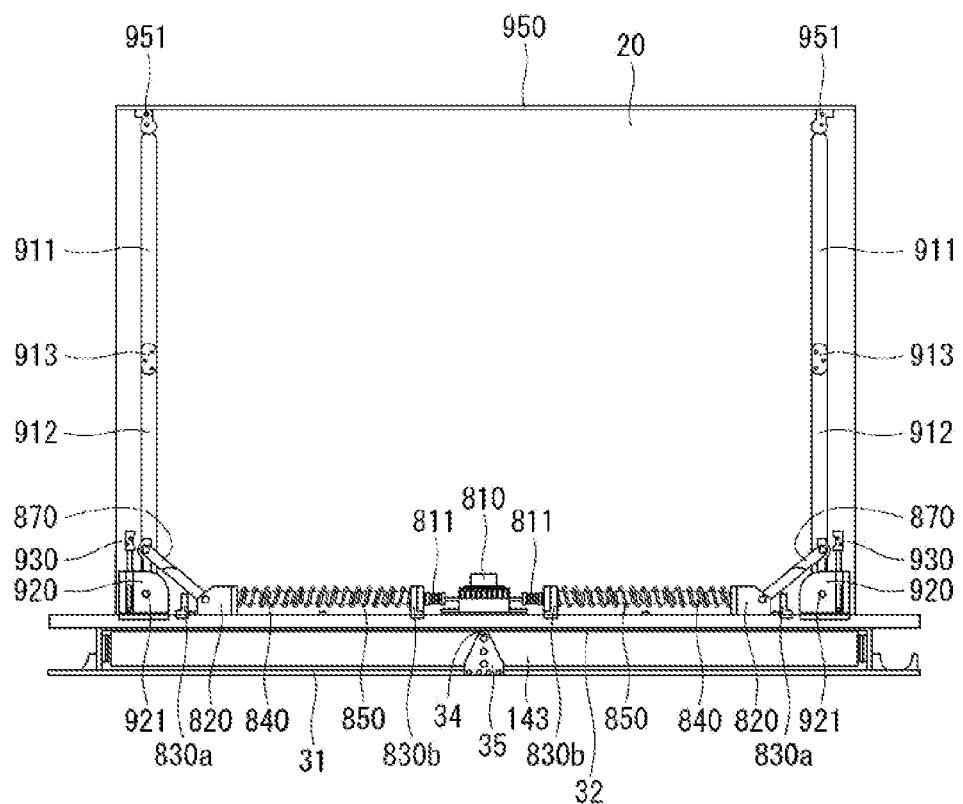

[FIG. 43]
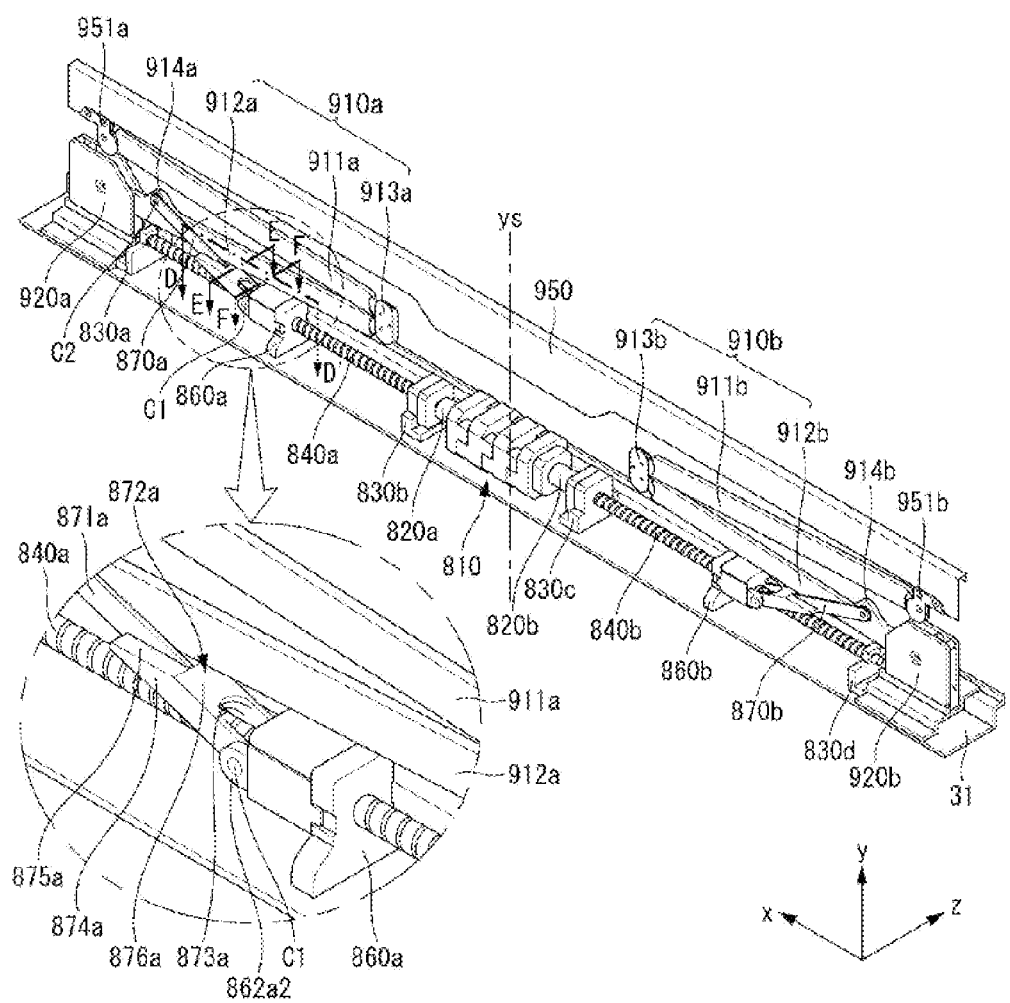

[FIG. 44]
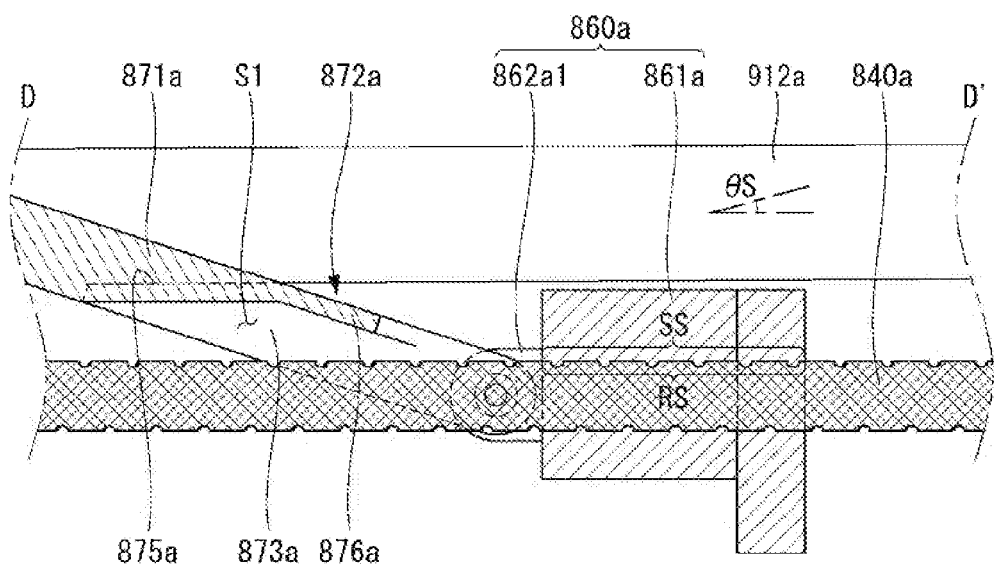

[FIG. 45]
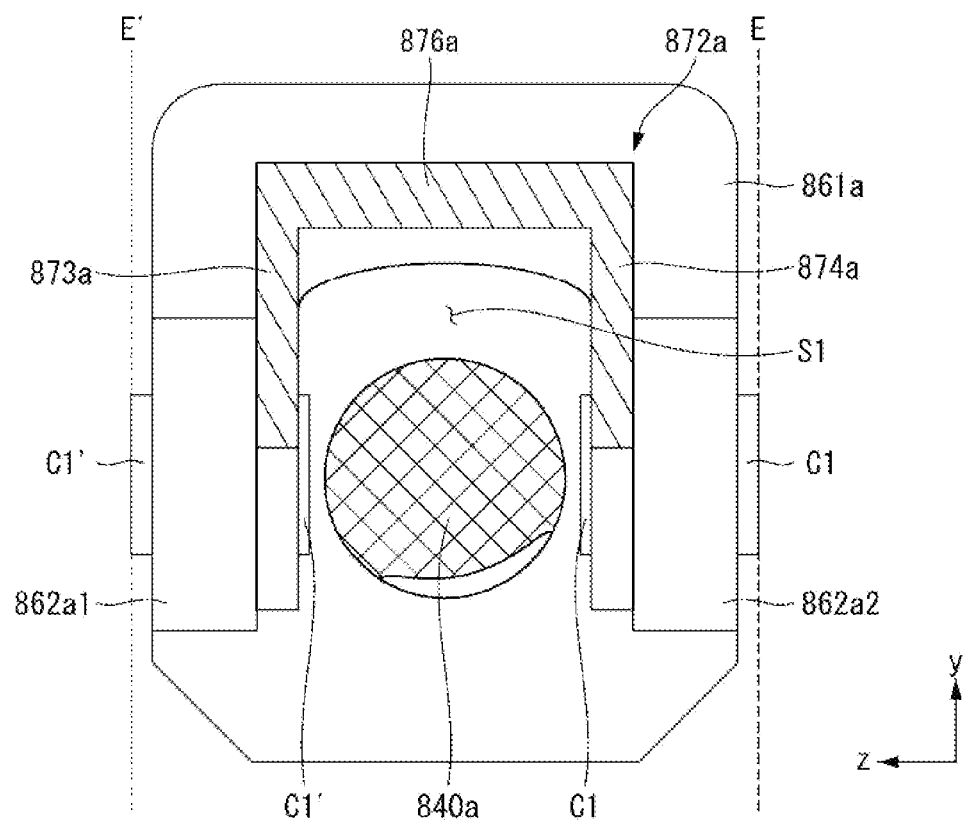

[FIG. 46]
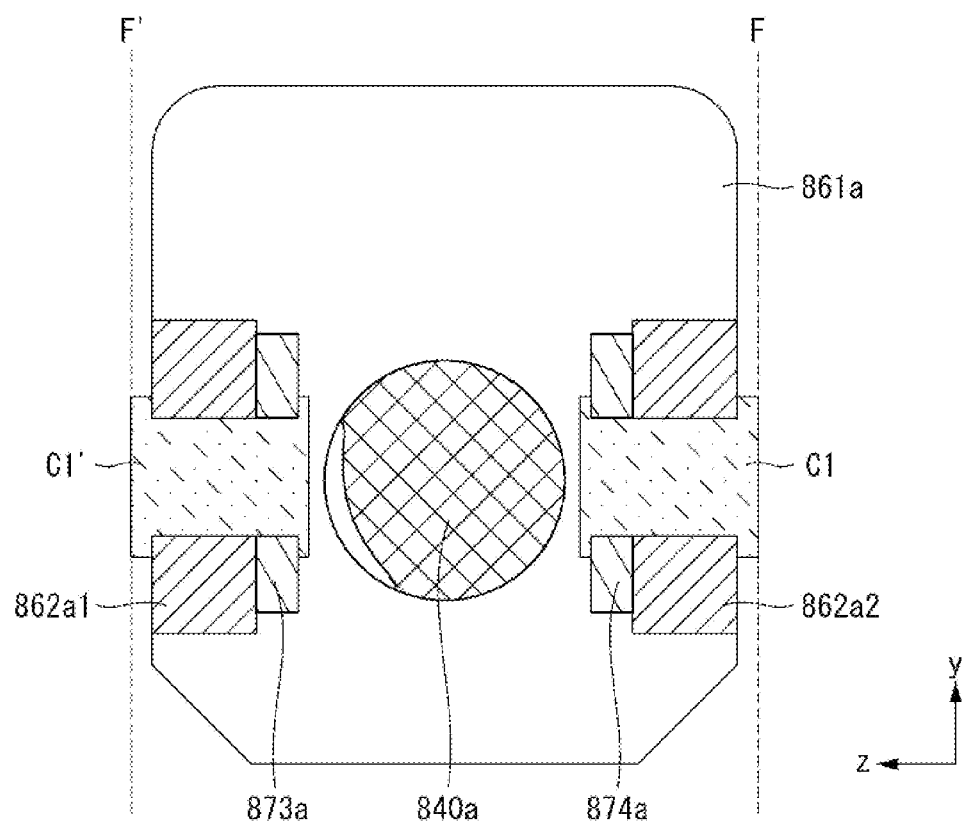

[FIG. 47]
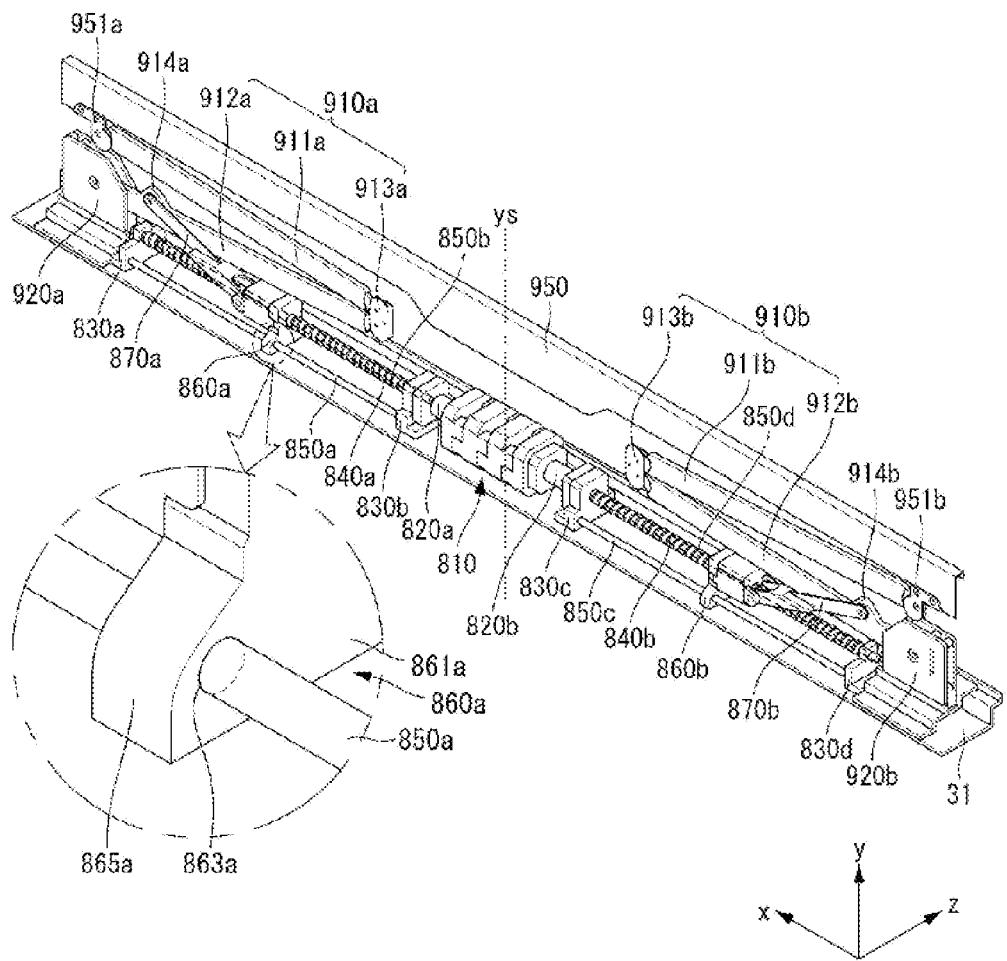

[FIG. 48]
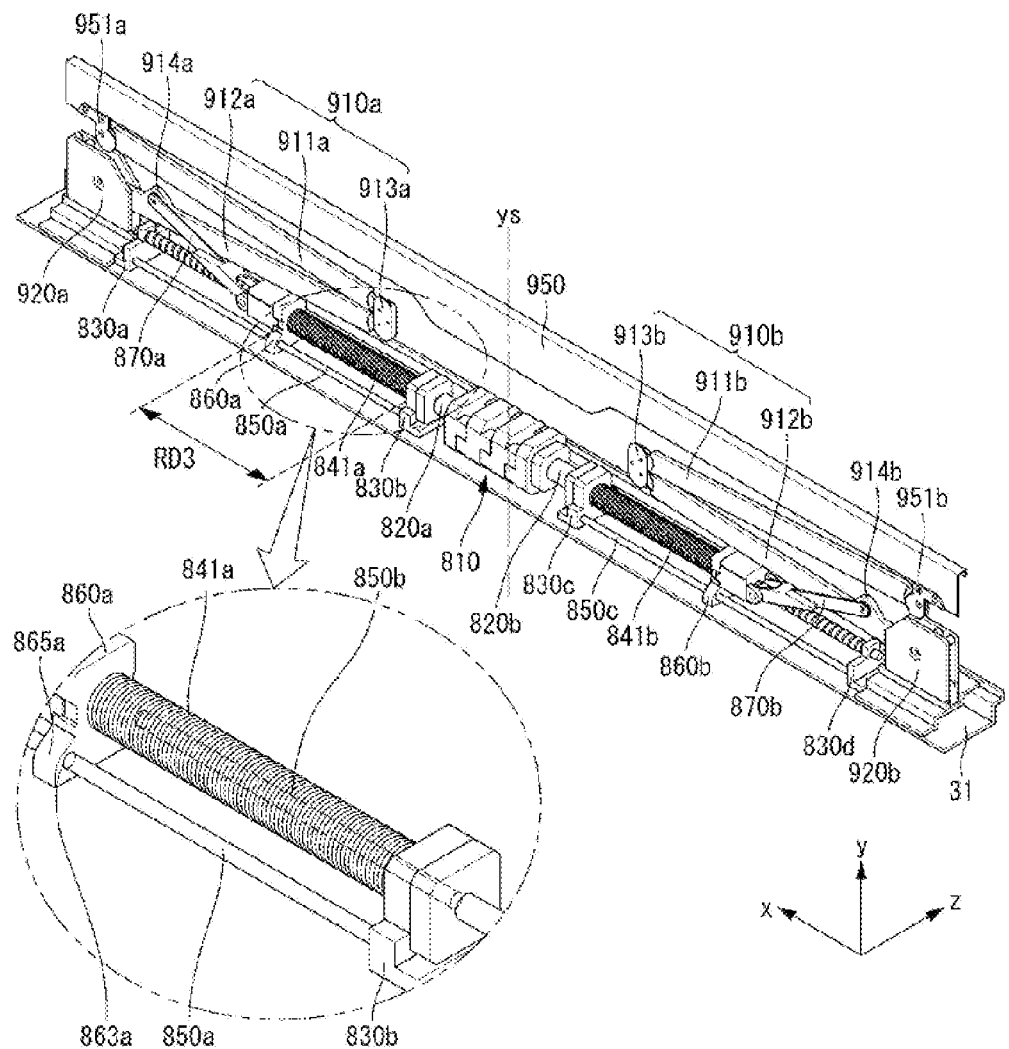

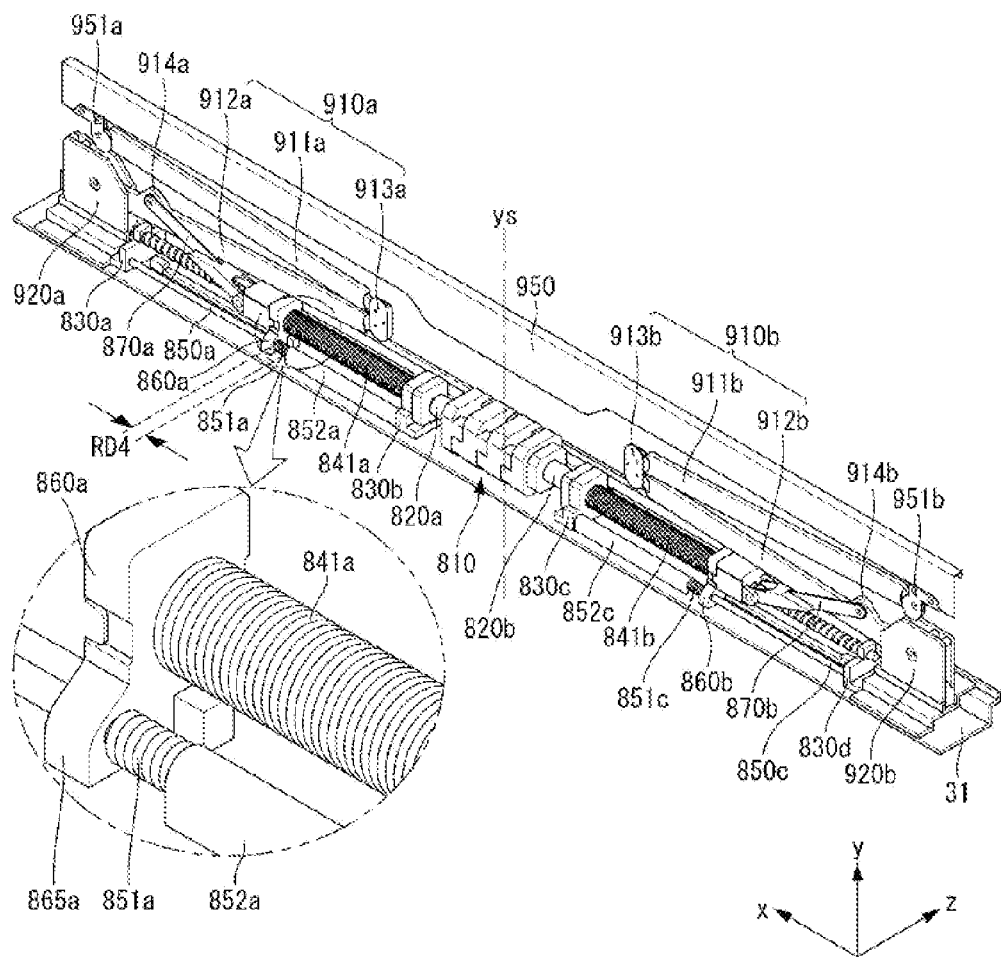
[FIG. 49]

[FIG. 50]
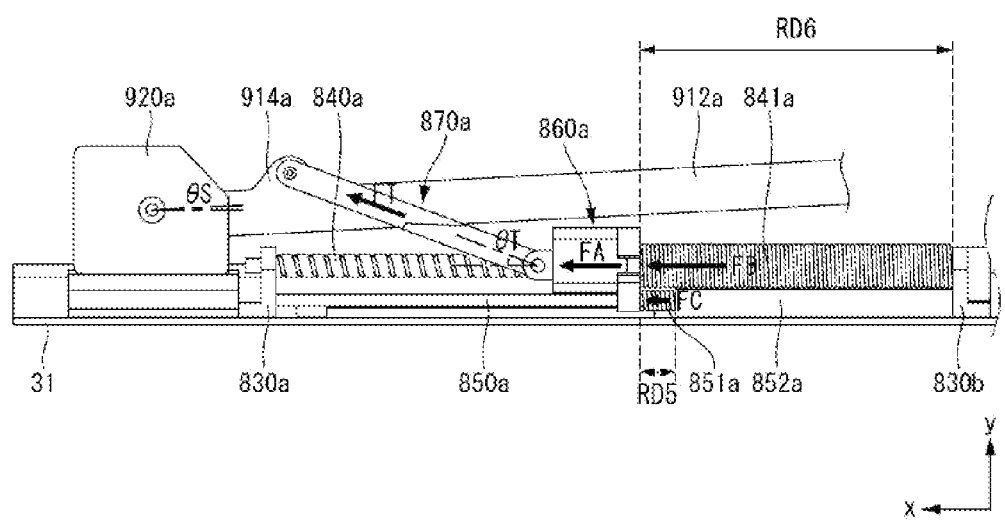

[FIG. 51]
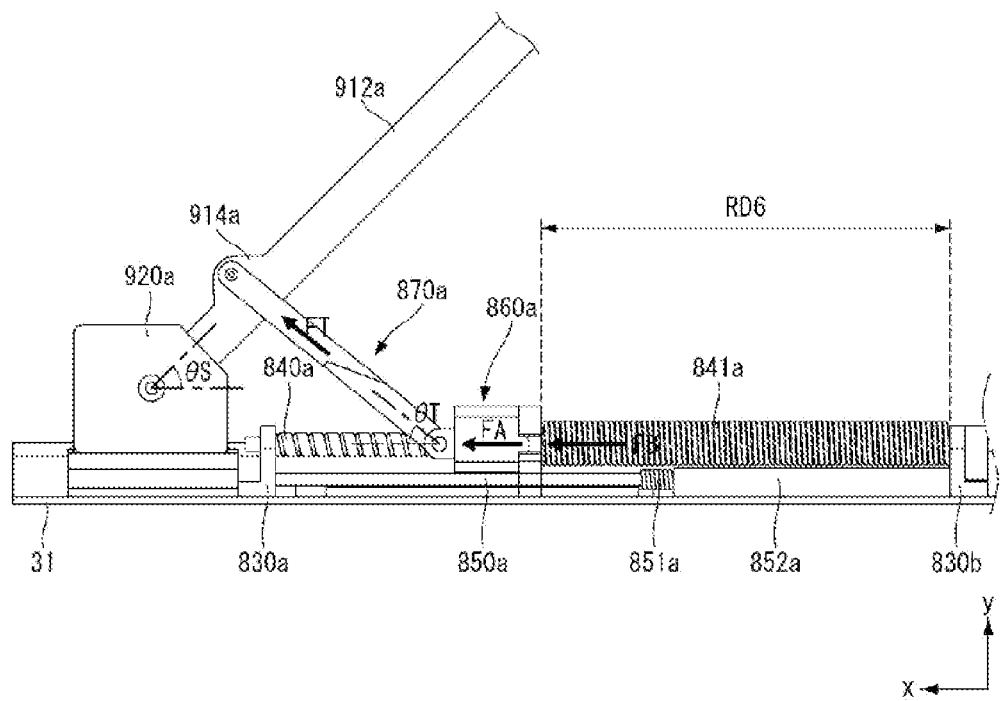

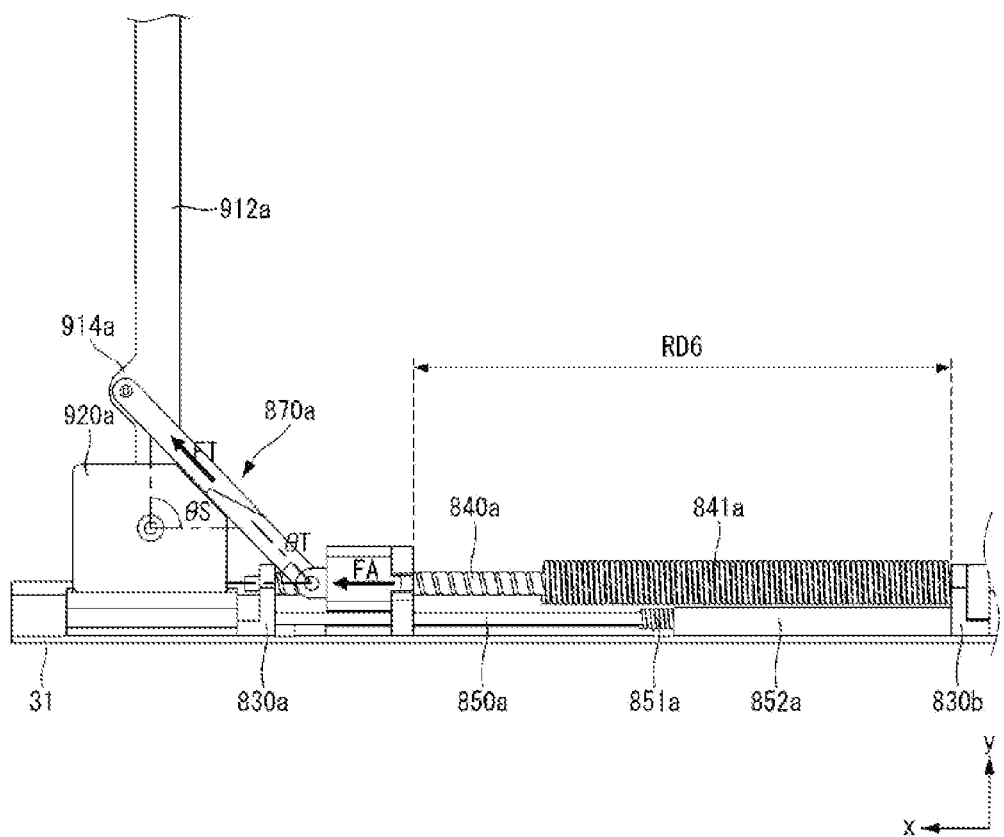
[FIG. 52]

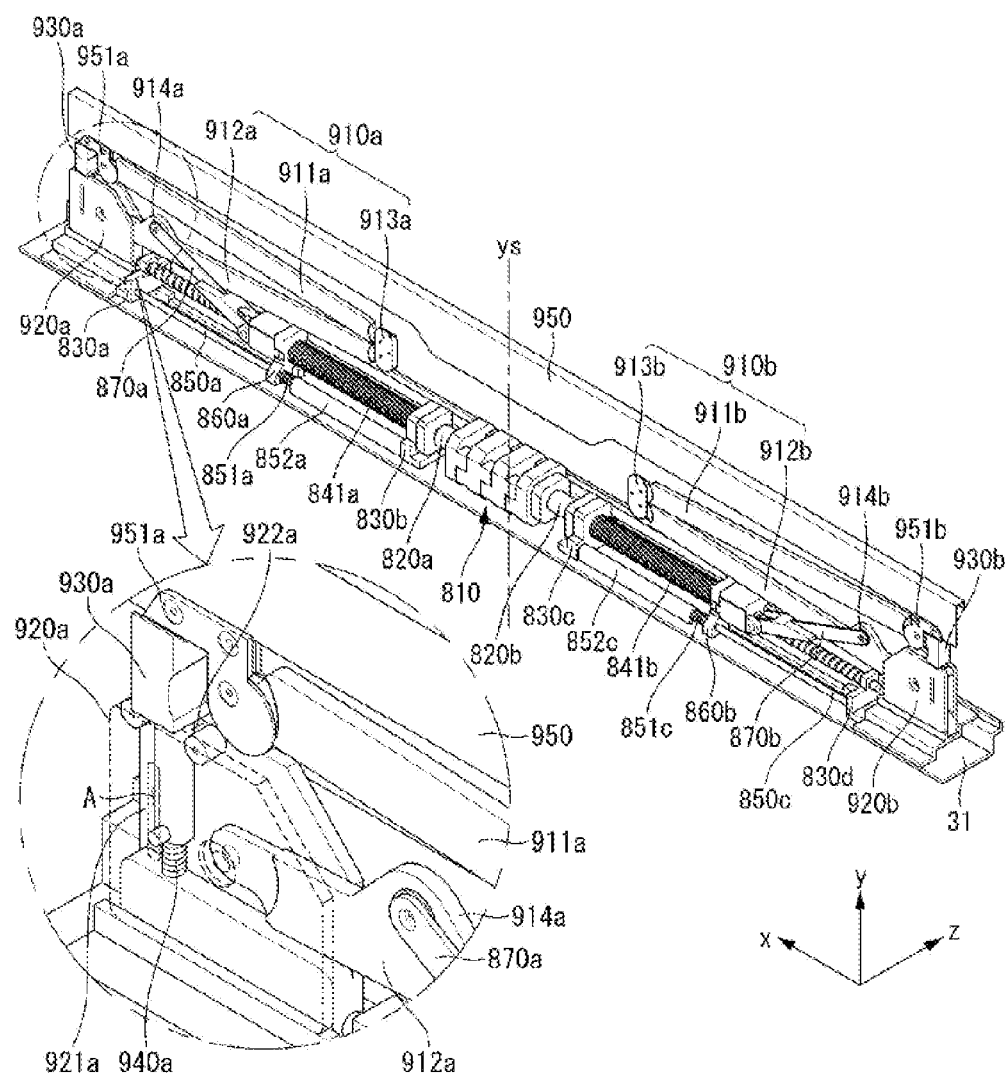
[FIG. 53]

[FIG. 54]
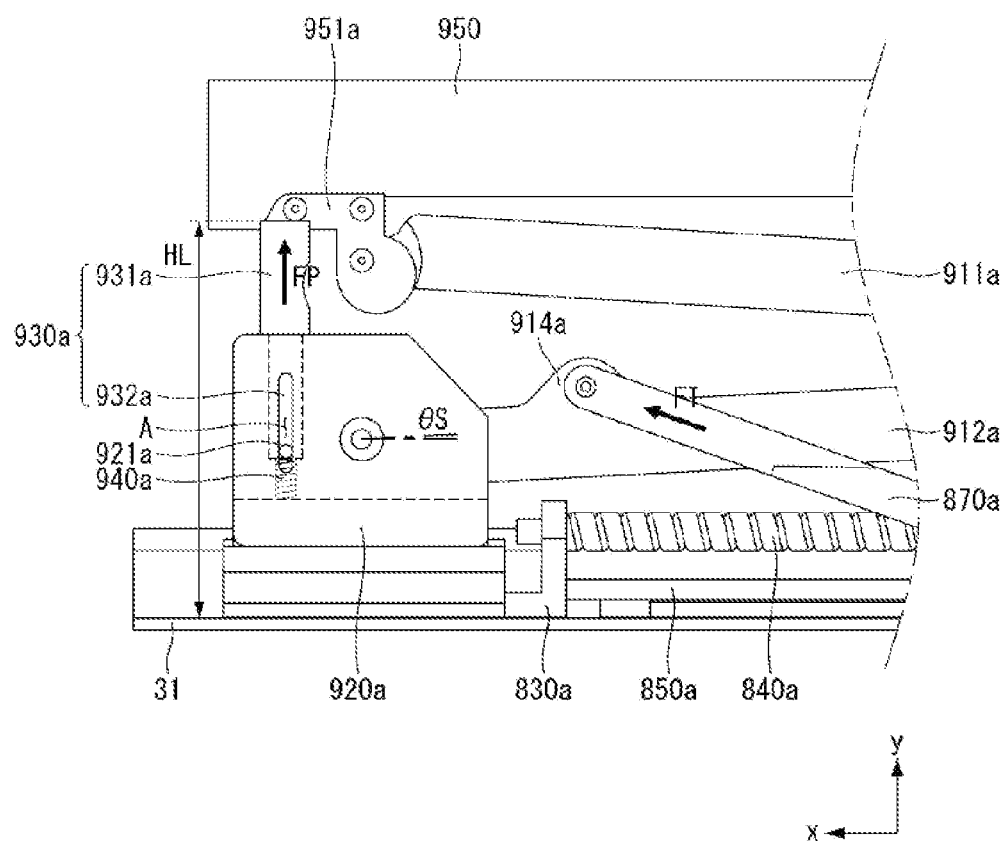

[FIG. 55]
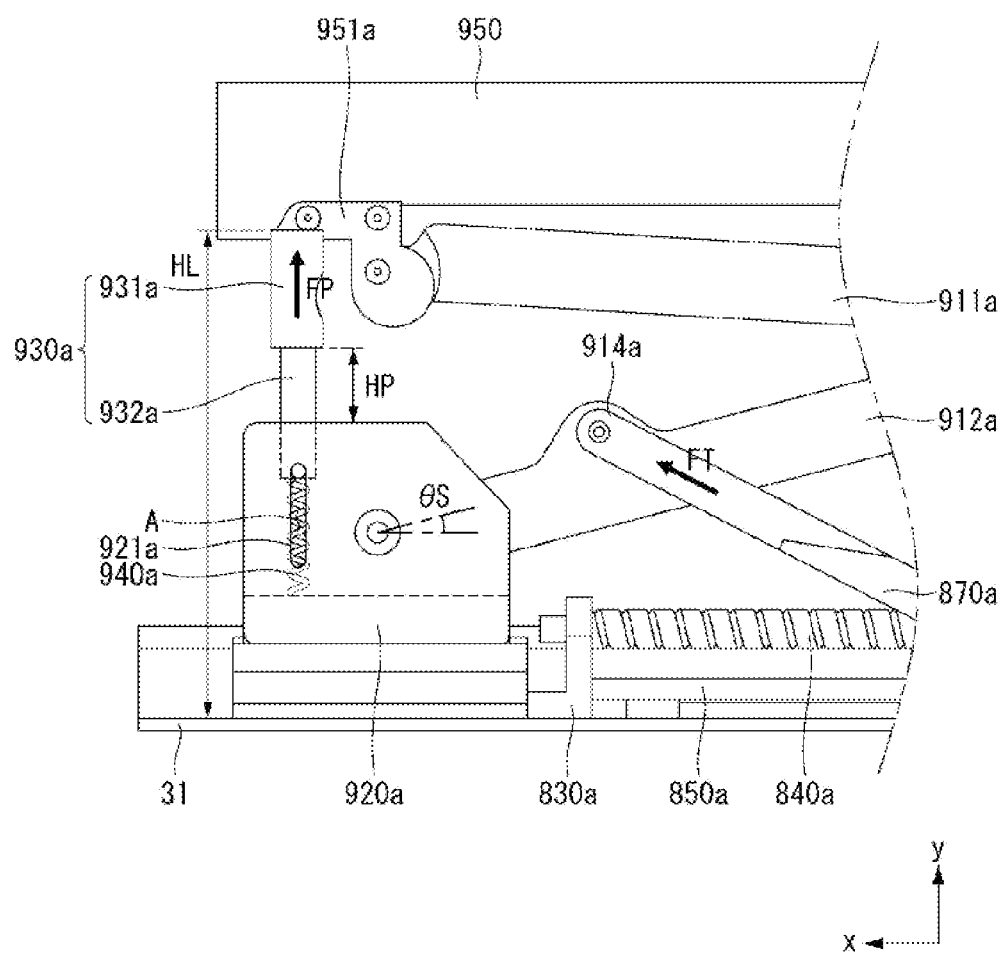

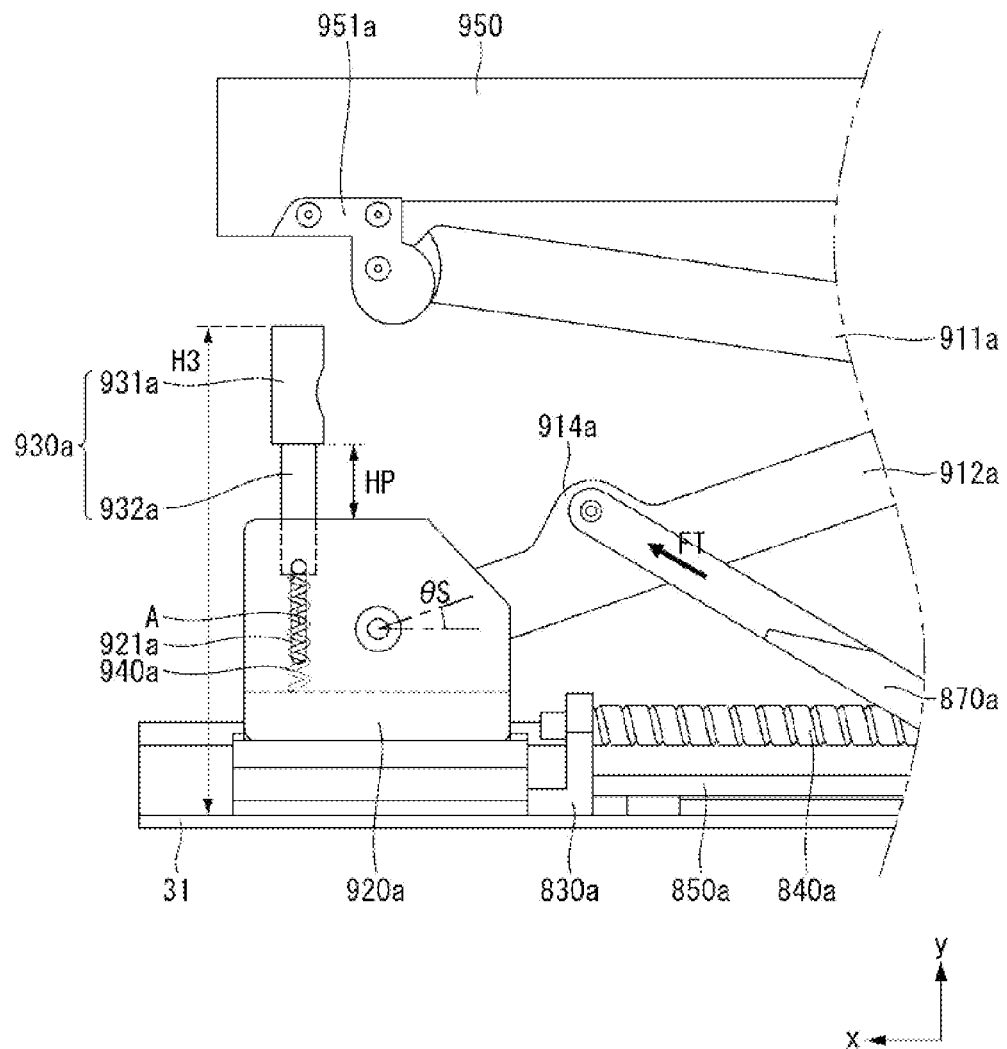
[FIG. 56]

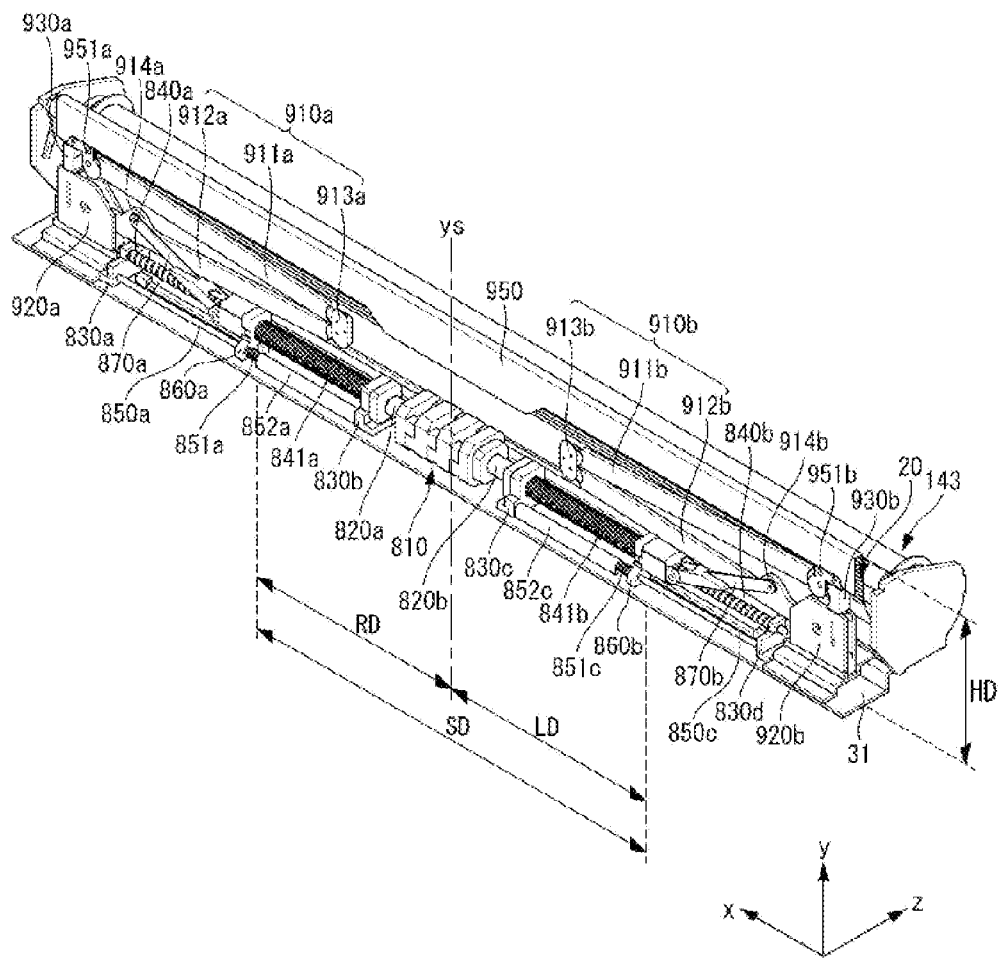
[FIG. 57]

[FIG. 58]
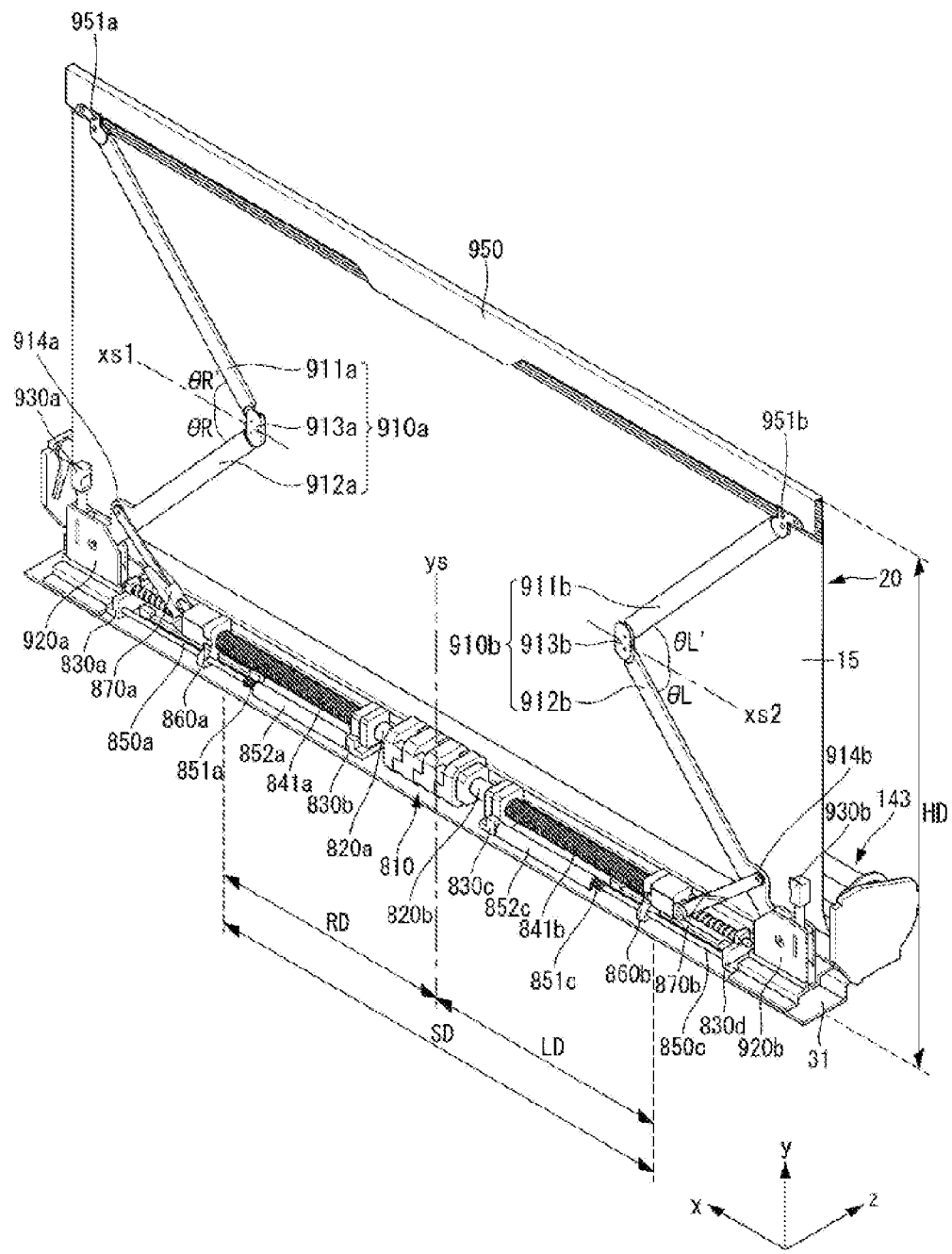

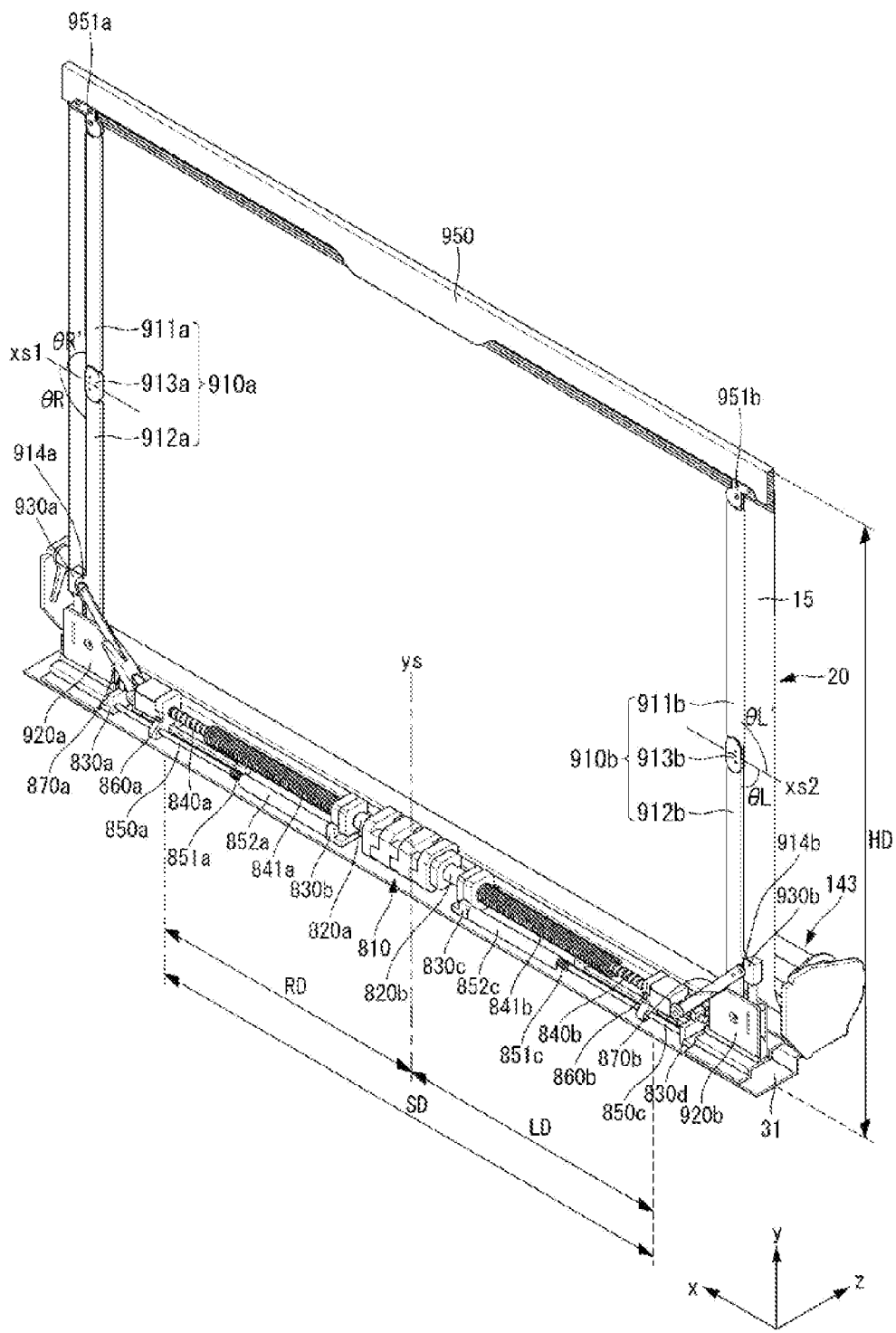
[FIG. 59]

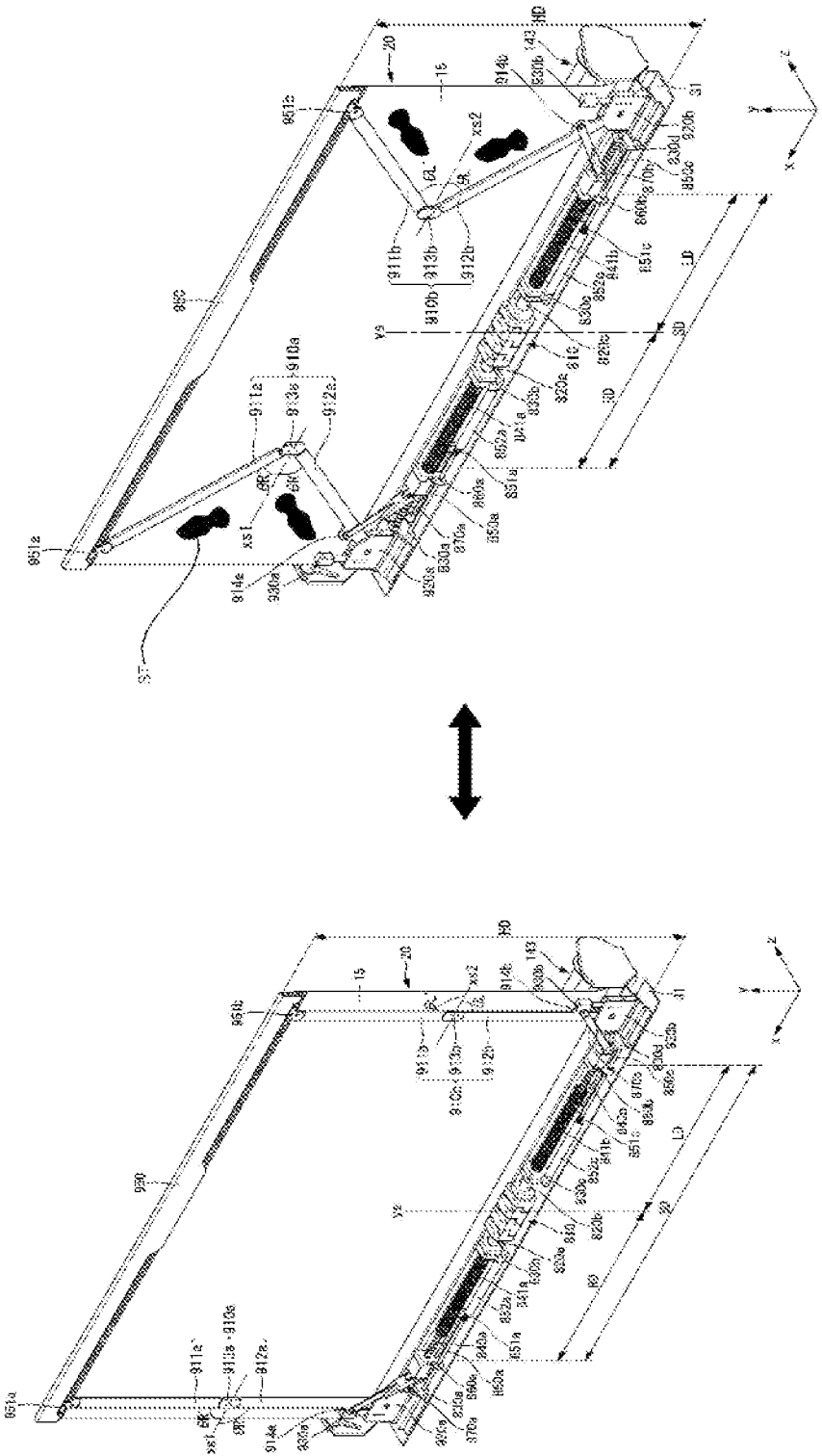
[FIG. 60]

[FIG. 61]
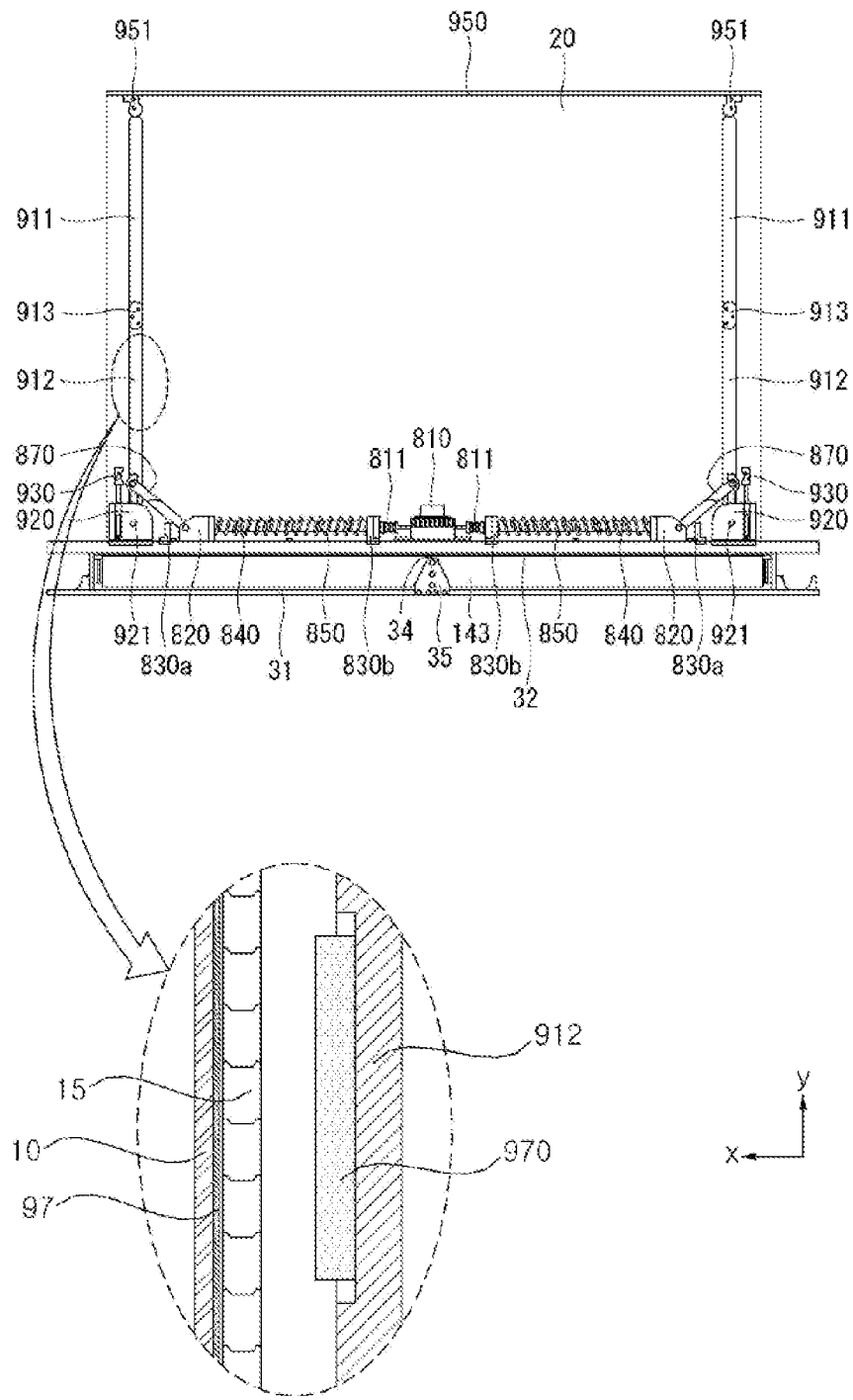

[FIG. 62]
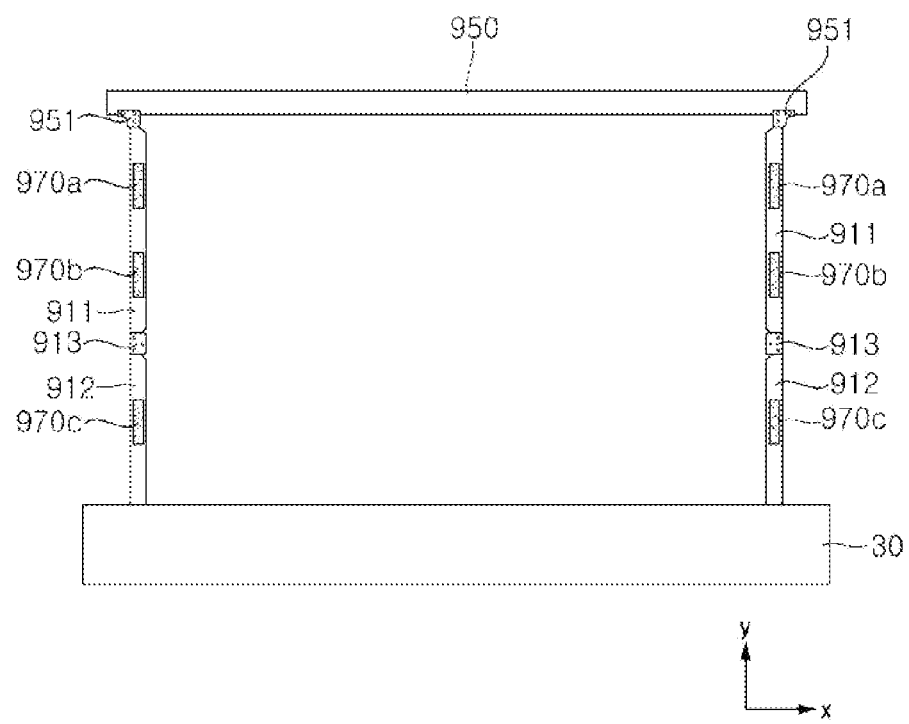

[FIG. 63]
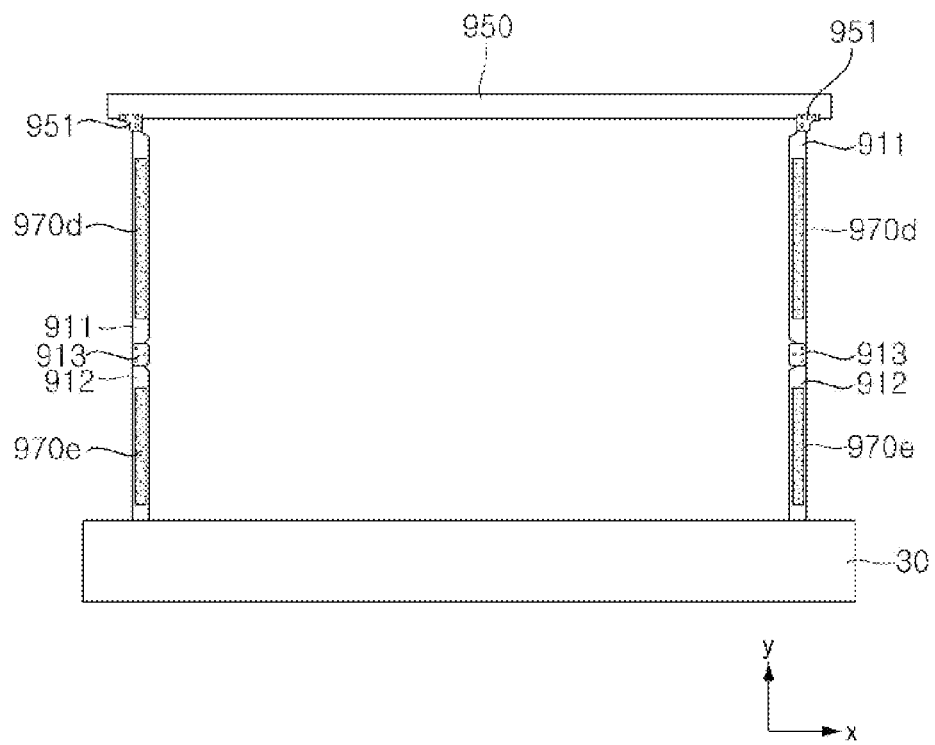

[FIG. 64]
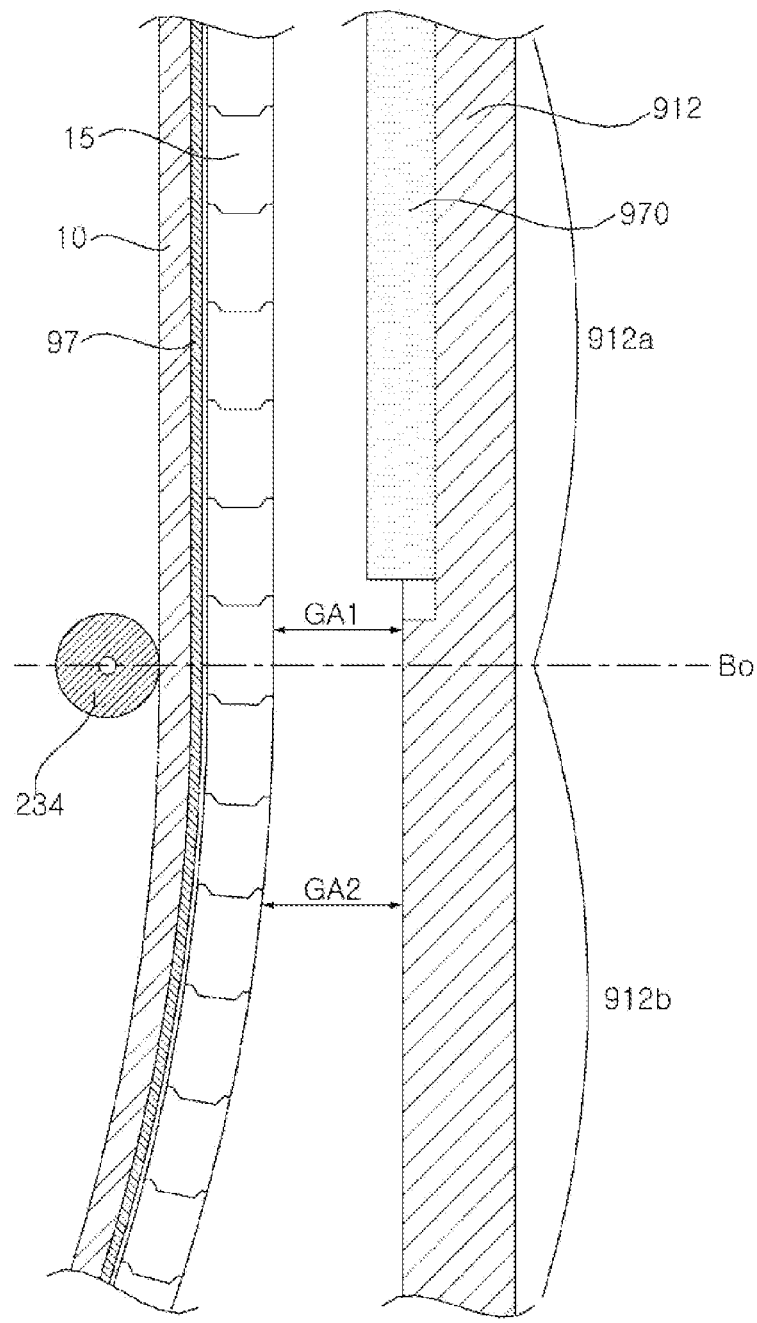

[FIG. 65]
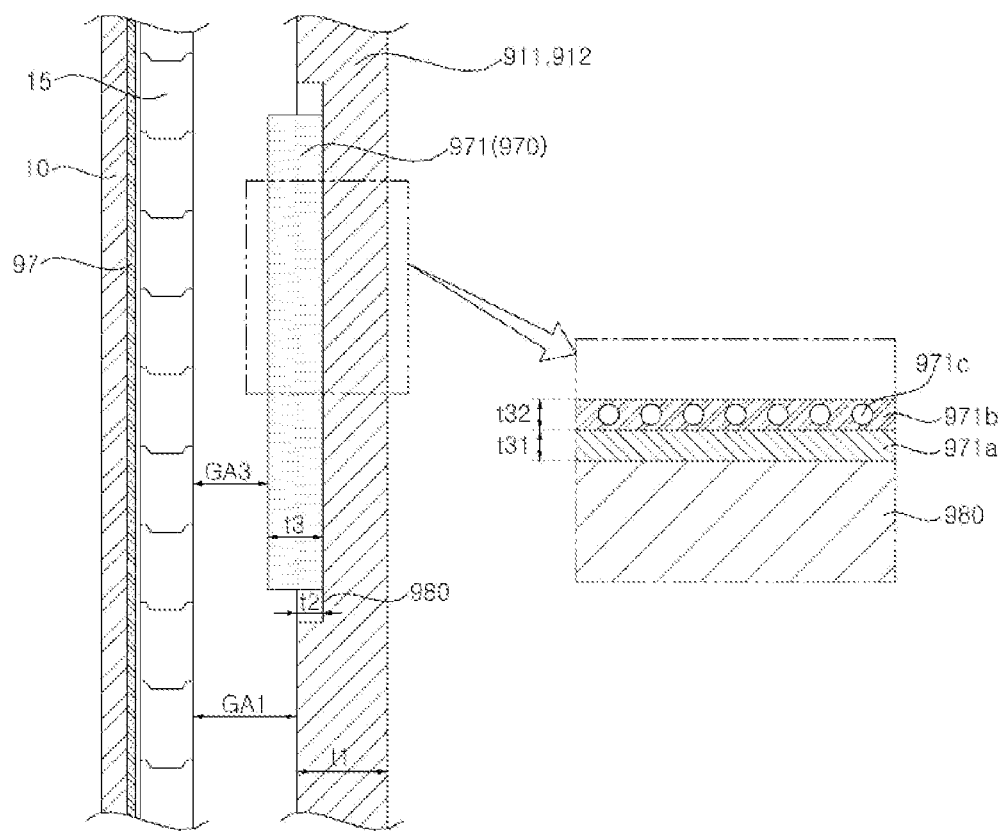

[FIG. 66]
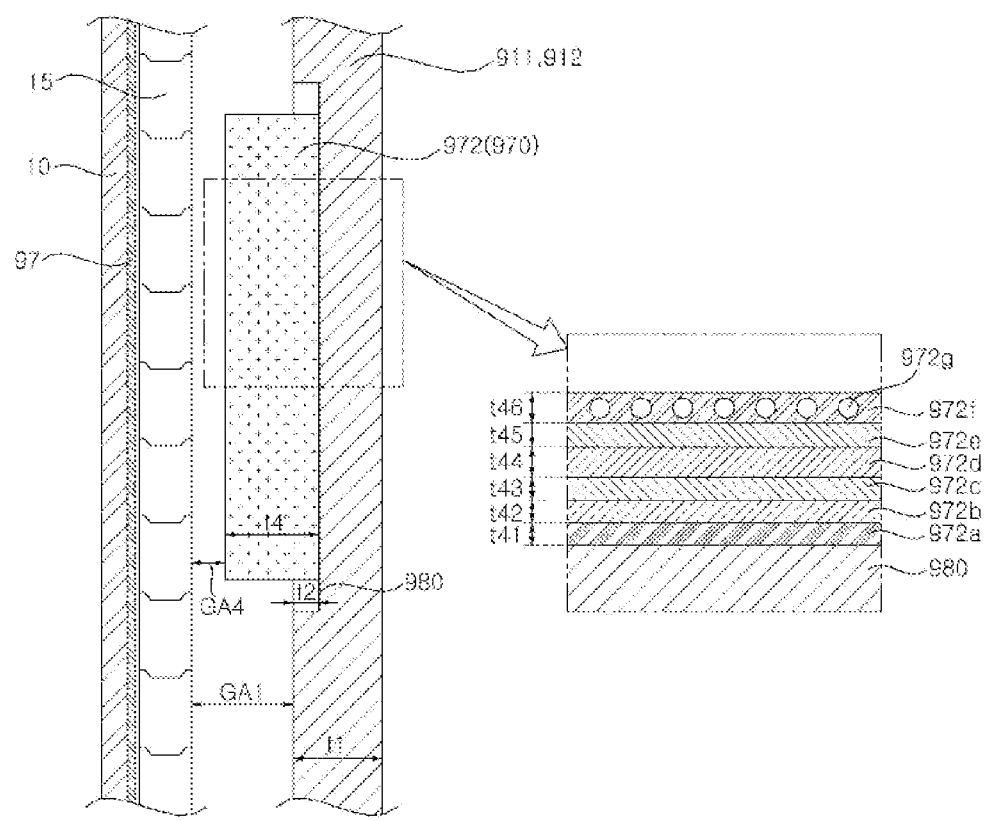

[FIG. 67]
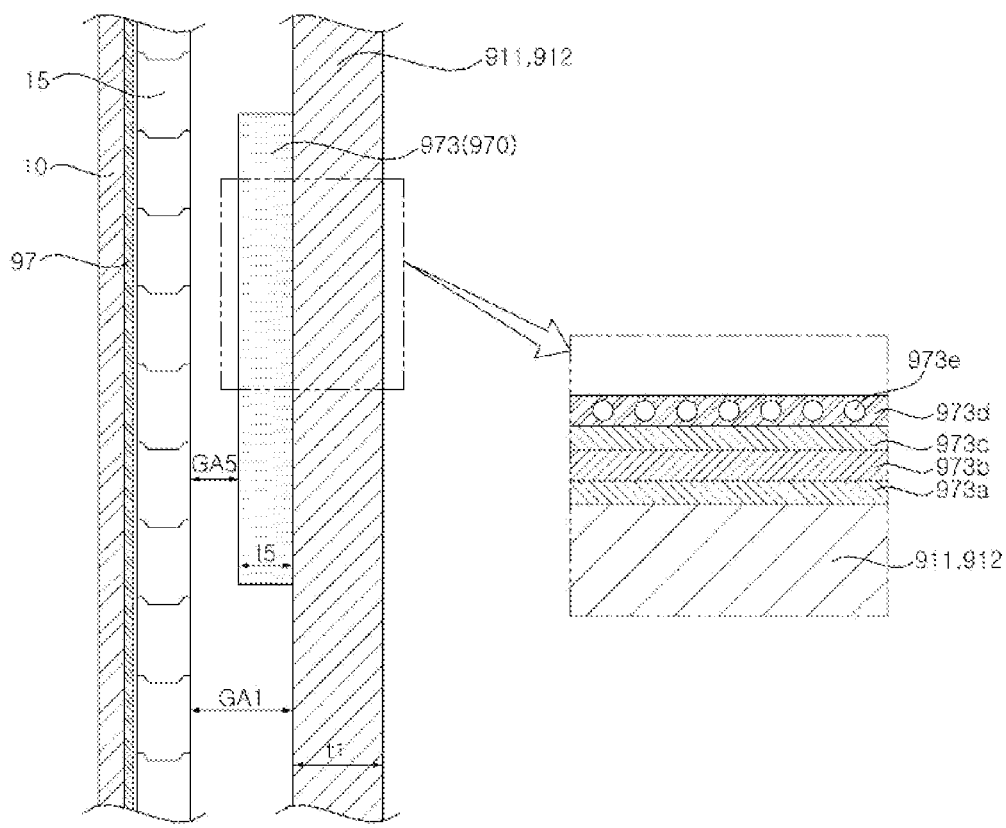

DISPLAY DEVICE

CROSS-REFERENCE TO RELATED APPLICATIONS

This application is the National Stage filing under 35 U.S.C. 371 of International Application No. PCT/KR2020/004952, filed on Apr. 13, 2020, the contents of which are hereby incorporated by reference herein its entirety.

TECHNICAL FIELD

The present disclosure relates to a display device.

BACKGROUND ART

As the information society has developed, the demand for display device is increasing in various forms, and accordingly, in recent years, various display devices such as a liquid crystal display (LCD), plasma display panel (PDP), electroluminescent display (ELD), vacuum fluorescent display (VFD), and the like have been studied and used.

Among them, a display device using an organic light emitting diode (OLED) has excellent luminance and viewing angle characteristics in comparison with a liquid crystal display device and does not require a backlight unit, thereby being implemented in an ultrathin type.

In addition, a flexible display panel can be bent or wound around a roller. The flexible display panel may be used to implement a display device that unfolds on a roller or winds around the roller. Many studies have been made on a structure for winding a flexible display panel around a roller or unwinding the flexible display panel from the roller.

DISCLOSURE OF INVENTION

Technical Problem

An object of the present disclosure is to solve the above-described problems and other problems.

Another object of the present disclosure may be to provide a display device capable of preventing a rear surface of a module cover from being stained by a foldable link during an operation of a display panel which is rolled on or unrolled from a roller.

Yet another object of the present disclosure may be to provide a display device capable of reducing friction noise due to trembling of the display panel during the operation of the display panel which is rolled on or unrolled from the roller.

Solution to Problem

In order to achieve the object, according to one aspect of the present disclosure, there is provided a display device including: a roller which elongates; a display panel rolled on or unrolled from the roller; a module cover positioned in the rear of the display panel; a foldable link adjacent to a rear surface of the module cover, and pivoted around a pivot axis which is in line with a front and rear direction and folded or unfolded in an up and down direction; and a sheet coupled to the foldable link between the module cover and the foldable link, in which a frictional coefficient of the sheet is lower than the frictional coefficient of the foldable link.

Advantageous Effects of Invention

Effects of the display device according to the present disclosure will be described below.

According to at least one of embodiments of the present disclosure, there can be provided a display device capable of preventing a rear surface of a module cover from being stained by a foldable link during an operation of a display panel which is rolled on or unrolled from a roller.

According to at least one of embodiments of the present disclosure, there can be provided a display device capable of reducing friction noise due to trembling of the display panel during the operation of the display panel which is rolled on or unrolled from the roller.

An additional range of an applicability of the present disclosure will be apparent from the following detailed description. However, since various changes and modifications can be clearly appreciated by those skilled in the art within the spirit and the scope of the present disclosure, the detailed description and a specific embodiment such as a preferred embodiment of the present disclosure should be appreciated as being just given as an example.

BRIEF DESCRIPTION OF DRAWINGS

FIGS. 1 to 67 are diagrams illustrating examples of a display device according to embodiments of the present disclosure.

MODE FOR CARRYING OUT INVENTION

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, even if an embodiment is described with reference to a specific figure, if necessary, reference numeral not shown in the specific figure may be referred to, and reference numeral not shown in the specific figure is used when the reference numeral is shown in the other figures.

Referring to FIG. 1, a display device 100 may include a display unit 20 and a housing 30. The housing 30 may have an internal space. At least a portion of the display unit 20 may be located inside the housing 30. At least a portion of the display unit 20 may be located outside the housing 30. The display unit 20 may display a screen.

The direction parallel to the longitudinal direction of the housing 30 may be referred to as a first direction DR1, +x axis direction, −x axis direction, a left direction, or a right direction. The direction in which the display unit 20 displays a screen may be referred to as +z axis, a forward direction, or the front. The direction opposite to the direction in which the display unit 20 displays the screen may be referred to as −z axis, a rearward direction, or the rear. A third direction DR3 may be parallel to +z axis direction or −z axis direction. The direction parallel to the height direction of the display device 100 may be referred to as a second direction DR2, +y axis direction, the −y axis direction, an upper direction, or a lower direction.

The third direction DR3 may be a direction perpendicular to the first direction DR1 and/or the second direction DR2. The first direction DR1 and the second direction DR2 may be collectively referred to as a horizontal direction. In addition, the third direction DR3 may be referred to as a vertical direction. A left and right direction LR may be parallel to the first direction DR1, and an up and down direction UD may be parallel to the second direction DR2.

Referring to FIG. 2, the display unit 20 may be entirely located inside the housing 30. At least a portion of the display unit 20 may be located outside the housing 30. The degree to which the display unit 20 is exposed to the outside of the housing 30 may be adjusted as necessary.

Referring to FIG. 3, the display unit 20 may include a display panel 10 and a plate 15. The display panel 10 may be flexible. For example, the display panel 10 may be an organic light emitting display (OLED).

The display panel 10 may have a front surface for displaying an image. The display panel 10 may have a rear surface facing the front surface. The front surface of the display panel 10 may be covered with a light transmissive material. For example, the light transmissive material may be synthetic resin or film.

The plate 15 may be coupled, fastened or attached to the rear surface of the display panel 10. The plate 15 may include a metal material. The plate 15 may be referred to as a module cover 15, a cover 15, a display panel cover 15, a panel cover 15, or an apron 15.

Referring to FIG. 4, the plate 15 may include a plurality of segments 15c. A magnet 64 may be located inside a recess 118 of the segment 15c. The recess 118 may be located on a surface of the segment 15c facing the display panel 10. The recess 118 may be located in the front surface of each segment 15c. Since the magnet 64 is accommodated inside the recess 118, the magnet 64 may not protrude from the segment 15c. The display panel 10 may be flat without being wrinkled even when it is in contact with the segment 15c.

Referring to FIG. 5, a plurality of magnets 64 may be located on a link 73. For example, at least one magnet 64 may be located on a first arm 73a and at least one magnet 64 may be located on a second arm 73b. The plurality of magnets 64 may be spaced apart from each other.

Referring to FIG. 6, one magnet 64 may be located on the first arm 73a and the second arm 73b, respectively. The magnet 64 may have a shape extended in the long side direction of the first arm 73a and the second arm 73b. Since the magnet 64 has a shape extended in the long side direction of the first arm 73a and the second arm 73b, the area of the portion where the link 73 is in close contact with the display panel and the module cover may be increased. Accordingly, the adhesion between the link 73 and the display panel and the module cover may be strengthened.

Referring to FIG. 7, the magnet 64 may be located in a depression 321 formed in the link 73. The depression 321 may have a shape recessed inward of the link 73. The magnet 64 may be coupled to the link 73 through at least one screw 187.

The width LHW in which the depression 321 is recessed inwardly of the link 73 may be equal to or larger than the thickness MGW of the magnet 64. If the thickness MGW of the magnet 64 is larger than the width LHW of the depression 321, the display panel 10 and the module cover 15 may not be in close contact with the link 73. In this case, the display panel 10 may be wrinkled or may not be flat.

A panel protector 97 may be located in the rear surface of the display panel 10. The panel protector 97 may prevent the display panel 10 from being damaged due to friction with the module cover 15. The panel protector 97 may include a metal material. The panel protector 97 may have a very thin thickness. For example, the panel protector 97 may have a thickness of about 0.1 mm.

Since the panel protector 97 contains a metal material, magnetic attraction between the panel protector 97 and the magnet 64 may occur. Accordingly, the module cover 15 located between the panel protector 97 and the link 73 may be in close contact with the magnet 64 even if it does not contain a metal material.

Referring to FIG. 8, the module cover 15 may be in close contact with the link 73 by an upper bar 75 of the upper side and a guide bar 234 of the lower side (see FIG. 15). A portion between the upper bar 75 and the guide bar 234 of the link 73 may not be in close contact with the module cover 15. Alternatively, the central portion of the link 73 may not be in close contact with the module cover 15. The central portion of the link 73 may be near an arm joint 152. In this case, the distance APRD1, APLD2 between the module cover 15 and the link 73 may not be constant. In this case, the display panel 10 may be bent or twisted.

Referring to FIG. 9, when the magnet 64 is located in the depression 321 of the link 73, the magnet 64 attracts the panel protector 97, so that the module cover 15 can also be in close contact with the magnet at the same time. That is, the central portion of the link 73 may be in close contact with the module cover 15.

Referring to FIG. 10, a bead 136 may be formed in the upper surface of the segment 15b. The bead 136 may have a shape recessed inwardly of segment 15b. The bead 136 may have a shape recessed in the −y axis direction. For example, the bead 136 may be formed by pressing the segment 15b. A plurality of beads 136 may be formed on the segment 15b. The plurality of beads 136 may be spaced apart from each other. The bead 136 may enhance the rigidity of segment 15b. The bead 136 can prevent the shape of the segment 15b from being deformed due to an external impact. The segment 15b may fixed to the rear of the display panel 10 by an adhesive member 70. The panel protector 97 (see FIG. 8) may be disposed between the adhesive member 70 and the display panel 10. For example, the adhesive member 70 may be a double-sided tape.

Referring to FIG. 11, a source PCB 120 may be located above the module cover 15. In the case of roll-up or roll-down, the position of the source PCB 120 may be changed with the movement of the module cover 15. A FFC cable 231 may be located in the central portion of the module cover 15 based on the first direction. The FFC cable 231 may be located in both ends of the module cover 15 based on the first direction.

Referring to FIG. 12, the segment 15d may include a depression 425 recessed in the −z axis direction. The depression 425 may form a space between the display panel 10 and the module cover 15.

The FFC cable 231 may be accommodated in a space formed by the depression 425. In addition, the depression 425 may improve the rigidity of the segment 15d.

The bead 136 may be located on the segment 15d excluding a portion where the depression 425 is located. The bead 136 may not be located in the portion where the depression 425 is located because the thickness of the segment 15d in the third direction becomes thinner.

Referring to FIG. 13, a penetrating portion 437 may be located in the central portion of the segment 15e based on the first direction. The penetrating portion 437 may penetrate the central portion of the segment 15e in the second direction. That is, the penetrating portion 437 may be a hole located in the segment 15e. The penetrating portion 437 may be a portion where the FFC cable 231 is located. Since the penetrating portion 437 is formed in the segment 15e, the thickness of the segment 15e may be reduced in comparison with the case where the FFC cable 231 is located in the depression 425.

The bead 136 may be located on the segment 15e excluding a portion where the penetrating portion 437 is located. In the portion where the penetrating portion 437 is located, the bead 136 may not be located because the thickness of the segment 15e in the third direction becomes thinner.

Referring to FIG. 14, a top case 167 may cover the source PCB 120 and the upper bar 75 as well as the display panel 10 and the module cover 15. One surface of the upper bar 75 may be coupled to the rear surface of the module cover 15, and the other surface thereof may be coupled to the source PCB 120. The upper bar 75 may be fixed to the module cover 15 to support the source PCB 120.

The lower end of the FFC cable 231 may be connected to a timing controller board 105 (see FIG. 15) inside a panel roller 143 (see FIG. 15). The FFC cable 231 may be wound around or unwound from the panel roller 143 together with the display unit 20.

A portion of the FFC cable 231 may be located between the display panel 10 and the module cover 15. A portion of the FFC cable 231 located between the display panel 10 and the module cover 15 may be referred to as a first portion 231a. The first portion 231a may be located in the depression 425 formed by the plurality of segments 15d. Alternatively, the first portion 231a may be accommodated in the depression 425 formed by the plurality of segments 15d.

A portion of the FFC cable 231 may penetrate the segment 15f. A portion of the FFC cable 231 that passes through the segment 15f may be referred to as a second portion 231b. The segment 15f may include a first hole 521a formed in the front surface and a second hole 521b formed in the rear surface. The first hole 521a and the second hole 521b may be connected to each other to form a single hole 521. The hole 521 may penetrate the segment 15f in the third direction. The second portion 231b may penetrate the hole 521. The hole 521 may be referred to as a connection hole 521.

The upper end of the FFC cable 231 may be electrically connected to the source PCB 120. A part of the FFC cable 231 may be located in the rear surface of the module cover 15. A portion of the FFC cable 231 located in the rear surface of the module cover 15 may be referred to as a third portion 231c. The third portion 231c may be electrically connected to the source PCB 120.

The third portion 231c may be covered by the top case 167. Accordingly, the third portion 231c may not be exposed to the outside.

Referring to FIG. 15, the FFC cable 231 may be connected to the timing controller board 105 mounted in the panel roller 143. A penetrating hole 615 may be formed on the panel roller 143, and the FFC cable 231 may be connected to the timing controller board 105 through the penetrating hole 615.

The penetrating hole 615 may be located in one side of the panel roller 143 and may penetrate an outer circumferential portion of the panel roller 143. The FFC cable 231 may be connected to one side of the timing controller board 105 through the penetrating hole 615.

Even when the FFC cable 231 is located in the outer circumference of the panel roller 143, it may maintain the connection with the timing controller board 105 due to the penetrating hole 615. Accordingly, the FFC cable 231 may rotate together with the panel roller 143 to prevent twisting.

A part of the FFC cable 231 may be wound around the panel roller 143. A portion of the FFC cable 231 wound around the panel roller 143 may be referred to as a fourth portion 231d. The fourth portion 231d may be in contact with the outer circumferential surface of the panel roller 143.

A part of the FFC cable 231 may pass through the penetrating hole 615. A portion of the FFC cable 231 passing through the penetrating hole 615 may be referred to as a fifth portion 231e.

The lower end of the FFC cable 231 may be electrically connected to the timing controller board 105. A part of the FFC cable 231 may be located inside the panel roller 143. A portion of the FFC cable 231 located inside the panel roller 143 may be referred to as a sixth portion 231f. The sixth portion 231f may be electrically connected to the timing controller board 105.

Referring to FIG. 16, the lower end of the display panel 10 may be connected to the roller 143. The display panel 10 may be wound around or unwound from the roller 143. The front surface of the display panel 10 may be coupled to the plurality of source PCBs 120. The plurality of source PCBs 120 may be spaced apart from each other.

A source chip on film (COF) 123 may connect the display panel 10 and the source PCB 120. The source COF 123 may be located in the front surface of the display panel 10. The roller 143 may include a first part 331 and a second part 337. The first part 331 and the second part 337 may be fastened by a screw. The timing controller board 105 may be mounted in the roller 143.

The source PCB 120 may be electrically connected to the timing controller board 105. The timing controller board 105 may send digital video data and the timing control signal to the source PCB 120.

The cable 117 may electrically connect the source PCB 120 and the timing controller board 105. For example, the cable 117 may be a flexible flat cable (FFC). The cable 117 may penetrate the hole 331a. The hole 331a may be formed in a seating portion 379 or the first part 331. The cable 117 may be located between the display panel 10 and the second part 337.

The seating portion 379 may be formed in an outer circumference of the first part 331. The seating portion 379 may be formed by stepping a portion of the outer circumference of the first part 331. The seating portion 379 may form a space B. When the display unit 20 is wound around the roller 143, the source PCB 120 may be accommodated in the seating portion 379. Since the source PCB 120 is accommodated in the seating portion 379, the source PCB 120 may not be twisted or bent, and durability may be improved.

The cable 117 may electrically connect the timing controller board 105 and the source PCB 120.

Referring to FIG. 17, the roller 143 wound around with the display unit 20 may be installed in a first base 31. The first base 31 may be a bottom surface of the housing 30. The roller 143 may be extended along the longitudinal direction of the housing 30. The first base 31 may be connected to the side surface 30a of the housing 30.

Referring to FIGS. 18 and 19, the beam 31a may be formed in the first base 31. The beam 31a may improve the bending or torsional rigidity of the first base 31. Many components may be installed in the first base 31, and the first base 31 can receive a large load. Since the rigidity of the first base 31 is improved, sagging due to the load can be prevented. For example, the beam 31a may be formed by a pressing process.

The second base 32 may be spaced upward from the first base 31. The space S1 may be formed in the first base 31 and the second base 32. The roller 143 wound around with the display unit 20 may be accommodated in the space S1. The roller 143 may be located between the first base 31 and the second base 32.

The second base 32 may be connected to the side surface 30a of the housing 30. The bracket 33 may be fastened to the upper surface of the first base 31. The bracket 33 may be fastened to the side surface 30a of the housing 30.

The beam 32a may be formed in the second base 32. The beam 32a may improve the bending or torsional rigidity of the second base 32. For example, the beam 32a may be formed by a press process.

A third part 32d may be connected to the first part 32b and the second part 32c. A fourth part 32e may be connected to the first part 32b and the second part 32c. A space S2 may be formed between the third part 32d and the fourth part 32e. Accordingly, bending or torsional rigidity of the second base 32 may be improved. The third part 32d may be referred to as a reinforcing rib 32d or a rib 32d. The fourth part 32e may be referred to as a reinforcing rib 32e or a rib 32e.

Many components can be installed in the second base 32 and the second base 32 can receive a large load. As the rigidity of the second base 32 is improved, sagging due to the load can be prevented.

A first reinforcing plate 34 may be located between the first base 31 and the second base 32. The first reinforcing plate 34 and the second base 32 may be fastened by a screw. The first reinforcing plate 34 may support the second base 32. The first reinforcing plate 34 may prevent sagging of the second base 32. The first reinforcing plate 34 may be located in the central portion of the first base 31 or in the central portion of the second base 32. The first reinforcing plate 34 may include a curved portion 34a. The curved portion 34a may be formed along the roller 143. The curved portion 34a may not be in contact with the roller 143 or the display unit 20 wound around the roller 143. The curved portion 34a may maintain a certain distance from the roller 143 so as not to interfere with the rotation of the roller 143.

A second reinforcing plate 35 may be fastened to the first base 31 and the first reinforcing plate 34. The second reinforcing plate 35 may support the first reinforcing plate 34. The second reinforcing plate 35 may be located behind the first reinforcing plate 34. The second reinforcing plate 35 may be located behind the first base 31. The second reinforcing plate 35 may be located perpendicular to the first base 31. The second reinforcing plate 35 may be fastened to the beam 31a of the first base 31. The second base 32 may face the front surface or rear surface of the housing 30.

Referring to FIG. 20, the second base 32f may not form a space. When the load that the second base 32f receives is not large, the second base 32f may have sufficient rigidity by including the beam 32g. The first base 31' may include a beam 31a'.

Referring to FIGS. 21 and 22, a motor assembly 810 may be installed in the second base 32. Drive shaft of the motor assembly 810 may be formed in both sides. The right driving shaft and the left driving shaft of the motor assembly 810 may rotate in the same direction. Alternatively, the right driving shaft and the left driving shaft of the motor assembly 810 may rotate in opposite directions.

The motor assembly 810 may include a plurality of motors. The plurality of motors may be connected in series with each other. The motor assembly 810 may output a high torque by connecting a plurality of motors in series.

A lead screw 840 may be located in the left side and the right side of the motor assembly 810, respectively. The motor assembly 810 may be connected to the lead screw 840. A coupling 811 may connect the lead screw 840 and the drive shaft of the motor assembly 810.

The lead screw 840 may be threaded along the longitudinal direction. The direction of the threads formed in the right lead screw 840 and the direction of the threads formed in the left lead screw 840 may be opposite to each other. The direction of the threads formed in the right lead screw 840 and the direction of the threads formed in the left lead screw 840 may be the same. The pitches of the left lead screw 840 and the right lead screw 840 may be the same.

The bearing 830a, 830b may be installed in the second base 32. The bearing 830a, 830b may support both sides of the lead screw 840. The bearing 830a, 830b may include an inner bearing 830b located close to the motor assembly 810 and an outer bearing 830a located far from the motor assembly 810. The lead screw 840 may be stably rotated by the bearing 830a, 830b.

The slide 820 may be engaged with the lead screw 840. The slide 820 may move forward or rearward in the longitudinal direction of the lead screw 840 according to the rotation of the lead screw 840. The slide 820 may move between the outer bearing 830a and the inner bearing 830b. The slide 820 may be located in the left lead screw 840 and the right lead screw 840, respectively. The left slide 820 may be engaged with the left lead screw 840. The right slide 820 may be engaged with the right lead screw 840.

The left slide 820 and the right slide 820 may be located symmetrically with respect to the motor assembly 810. Due to the driving of the motor assembly 810, the left slide 820 and the right slide 820 may move far away or approach from each other by the same distance.

Referring to FIG. 23, the motor assembly 810 may include a plate 812. The plate 812 may be referred to as a mount plate 812 or a motor mount plate 812. A coupling portion 32h may be formed in an upper surface of second base 32. The plate 812 may be fastened to the coupling portion 32h through a screw S. The motor assembly 810 may be spaced apart from the top surface of the second base 32. A washer 813 may be located between the top surface of the plate 812 and the screw S. The washer 813 may include a rubber material. The washer 813 may reduce vibration generated in the motor assembly 810. The washer 813 may improve driving stability of the display device 100.

Referring to FIG. 24, a guide rail 860 may be installed in the second base 32. The guide rail 860 may be located in parallel with the lead screw 840. The slide 820 may be engaged with the guide rail 860. A first stopper 861b may be located in one side of the guide rail 860, and a second stopper 861a may be located in the other side of the guide rail 860. The range in which the slide 820 can move may be limited to between the first stopper 861b and the second stopper 861a.

A spring 850 may wrap the lead screw 840. The lead screw 840 may penetrate the spring 850. The spring 850 may be located between the inner bearing 830b and the slide 820. One side of the spring 850 may contact the inner bearing 830b, and the other side of the spring 850 may contact the slide 820. The spring 850 may provide an elastic force to the slide 820.

When the slide 820 is caught in the first stopper 861b, the spring 850 may be maximally compressed. When the slide 820 is caught in the first stopper 861b, the length of the spring 850 may be minimized. When the slide 820 is caught in the first stopper 861b, the distance between the slide 820 and the inner bearing 830b may be minimized.

Referring to FIG. 25, when the slide 820 is caught in the second stopper 861a, the spring 850 may be maximally tensioned. When the slide 820 is caught in the second stopper 861b, the length of the spring 850 may be maximized. When the slide 820 is caught in the second stopper 861a, the distance between the slide 820 and the inner bearing 830b may be maximized.

Referring to FIG. 26, the first part 820a may be engaged with the guide rail 860. The first part 820a may move along the guide rail 860. Movement of the first part 820a in the longitudinal direction of the guide rail 860 may be restricted. The second part 820b may be located above the first part 820a. The first part 820a and the second part 820b may be fastened through a screw. The second part 820b may be spaced apart from the guide rail 860. The lead screw 840 may penetrate the second part 820b. For example, the second part 820b may include a male thread that engages with a female thread of the lead screw 840. Accordingly, even if the lead screw 840 is rotated, the slide 820 can be stably moved forward or rearward along the guide rail 860 without rotating.

The third part 820c may be coupled to one side of the second part 820b. The third part 820c may contact the spring 850. The third part 820c may be provided with an elastic force from the spring 850.

Referring to FIGS. 27 and 28, a link mount 920 may be installed in the second base 32. One side of a second arm 912 may be pivotably connected to a link mount 920. The other side of the second arm 912 may be pivotably connected to a joint 913. The other side of the second arm 912 may be pivotably connected to a second axis 913b. One side of a rod 870 may be pivotably connected to the slide 820. The other side of the rod 870 may be pivotably connected to the second arm 912 or a third arm 915. One side of the third arm 915 may be pivotably connected to the link mount 920. The other side of the third arm 915 may be pivotably connected to the other side of the rod 870. The link mount 920 may include a shaft 921. The second arm 912 or the third arm 915 may be pivotably connected to the shaft 921.

A link bracket 951 may be referred to as a link cap 951. The link bracket 951 may be coupled to a top case 950. The top case 950 may be referred to as a case top 950, an upper bar 950, a top 950, or a bar 950. The top case 950 may be located in an upper end of the display unit 20. The display unit 20 may be fixed to the top case 950.

One side of a first arm 911 may be pivotably connected to the joint 913. One side of the first arm 911 may be pivotably connected to a first shaft 913a. The other side of the first arm 911 may be pivotably connected to the link bracket 951 or the top case 950.

A gear g1 may be formed in one side of the first arm 911. A gear g2 may be formed in the other side of the second arm 912. The gear g1 of the first arm 911 and the gear g2 of the second arm 912 may be engaged with each other.

When the slide 820 approaches the outer bearing 830a, the second arm 912 or the third arm 915 may stand up. At this time, the direction in which the second arm 912 or the third arm 915 stands may be referred to as a standing direction DRS.

The second arm 912 may include a protrusion 914 protruding in the standing direction DRS. The protrusion 914 may be referred to as a connection part 914. The third arm 915 may include a protrusion 916 protruding in the standing direction DRS. The protrusion 916 may be referred to as a connection part 916. The protrusion 914 of the second arm 912 and the protrusion 916 of the third arm 915 may face or contact each other. The other side of the rod 870 may be fastened to the protrusion 914 of the second arm 912 or the protrusion 916 of the third arm 915.

A link 910 may include a first arm 911, a second arm 912, a third arm 915, and/or a joint 913.

Referring to FIGS. 29 and 30, an angle formed by the second arm 912 or the third arm 915 with respect to the second base 32 may be referred to as theta S. When the rod 870 is connected to the upper side of the second part 820b, an angle between the rod 870 and the second base 32 may be referred to as theta A, and the minimum force for the rod 870 to stand the second arm 912 or the third arm 915 may be referred to as Fa. When the rod 870 is connected to the middle of the second part 820b, an angle between the rod 870 and the second base 32 may be referred to as theta B, and the minimum force for the rod 870 to stand the second arm 912 or the third arm 915 may be referred to as Fb. When the rod 870 is connected to the lower side of the second part 820b, an angle between the rod 870 and the second base 32 may be referred to as theta C, and the minimum force for the rod 870 to stand the second arm 912 or the third arm 915 may be referred to as Fc.

A relationship of theta A<theta B<theta C can be established for the same theta S. In addition, a relationship of Fc<Fb<Fa may be established for the same theta S. If an angle formed by the second arm 912 or the third arm 915 with respect to the second base 32 is the same, the force required to stand up the second arm 912 or the third arm 915 can become smaller as the angle formed by the rod 870 and the second base 32 increases. The rod 870 may be connected to the lower side of the second part 820b to reduce the load applied on the motor assembly 810.

Referring to FIG. 31, the rod 870' may not be connected to the protrusion of the second arm 912 'or the protrusion of the third arm 915'. When the angle formed by the second arm 912' or the third arm 915' with respect to the second base 32 is theta S, the angle formed by the rod 870' and the second base 32 is referred to as theta 1, and the minimum force for the rod 870' to stand up the second arm 912' or the third arm 915' may be referred to as F1.

Referring to FIG. 32, the rod 870 may be connected to the protrusion 914 of the second arm 912 or the protrusion 916 of the third arm 915. When the angle formed by the second arm 912 or the third arm 915 with respect to the second base 32 is theta S, the angle formed by the rod 870 and the second base 32 may be referred to as theta 2, and the minimum force for the rod 870 to stand the second arm 912 or the third arm 915 may be referred to as F2.

Referring to FIG. 33, when theta S is the same, theta 2 may be greater than theta 1. If Theta S is the same, F1 can be greater than F2. If the angle formed by the second arm 912, 912' and the second base 32 is the same, the force required to stand up the second arm 912, 912' may become smaller as the angle formed by the rod 870, 870' and the second base 32 becomes larger. The rod 870 may be connected to the protrusion 914, 916 to stand up the second arm 912 with less force than a case where the rod 870' is not connected to the protrusion. The rod 870 may be connected to the 914, 916 to reduce the load applied on the motor assembly 810.

Referring to FIG. 34, the second arm 912 or the third arm 915 may have a central axis CR. When the rod 870 is fastened to the second arm 912 by a distance r away from the central axis CR, the angle formed by the rod 870 and the second base 32 may be referred to as theta 2, and the minimum force for the 870 to stand the second arm 912 or the third arm 915 may be referred to as F3. When the rod 870 is fastened to the second arm 912 by a distance r' away from the central axis CR, the angle formed by the rod 870 and the second base 32 may be referred to as theta 2', and the minimum force for the rod 870 to stand the second arm 912 or the third arm 915 may be referred to as F4. When the rod 870 is fastened to the second arm 912 by a distance r" away from the central axis CR, the angle formed by the rod 870 and the second base 32 may be referred to as theta 2", and the minimum force for the rod 870 to stand the second arm 912 or the third arm 915 may be referred to as F5.

Referring to FIG. 35, when theta S is the same, theta 2" may be greater than theta 2', and theta 2' may be greater than theta 2. When theta S is the same, F3 may be greater than F4, and F4 may be greater than F5. As the rod 870 is fastened away from the central axis CR, the force required to stand the second arm 912 may be smaller. Since the rod 870 is fastened away from the central axis CR, the load on the motor assembly 810 may be reduced.

Referring to FIG. 36, the first arm 911 and the second arm 912 may be in contact with or close to the rear surface of the display unit 20. Since the first arm 911 and the second arm 912 are in contact with or close to the rear surface of the display unit 20, the display unit 20 may be stably wound around or unwound from a roller. The link mount 920 may include a first part 922 and a second part 923. The first part 922 and the second part 923 may face each other. A space S4 may be formed between the first part 922 and the second part 923. The first part 922 may face the display unit 20. The first part 922 may be located closer to the display unit 20 than the second part 923. The second arm 912 may be pivotably connected to the front surface of the first part 922. A part of the third arm 915 may be accommodated in the space S4 and pivotably connected to the first part 922 or the second part 923.

Referring to FIG. 37, the rod 870 may include a first part 871 and a second part 872. The first part 871 may include a connection part 871a in one side thereof. The second part 872 of the slide 820 may form a space S5 therein. The connection part 871a may be inserted into the space S5. The connection part 871a may be pivotably connected to the second part 820b (see FIG. 36) of the slide 820. The other side of the first part 871 may be connected to one side of the second part 872. The other side of the second part 872 may be pivotably connected to the second arm 912 or the third arm 915. The first part 871 may form a space S3 therein. The first part 871 may include a hole 871b. The lead screw 840 may be accommodated in the hole 871b or the space S3.

The distance between the second part 872 and the display unit 20 may be D1. The second arm 912 may have a thickness W1. A portion of the third arm 915 accommodated in the space S4 may have a thickness W3. The thickness W3 may be equal to the distance between the first part 922 and the second part 923. A portion of the third arm 915 that is not accommodated in the space S4 may have a thickness W2. The first part 922 may have a thickness W4. The thickness W2 may be greater than the thickness W3. The thickness W2 may be equal to the sum of the thickness W3 and the thickness W4. D1 may be the sum of the thickness W1 and the thickness W2.

The second arm 912 may be located in contact with or close to the rear surface of the display unit 20, and the third arm 915 may be located between the second arm 912 and the second part 872. The second part 872 can stably transmit power for standing the second arm 912 due to the third arm 915. The second part 872 may be connected to the first part 871 by moving forward with respect to the axis of rotation of the lead screw 840, so as to stably stand the second arm 912 or the third arm 915. Thus, the play between the second arm 912 and the second part 872 may be minimized.

Referring to FIG. 38, a pusher 930 may be installed in the link mount 920. The pusher 930 may be referred to as a lifter 930. A second part 932 may be fastened to the first part 931. The second part 932 may be in contact with or separated from the link bracket 951. The second part 932 may be made of a material having high elasticity. The first part 931 may be made of a material having a lower elasticity than the second part 932. The first part 931 may be made of a material having a higher rigidity than the second part 932. The first part 931 and the second part 932 may be collectively referred to as a head 936. The head 936 may be located above the link mount 920.

A third part 933 may be connected to the first part 931. Alternatively, the third part 933 may be extended downward from the first part 931. The third part 933 may be referred to as a tail 933. A fourth part 934 may protrude from the third part 933. The link mount 920 may form a space S6, and the third part 933 may be accommodated in the space S6. The space S6 may be opened upward. The space S6 in which the third part 933 is accommodated may be adjacent to the space S4 (see FIG. 37) in which the third arm 915 is accommodated. The second part 932 of the link mount 920 may include a hole 924. The hole 924 may be a long hole formed in the vertical direction. The length of the hole 924 may be H1. The fourth part 934 may be inserted into the hole 924. The spring 935 may be accommodated in the space S6. The spring 935 may be located below the third part 933. The spring 935 may provide an elastic force in the direction perpendicular to the third part 933.

The head 936 may be larger than the diameter of the space S6. When the head 936 is caught in the upper end of the space S6, the height of the head 936 from the second base 32 may be minimized. The minimum height of the head 936 may be referred to as H2. When the height of the head 936 is minimized, the fourth part 934 may be caught in the lower end of the space S6. When the height of the head 936 is minimized, the spring 935 may be maximally compressed. When the height of the head 936 is minimized, the elastic force provided by the spring 935 may be maximized. When the height of the head 936 is minimized, the height of the top case 950 may be maximized.

The pusher 930 may provide elastic force to the link bracket 951, while being in contact with the link bracket 951. Thus, the load applied on the motor assembly 810 to stand up the link 910 may be reduced.

Referring to FIG. 39, when the link 910 stands up sufficiently, the pusher 930 may be separated from the link bracket 951. When the pusher 930 is separated from the link bracket 951, the height of the head 936 from the second base 32 may be maximized. The maximum height of the head 936 may be referred to as H3. When the height of the head 936 is maximized, the fourth part 934 may be caught in the upper end of the hole 924 (see FIG. 38). If the height of the head 936 is maximized, the spring 935 may be maximally tensioned. When the height of the head 936 is maximized, the elastic force provided by the spring 935 may be minimized. The maximum height H3 of the head 936 may be substantially equal to the sum of the minimum height H2 of the head 936 and the length H1 of the hole.

Referring to FIG. 40, the display unit 20 may be in a state of being maximally wound around the roller 143. The display device 100 may be symmetrical with respect to the motor assembly 810. The height of the top case 950 may be minimized. The slide 820 may be in a position closest to the inner bearing 830b. The slide 820 may be in a state of being caught in the first stopper 861b. The spring 850 may be in a maximally compressed state. The pusher 930 may be in contact with the link bracket 951. The height of the pusher 930 may be minimized.

Referring to FIG. 41, about half of the display unit 20 may be in a state of being wound around the roller 143. The display device 100 may be symmetrical with respect to the motor assembly 810. About half of the display unit 20 may be in a state of being unwound from the roller 143. The slide 820 may be located between the first stopper 861b and the second stopper 861a. The pusher 930 may be separated from the link bracket 951. The height of the pusher 930 may be maximized.

Referring to FIG. 42, the display unit 20 may be in a state of being maximally unwound from the roller 143. The display device 100 may be symmetrical with respect to the motor assembly 810. The height of the top case 950 may be maximized. The slide 820 may be in a position closest to the outer bearing 830a. The slide 820 may be in a state of being caught in the second stopper 861a. The spring 850 may be in a state of maximum tension. The pusher 930 may be separated from the link bracket 951. The height of the pusher 930 may be maximized.

Referring to FIGS. 43 to 46, a link mount 920a, 920b may be installed in the base 31. The link mount 920a, 920b may include a right link mount 920a spaced to the right from a first right bearing 830a and a left link mount 920b spaced to the left from a second left bearing 830d.

A link 910a, 910b may be connected to the link mount 920a, 920b. The link 910a, 910b may include a right link 910a connected to the right link mount 920a and a left link 910b connected to the left link mount 920b.

The right link 910a may be referred to as a first link. The left link 910b may be referred to as a second link. The right link mount 920a may be referred to as a first link mount 920a. The left link mount 920b may be referred to as a second link mount 920b.

The link 910a, 910b may include a first arm 911a, 911b, a second arm 912a, 912b, and an arm joint 913a, 913b. One side of the second arm 912a, 912b may be rotatably connected to the link mount 920a, 920b. The other side of the second arm 912a, 912b may be rotatably connected to the arm joint 913a, 913b. One side of the first arm 911a, 911b may be rotatably connected to the arm joint 913a, 913b. The other side of the first arm 911a, 911b may be rotatably connected to the link bracket 951a, 951b.

The link bracket 951a, 951b may include a right link bracket 951a connected to the first arm 911a of the right link 910a and a left link bracket 951b connected to the first arm 911b of the left link 910b. The link bracket 951a, 951b may be connected to the upper bar 950. The upper bar 950 may connect the right link bracket 951a and the left link bracket 951b.

A rod 870a, 870b may connect a slider 860a, 860b to the link 910a, 910b. One side of the rod 870a, 870b may be rotatably connected to the slider 860a, 860b. The other side of the rod 870a, 870b may be rotatably connected to the second arm 912a, 912b. The rod 870a, 870b may include a right rod 870a connecting the right slider 860a and the second arm 912a of the right link 910a and a left rod 870b connecting the left slider 860b and the second arm 912b of the left link 910b. The right rod 870a may be referred to as a first rod 870a. The left rod 870b may be referred to as a second rod 870b.

Specifically, a structure formed by a right lead screw 840a, the right slider 860a, the right rod 870a, and the right link 910a will be described. The right slider 860a may include a body 861a and a rod mount 862a. The body 861a may have a thread SS formed on an inner circumferential surface thereof. The thread formed in the body 861a may be engaged with the thread RS of the right lead screw 840a. The right lead screw 840a may penetrate the body 861a.

The rod mount 862a may be formed in the right side of the body 861a. The rod mount 862a may be rotatably connected to one side of the right rod 870a. The rod mount 862a may include a first rod mount 862a1 and a second rod mount 862a2. The first rod mount 862a1 may be disposed in front of the right lead screw 840a. The second rod mount 862a2 may be disposed behind the right lead screw 840a. The first rod mount 862a1 and the second rod mount 862a2 may be spaced apart from each other. The second rod mount 862a2 may be spaced apart from the first rod mount 862a1 in the −z axis direction. The right lead screw 840a may be located between the first rod mount 862a1 and the second rod mount 862a2.

The rod mount 862a may be rotatably connected to one side of the rod 870a through a connecting member C1. The connecting member C1 may penetrate the rod mount 862a and the right rod 870a.

The right rod 870a may be rotatably connected to a second arm 912a through a connecting member C2. The connecting member C2 may penetrate the second arm 912a and the right rod 870a.

The right rod 870a may include a transmission part 871a connected to the second arm 912a of the right link 910a and a cover 872a connected to the rod mount 862a of the right slider 860a. The transmission part 871a may transmit a force, which is generated as the right slider 860a moves forward or rearward along the right lead screw 840a, to the right link 910a.

The cover 872a may include a first plate 873a disposed in front of the right lead screw 840a. The first plate 873a may be disposed perpendicular to the base 31. Alternatively, the first plate 873a may face the right lead screw 840a.

The cover 872a may include a second plate 874a disposed behind the right lead screw 840a. The second plate 874a may be disposed perpendicular to the base 31. Alternatively, the second plate 874a may face the right lead screw 840a. Alternatively, the second plate 874a may be spaced apart from the first plate 873a. The right lead screw 840a may be located between the first plate 873a and the second plate 874a.

The cover 872a may include a third plate 875a connecting the first plate 873a and the second plate 874a. The third plate 875a may be connected to the transmission part. The third plate 875a may be located above the right lead screw 840a.

The cover 872a may include a fourth plate 876a connecting the first plate 873a and the second plate 874a. The fourth plate 876a may be connected to the third plate 875a. The fourth plate 876a may be located above the right lead screw 840a.

One side of the first plate 873a may be connected to the first rod mount 862a1. The first plate 873a and the first rod mount 862a1 may be connected through the connecting member C1'. The other side of the first plate 873a may be connected to the third plate 875a.

One side of the second plate 874a may be connected to the second rod mount 862a2. The second plate 874a and the second rod mount 862a2 may be connected through the connecting member C1. The other side of the second plate 874a may be connected to the third plate 875a.

When the right slider 860a is moved closer to the motor assembly 810, the right lead screw 840a and the right rod 870a may be in contact with each other. When the right lead screw 840a and the right rod 870a contact each other, mutual interference may occur and the movement of the right slider 860a may be restricted.

The cover 872a may provide a space S1 therein. The first plate 873a, the second plate 874a, the third plate 875a, and the fourth plate 876a may form the space S1. When the right slider 860a is moved closer to the motor assembly 810, the right lead screw 840a may be accommodated or escaped into the space S1 provided by the cover 872a. The right slider 860a may move closer to the motor assembly 810 than a case of not having the cover 872a, due to the space S1 provided by the cover 872a. That is, the cover 872a may expand the movable range of the right slider 860a by providing the space S1 therein. In addition, since the right lead screw 840a is accommodated in the cover 872a, the size of the housing 30 (see FIG. 2) can be reduced.

In addition, the cover 872a may limit the minimum value of the angle theta S formed between the second arm 912a and the base 31. The third plate 875a of the cover 872a may contact the second arm 912a and may support the second arm 912a, when theta S is sufficiently small. By supporting the second arm 912a, the third plate 875a may limit the minimum value of theta S and prevent sagging of the second arm 912a. That is, the cover 872a may serve as a stopper for preventing sagging of the second arm 912a. In addition, the third plate 875a may reduce the initial load for standing the second arm 912a by limiting the minimum value of theta S.

The lead screw 840a, 840b may be driven by a single motor assembly 810. The lead screw 840a, 840b is driven by a single motor assembly 810, so that the second arm 912a, 912b can stand up in symmetry. However, when driving the lead screw 840a, 840b by a single motor assembly 810, the load on the motor assembly 810 to stand the second arm 912a, 912b may be excessively increased. At this time, the third plate 875a may reduce the load on the motor assembly 810 to stand the second arm 912a, 912b, by limiting the minimum value of theta S.

The structure formed by the left lead screw 840b, the left slider 860b, the left rod 870b, and the left link 910b may be symmetric with the structure formed by the right lead screw 840a, the right slider 860a, the right rod 870a, and the right link 910a. In this case, the axis of symmetry may be the axis of symmetry ys of the motor assembly 810.

Referring to FIG. 47, a guide 850a, 850b, 850c, 850d may be connected to the bearing 830a, 830b, 830c, and 830d. The guide 850a, 850b, 850c, 850d may include a right guide 850a, 850b disposed in the right side of the motor assembly 810 and a left guide 850c, 850d disposed in the left side of the motor assembly 810.

The right guide 850a, 850b may have one side connected to a first right bearing 830a and the other side connected to a second right bearing 830b. The right guide 850a, 850b may be located in parallel with the right lead screw 840a. Alternatively, the right guide 850a, 850b may be spaced apart from the right lead screw 840a.

The right guide 850a, 850b may include a first right guide 850a and a second right guide 850b. The first right guide 850a and the second right guide 850b may be spaced apart from each other. The right lead screw 840a may be located between the first right guide 850a and the second right guide 850b.

The right slider 860a may include a protrusion. Alternatively, the display device may include a protrusion formed in the right slider 860a. The protrusion may be formed in the body of the slider. The protrusion may include a front protrusion (not shown) protruded in the +z-axis direction from the body 861a of the right slider 860a and a rear protrusion 865a protruded in the −z-axis direction from the body of the slider.

The first right guide 850a may penetrate the rear protrusion 865a. Alternatively, it may include a first hole 863a formed in the rear protrusion, and the first right guide 850a may penetrate the first hole 863a. The first hole 863a may be formed in the x-axis direction. The first hole 863a may be referred to as a hole 863a.

The second right guide (not shown) may penetrate the front protrusion (not shown).

Alternatively, it may include a second hole (not shown) formed in the front protrusion, and the second right guide may penetrate the second hole. The second hole may be formed in the x-axis direction.

The right guide 850a, 850b may guide the right slider 860a to move more stably when the right slider 860a moves forward or rearward along the right lead screw 840a. As the right guide 850a, 850b stably guides the right slider 860a, the right slider 860a can move forward or rearward along the right lead screw 840a while not rotating with respect to the right lead screw 840a.

The structure formed by the left guide 850c, 850d, the left bearing 830a, 830b, 830c, and 830d, the left slider 860b, and the left lead screw 840b may be symmetrical with the structure formed by the right guide 850a, 850b, the right bearing 830a, 830b, 830c, and 830d, the right slider 860a, and the right lead screw 840a. In this case, the axis of symmetry may be the axis of symmetry ys of the motor assembly 810.

Referring to FIG. 48, a first spring 841a, 841b may be inserted into the lead screw 840a, 840b. Alternatively, the lead screw 840a, 840b may penetrate the first spring 841a, 841b. The first spring 841a, 841b may include a first right spring 841a disposed in the right side of the motor assembly 810 and a first left spring 841b disposed in the left side of the motor assembly 810.

The first right spring 841a may be disposed between the right slider 860a and the second right bearing 830b. One end of the first right spring 841a may be in contact with or separated from the right slider 860a. The other end of the first right spring 841*a* may be in contact with or separated from the second right bearing 830*b*.

When the second arm 912*a* is fully laid with respect to the base 31, the distance between the right slider 860*a* and the second right bearing 830*b* may be a distance RD3. The first right spring 841*a* may have a length greater than the distance RD3 in the state of not being compressed or tensioned. Thus, when the second arm 912*a* is fully laid with respect to the base 31, the first right spring 841*a* may be compressed between the right slider 860*a* and the second right bearing 830*b*. Then, the first right spring 841*a* may provide a restoring force to the right slider 860*a* in the +x axis direction.

When the second arm 912*a* changes from a fully laid state to a standing state with respect to the base 31, the restoring force provided by the first right spring 841*a* may assist the second arm 912*a* to stand up. As the first right spring 841*a* assists the second arm 912*a* to stand up, the load on the motor assembly 810 may be reduced.

The lead screw 840*a*, 840*b* may be driven by a single motor assembly 810. As the lead screw 840*a*, 840*b* is driven by a single motor assembly 810, the second arm 912*a*, 912*b* can stand up in symmetry. However, when the lead screw 840*a*, 840*b* is driven by a single motor assembly 810, the load on the motor assembly 810 to stand the second arm 912*a*, 912*b* may be excessively increased. At this time, the first right spring 841*a* assists the second arm 912*a* to stand up, so that the load on the motor assembly 810 can be decreased, and the load on the motor assembly 810 to stand the second arm 912*a* can be reduced.

Alternatively, when the second arm 912*a* changes from the standing state to the fully laid state with respect to the base 31, the restoring force provided by the first right spring 841*a* can alleviate the shock that occurs when the second arm 912*a* is laid with respect to the base 31. That is, the first right spring 841*a* may serve as a damper when the second arm 912*a* is laid with respect to the base 31. As the first right spring 841*a* serves as a damper, the load of the motor assembly 810 may be reduced.

The structure formed by the first left spring 841*b*, the left bearing 830*a*, 830*b*, 830*c*, and 830*d*, the left slider 860*b*, the left lead screw 840*b*, and the second arm 912*a* may be symmetrical with the structure formed by the first right spring 841*a*, the right bearing 830*a*, 830*b*, 830*c*, and 830*d*, the right slider 860*a*, the right lead screw 840*a*, and the second arm 912*a*. In this case, the axis of symmetry may be the axis of symmetry ys of the motor assembly 810.

Referring to FIG. 49, the second spring 851*a*, 851*b* may be inserted into the guide 850*a*, 850*b*, 850*c*, 850*d*. Alternatively, the guide 850*a*, 850*b*, 850*c*, 850*d* may penetrate the second spring 851*a*, 851*b*. The second spring 851*a*, 851*b* may include a second right spring 851*a* disposed in the right side of the motor assembly 810 and a second left spring 851*b* disposed in the left side of the motor assembly 810.

A plurality of second right springs 851*a* may be formed. The second right spring 851*a* may include a spring 940*a*, 940*b* inserted into the first right guide 850*a* and a spring 940*a*, 940*b* inserted into the second right guide 850*b*. Alternatively, the second right spring 851*a* may include a spring 940*a*, 940*b* through which the first right guide 850*a* passes and a spring 940*a*, 940*b* through which the second right guide 850*b* passes.

The guide 850*a*, 850*b*, 850*c*, 850*d* may include a locking jaw 852*a*, 852*b*. The locking jaw 852*a*, 852*b* may include a right locking jaw 852*a* disposed in the right side of the motor assembly 810 and a left locking jaw 852*b* disposed in the left side of the motor assembly 810.

The right locking jaw 852*a* may be disposed between the right slider 860*a* and the second right bearing 830*b*. The second right spring 851*a* may be disposed between the right slider 860*a* and the second right bearing 830*b*. One end of the second right spring 851*a* may be in contact with or separated from the right slider 860*a*. The other end of the second right spring 851*a* may be in contact with or separated from the right locking jaw 852*a*.

When the second arm 912*a* is fully laid with respect to the base 31, the distance between the right slider 860*a* and the right locking jaw 852*a* may be a distance RD4. The second right spring 851*a* may have a length greater than the distance RD4 in the state of being not compressed or tensioned. Thus, when the second arm 912*a* is fully laid with respect to the base 31, the second right spring 851*a* may be compressed between the right slider 860*a* and the right locking jaw 852*a*. The second right spring 851*a* may provide a restoring force to the right slider 860*a* in the +x axis direction.

When the second arm 912*a* changes from the fully laid state to the standing state with respect to the base 31, the restoring force provided by the second right spring 851*a* may assist the second arm 912*a* to stand up. As the second right spring 851*a* assists the second arm 912*a* to stand, the load on the motor assembly 810 can be reduced.

The lead screw 840*a*, 840*b* may be driven by a single motor assembly 810. As the lead screw 840*a*, 840*b* is driven by a single motor assembly 810, the second arm 912*a*, 912*b* may stand up in symmetry. However, when the lead screw 840*a*, 840*b* is driven by a single motor assembly 810, the load on the motor assembly 810 to stand the second arm 912*a*, 912*b* may be excessively increased. At this time, the second right spring 851*a* may assist the second arm 912*a* to stand up so that the load on the motor assembly 810 can be decreased, thereby reducing the load on the motor assembly 810 to stand the second arm 912*a*.

Alternatively, when the second arm 912*a* changes from the standing state to the fully laid state with respect to the base 31, the restoring force provided by the second right spring 851*a* can alleviate the shock that occurs when the second arm 912*a* is laid with respect to the base 31. That is, the second right spring 851*a* may serve as a damper when the second arm 912*a* is laid with respect to the base 31. As the second right spring 851*a* serves as a damper, the load of the motor assembly 810 may be reduced.

The structure formed by the second left spring 851*b*, the left locking jaw 852*b*, the left slider 860*b*, the left guide 850*c*, 850*d*, and the second arm 912*a* may be symmetric with the structure formed by the above-described second right spring 851*a*, the right locking jaw 852*a*, the right slider 860*a*, the right guide 850*a*, 850*b*, and the second arm 912*a*. In this case, the axis of symmetry may be the axis of symmetry ys of the motor assembly 810.

Referring to FIGS. 50 to 52, the second arm 912*a* may stand up by receiving a restoring force from the first right spring 841*a* and the second right spring 851*a*.

An angle formed by the second arm 912*a* with respect to the base 31 may be referred to as an angle theta S. The angle formed by the right rod 870*a* with respect to the base 31 may be referred to as an angle theta T. The force applied by the motor assembly 810 for moving the right slider 860*a* in the +x-axis direction may be referred to as FA. The force exerted on the right slider 860*a* by the first right spring 841*a* may be referred to as FB. The force exerted on the right slider 860*a* by the second right spring 851*a* may be referred to as FC. The force transmitted by the right rod 870*a* to the second arm 912*a* may be referred to as FT.

When the second arm 912a is fully laid with respect to the base 31, the angle theta S and the angle theta T may have minimum values. When the second arm 912a changes from the fully laid state to the standing state with respect to the second base 31, the angle theta S and the angle theta T may be gradually increased.

When the second arm 912a is fully laid with respect to the base 31, the first right spring 841a may be compressed. The compressed first right spring 841a may provide restoring force FB to the right slider 860a. The restoring force FB may act in the +x direction. When the second arm 912a is fully laid with respect to the base 31, the compression displacement amount of the first right spring 841a may be maximized, and the magnitude of the restoring force FB may have a maximum value. When the second arm 912a changes from the fully laid state to the standing state with respect to the base 31, the compression displacement amount of the first right spring 841a may be gradually decreased, and the magnitude of the restoring force FB may be gradually decreased.

When the second arm 912a is fully laid with respect to the base 31, the second right spring 851a may be compressed. The compressed second right spring 851a may provide restoring force FC to the right slider 860a. The restoring force FC may act in the +x direction. When the second arm 912a is fully laid with respect to the base 31, the compression displacement amount of the second right spring 851a may be maximized, and the magnitude of the restoring force FC may have a maximum value. When the second arm 912a changes from the fully laid state to the standing state with respect to the base 31, the compression displacement amount of the second right spring 851a may be gradually decreased, and the magnitude of the restoring force FC may be gradually decreased.

The force FT that the right rod 870a transmits to the second arm 912a may be a summed force of the force FA applied by the motor assembly 810 for moving the right slider 860a in the +x-axis direction, the restoring force FB of the first right spring 841a, and the restoring force FC of the second right spring 851a.

When the second arm 912a starts to stand up in the state where the second arm 912a is fully laid with respect to the base 31, the load of the motor assembly 810 may be maximized. At this time, the magnitude of the restoring force FB provided by the first right spring 841a may be maximized. In addition, the magnitude of the restoring force FC provided by the second spring 851a, 851b may be maximized.

When the second arm 912a changes from the fully laid state to the standing state with respect to the base 31, the restoring force provided by the first right spring 841a and the second right spring 851a may assist to stand the second arm 912a. As the first right spring 841a and the second right spring 851a assist the second arm 912a to stand, the load of the motor assembly 810 can be reduced.

The first right spring 841a and the second right spring 851a may simultaneously provide the restoring force (the summed force of the restoring force FB and the restoring force FC) to the right slider 860a. The restoring force (the summed force of the restoring force FB and the restoring force FC) may be provided to the right slider 860a until the distance RD5 between the right slider 860a and the right locking jaw 852a becomes equal to the length of the second right spring 851a.

When the distance RD5 between the right slider 860a and the right locking jaw 852a is equal to the length of the second right spring 851a, the compression displacement amount of the second right spring 851a may become zero. When the compression displacement amount of the second right spring 851a is zero, the restoring force FC provided by the second right spring 851a to the right slider 860a may be zero.

When the distance RD5 between the right slider 860a and the right locking jaw 852a is greater than the length of the second right spring 851a, only the first right spring 841a may provide the restoring force FB to the right slider 860a. The restoring force FB may be provided to the right slider 860a until the distance RD6 between the right slider 860a and the second right bearing 830b becomes equal to the length of the first right spring 841a.

When the distance RD6 between the right slider 860a and the second right bearing 830b is equal to the length of the first right spring 841a, the compression displacement amount of the first right spring 841a may be zero. When the compression displacement amount of the first right spring 841a becomes zero, the restoring force FB provided by the first right spring 841a to the right slider 860a may be zero.

When the distance RD6 between the right slider 860a and the second right bearing 830b is greater than the length of the first right spring 841a, the motor assembly 810 may stand the second arm 912a without receiving the restoring force from the first right spring 841a or the second right spring 851a.

The structure formed by the first left spring 841b, the second left spring 851b, the left locking jaw 852b, the left slider 860b, the left guide 850c, 850d, the left lead screw 840b, the left rod 870b, and the second arm 912a may be symmetrical with the structure formed by the first right spring 841a, the second right spring 851a, the right locking jaw 852a, the right slider 860a, the right guide 850a, 850b, the right lead screw 840a, the right rod 870a, and the second arm 912a. In this case, the axis of symmetry may be the axis of symmetry ys of the motor assembly 810.

Referring to FIG. 53, the pusher 930a, 930b may be connected to the link mount 920a, 920b. The pusher 930a, 930b may include a right pusher 930a disposed in the right side of the motor assembly 810 and a left pusher 930b disposed in the left side of the motor assembly 810.

The link mount 920a, 920b may form an accommodation space A. The accommodation space A may accommodate the spring 940a, 940b and the pusher 930a, 930b. The spring 940a, 940b may include a right spring 940a disposed in the right side of the motor assembly 810 and a left spring 940b disposed in the left side of the motor assembly 810. The accommodation space A may be referred to as an internal space A.

The link mount 920a, 920b may include a first hole 922a connecting the accommodation space A and an external space (the first hole corresponding to 920b is not shown). The first hole 922a may be formed in the upper surface of the link mount 920a, 920b. The first hole 922a may be referred to as a hole 922a.

The pusher 930a, 930b may be located perpendicular to the base 31. Alternatively, the pusher 930a, 930b may be disposed parallel to the y axis. The spring 940a, 940b may be located perpendicular to the base 31. Alternatively, the spring 940a, 940b may be disposed parallel to the y axis.

The pusher 930a, 930b may include a first part 931a, 931b and a second part 932a, 932b. The second part 932a, 932b may be connected to the lower side of the first part 931a, 931b. The lower end of the second part 932a, 932b may be connected to the spring 940a, 940b. All or part of the second part 932a, 932b may be accommodated in the accommodation space A formed by the link mount 920a, 920b. The second part 932a, 932b may have a diameter equal to the diameter of the first hole 922a or may have a diameter smaller than the diameter of the first hole 922a. The second part 932a, 932b may penetrate the first hole 922a.

The first part 931a, 931b may be located outside the link mount 920a, 920b. Alternatively, the first part 931a, 931b may be located outside the accommodation space A of the link mount 920a, 920b. The first part 931a, 931b may have a diameter larger than the diameter of the first hole 922a.

The first part 931a, 931b may be in contact with or spaced apart from the link bracket 951a, 951b. For example, when the second arm 912a, 912b is fully laid with respect to the base 31, the first part 931a, 931b may be in contact with the link bracket 951a, 951b. Alternatively, when the second arm 912a, 912b fully stands up with respect to the base 31, the first part 931a, 931b may be spaced apart from the link bracket 951a, 951b.

When the first part 931a, 931b is in contact with the link bracket 951a, 951b, the pusher 930a, 930b may receive a force from the link bracket 951a, 951b. The force applied to the pusher 930a, 930b may be in a downward direction. Alternatively, the force applied to the pusher 930a, 930b may be in the −y axis direction. Alternatively, the link bracket 951a, 951b may press the pusher 930a, 930b. The direction in which the link bracket 951a, 951b presses the pusher 930a, 930b may be downward. Alternatively, the direction in which the link bracket 951a, 951b presses the pusher 930a, 930b may be in the −y axis direction.

When the first part 931a, 931b is applied with a force, the spring 940a, 940b may be compressed. The compressed spring 940a, 940b may provide restoring force to the pusher 930a, 930b. The direction of the restoring force may be opposite to the direction of the force applied to the first part 931a, 931b. Alternatively, the restoring force may act in the +y-axis direction.

The link mount 920a, 920b may include a second hole 921a (the second hole corresponding to 920b is not shown). The second hole 921a may connect the accommodation space A and the external space. All or part of the spring 940a, 940b may be exposed to the outside through the second hole 921a. All or part of the pusher 930a, 930b may be exposed to the outside through the second hole 921a. In the maintenance or repair of the display device, a service provider may check the operating state of the pusher 930a, 930b through the second hole 921a. The second hole 921a may provide a service provider with convenience of maintenance or repair.

Referring to FIGS. 54 to 56, the right link 910a may stand up by receiving the restoring force from the right pusher 930a. It will be described based on the right link 910a.

An angle formed by the second arm 912a with respect to the base 31 may be referred to as an angle theta S. The force transmitted by the right rod 870a to the second arm 912a may be referred to as FT. The force transmitted by the right pusher 930a to the right link bracket 951a may be referred to as FP.

Referring to FIG. 54, when the second arm 912a is fully laid with respect to the base 31, the angle theta S may have a minimum value. The right spring 940a connected to the right pusher 930a may be compressed maximally, and the magnitude of the restoring force FP may have a maximum value. The compressed right spring 940a may provide restoring force FP to the right pusher 930a. The right pusher 930a may transmit the restoring force FP to the right link bracket 951a. The restoring force FP can act in the +y-axis direction.

If the second arm 912a is fully laid with respect to the base 31, the distance HL from the base 31 to the upper end of the right pusher 930a may have a minimum value. The first part 931a of the right pusher 930a may protrude to the outside of the right link mount 920a, and the second part 932a of the right pusher 930a may be fully accommodated in the accommodation space 923a of the right link mount 920a.

Referring to FIG. 55, when the second arm 912a changes from the fully laid state to the standing state with respect to the base 31, the angle theta S may gradually increase. The compression displacement amount of the right spring 940a may gradually decrease, and the magnitude of the restoring force FP may gradually decrease.

As the angle theta S gradually increases, at least a part of the second part 932a of the right pusher 930a may protrude to the outside of the right link mount 920a. The length by which the second part 932a of the right pusher 930a protrudes to the outside of the right link mount 920a may be referred to as a length HP. The distance HL from the base 31 to the upper end of the right pusher 930a may increase by HP than a case where the second arm 912a is fully laid with respect to the base 31.

Referring to FIG. 56, when the second arm 912a stands up with respect to the base 31, the right pusher 930a and the right link bracket 951a may be separated from each other. The compression displacement amount of the right spring 940a may be zero. When the compression displacement amount of the right spring 940a becomes zero, the restoring force FP provided by the right pusher 930a to the right link bracket 951a may be zero.

In addition, the length HP by which the second part 932a of the right pusher 930a protrudes to the outside of the right link mount 920a may have a maximum value. The distance HL from the base 31 to the upper end of the right pusher 930a may have a maximum value.

That is, the right pusher 930a may assist the second arm 912a to stand and reduce the load of the motor assembly 810 by applying a restoring force to the right link bracket 951a, while the right pusher 930a and the right link bracket 951a are in contact with each other.

The lead screw 840a, 840b may be driven by a single motor assembly 810. As the lead screw 840a, 840b is driven by a single motor assembly 810, the second arm 912a, 912b can stand up in symmetry. However, when the lead screw 840a, 840b is driven by a single motor assembly 810, the load on the motor assembly 810 to stand the second arm 912a, 912b may be excessively increased. At this time, the right pusher 930a may apply the restoring force to the right link bracket 951a, thereby assisting the second arm 912a to stand up and reducing the load of the motor assembly 810.

Alternatively, when the second arm 912a changes from the standing state to the fully laid state with respect to the base 31, the restoring force that the right pusher 930a provides to the right link bracket 951a can alleviate the shock that occurs when the link 910a is laid with respect to the base 31. That is, the restoring force provided by the right pusher 930a to the right link bracket 951a may serve as a damper when the link 910a is laid with respect to the base 31. As the right pusher 930a serves as a damper, the load of the motor assembly 810 may be reduced.

The structure formed by the left pusher 930b, the left spring 940b, the left link bracket 951b, the left link mount 920b, and the left rod 870b may be symmetric with the structure formed by the right pusher 930a, the right spring 940a, the right link bracket 951a, the right link 910a mount, and the right rod 870a. In this case, the axis of symmetry may be the axis of symmetry of the motor assembly 810.

Referring to FIGS. 57 to 59, the panel roller 143 may be installed in the base 31. The panel roller 143 may be installed in front of the lead screw 840a, 840b. Alternatively, the panel roller 143 may be disposed in parallel with the length direction of the lead screw 840a, 840b. Alternatively, the panel roller 143 may be spaced apart from the lead screw 840a, 840b.

The display unit 20 may include a display panel 10 and a module cover 15. The lower side of the display unit 20 may be connected to the panel roller 143, and the upper side of the display unit 20 may be connected to the upper bar 75. The display unit 20 may be wound around or unwound from the panel roller 143.

The distance from the axis of symmetry ys of the motor assembly 810 to the right slider 860a may be referred to as a distance RD. The distance from the axis of symmetry ys of the motor assembly 810 to the left slider 860b may be referred to as a distance LD. The distance between the right slider 860a and the left slider 860b may be referred to as a distance SD. The distance SD may be the sum of the distance RD and the distance LD. The distance from the base 31 to the upper end of the display unit 20 may be referred to as a distance HD.

Referring to FIG. 57, when the second arm 912a, 912b is fully laid with respect to the base 31, the distance SD between the right slider 860a and the left slider 860b may have a minimum value. The distance RD from the axis of symmetry ys of the motor assembly 810 to the right slider 860a may be the same as the distance LD from the axis of symmetry ys of the motor assembly 810 to the left slider 860b.

When the second arm 912a, 912b is fully laid with respect to the base 31, the distance HD from the base 31 to the upper end of the display unit 20 may have a minimum value.

When the second arm 912a, 912b is fully laid with respect to the base 31, the first spring 841a, 841b may contact the slider 860a, 860b. In addition, the second spring 851a, 851b may contact the slider 860a, 860b. In addition, the pusher 930a, 930b may contact the link bracket 951a, 951b.

When the second arm 912a, 912b is fully laid with respect to the base 31, the amount of compression of the first spring 841a, 841b may have a maximum value, and the magnitude of the restoring force provided to the slider 860a, 860b by the first spring 841a, 841b may have a maximum value.

When the second arm 912a, 912b is fully laid with respect to the base 31, the amount of compression of the second spring 851a, 851b may have a maximum value, and the magnitude of the restoring force provided to the slider 860a, 860b by the second spring 851a, 851b may have a maximum value.

When the second arm 912a, 912b is fully laid with respect to the base 31, the amount of compression of the spring 940a, 940b may have a maximum value, and the magnitude of the restoring force provided to the pusher 930a, 930b by the spring 940a, 940b may have a maximum value.

When the second arm 912a, 912b start to stand with respect to the base 31, the second arm 912a, 912b may stand by receiving a restoring force from the first spring 841a, 841b, the second spring 851a, 851b, and the spring 940a, 940b. Thus, the load on the motor assembly 810 may be reduced.

Referring to FIG. 58, as the second arm 912a, 912b stands with respect to the base 31, the distance SD between the right slider 860a and the left slider 860b may gradually increase. Even if the distance SD increases, the distance LD and the distance RD may be equal to each other. That is, the right slider 860a and the left slider 860b may be symmetrically located with respect to the axis of symmetry ys of the motor assembly 810. In addition, the extent to which the second arm 912a, 912b of the right link 910a stands with respect to the base 31 and may be equal to the extent to which the second arm 912a, 912b of the left link 910b stands with respect to the base 31.

As the second arm 912a, 912b stands with respect to the base 31, the distance HD from the base 31 to the upper end of the display unit 20 may gradually increase. The display unit 20 may be unwound from the panel roller 143. Alternatively, the display unit 20 may be unfolded from the panel roller 143.

When the second arm 912a, 912b fully stands up with respect to the base 31, the first spring 841a, 841b may be separated from the slider 860a, 860b. In addition, when the second arm 912a, 912b fully stands up with respect to the base 31, the second spring 851a, 851b may be separated from the slider 860a, 860b. In addition, when the second arm 912a, 912b stands up with respect to the base 31, the pusher 930a, 930b may be separated from the link bracket 951a, 951b.

The separation of the first spring 841a, 841b from the slider 860a, 860b, the separation of the second spring 851a, 851b from the slider 860a, 860b, and the separation of the pusher 930a, 930b from the link bracket 951a, 951b may proceed independently of each other. That is, the order of the separation of the first spring 841a, 841b from the slider 860a, 860b, the separation of the second spring 851a, 851b from the slider 860a, 860b, and the separation of the pusher 930a, 930b from the link bracket 951a, 951b may be mutually variable.

The angle formed between the axis xs1 parallel to the base 31 and the second arm 912a may be referred to as theta R. The angle formed between the axis xs1 parallel to the base 31 and the first arm 911a may be referred to as theta R'. The axis xs1 and x-axis may be parallel.

When the second arm 912a is fully laid with respect to the base 31, or while the second arm 912a stands up with respect to the base 31, or when the standing of the second arm 912a with respect to the base 31 is completed, theta R and theta R' can be maintained to be the same.

The angle formed between the axis xs2 parallel to the base 31 and the second arm 912b may be referred to as theta L. The angle formed between the axis xs2 parallel to the base 31 and the first arm 911b may be referred to as theta L'. The axis xs2 and x-axis may be parallel.

When the second arm 912b is fully laid with respect to the base 31, or while the second arm 912b stands up with respect to the base 31, or when the standing of the second arm 912a with respect to the base 31 is completed, theta L and theta L' can be maintained to be the same. The axis xs1 and the axis xs2 may be the same axis mutually.

Referring to FIG. 59, when the second arm 912a, 912b fully stands up with respect to the base 31, the distance SD between the right slider 860a and the left slider 860b may have a maximum value. Even when the distance SD is maximized, the distance LD and the distance RD may be equal to each other.

When the second arm 912a, 912b fully stands up with respect to the base 31, the distance HD from the base 31 to the upper end of the display unit 20 may have a maximum value.

Referring to FIG. 60, a link 910 (910a and 910b) may be adjacent to a rear surface of a module cover 15 and pivoted around a pivot axis which is in line with a front and rear direction FR. Here, there may be a plurality of pivot axes, and each of the plurality of pivot axes may connect first arms 911a and 911b and link brackets 951a and 951b, connect the first arms 911a and 911b and arm joints 913a and 913b, connect second arms 912a and 912b and the arm joints 913a and 913b, or connect the second arms 912a and 912b and rods 870a and 870b.

Further, the links 910a and 910b may be pivotably connected to the slide 820 (see FIGS. 40 to 42) installed inside the housing 30 through the rods 870a and 870b. Here, the links 910a and 910b may be referred to as foldable link.

The link 910a, 910b may be folded or unfolded in an up and down direction UD in response to a motion of the slide 820 which moves forward and backward in a left and right direction LR by rotation of the lead screw 840. As a result, the link bracket 951a, 951b, and the top case 950 coupled to one side of the link 910a, 910b may ascend or descend with respect to the housing 30. That is, the display unit 20 of which upper end is fixed to the top case 950 may be unrolled from or rolled on the roller 143 according to the motion of the top case 950.

However, as the link 910a, 910b which pivots is in contact with the rear surface of the module cover 15, a scratch or a stain (ST) may be generated on the rear surface of the module cover 15, so it is necessary to prevent the scratch or stain.

Referring to FIG. 61, a sheet 970 may be coupled to a link 910 between the module cover 15 and the link 910 (911, 912, 913). The sheet 970 may be coupled to a front surface of the link 910, and may face the rear surface of the module cover 15. Fro example, the sheet 970 may be positioned in a partial area of a first arm 911 or a second arm 912. Here, the sheet 970 contains a material capable of preventing the scratch or stain (ST) from being generated on the rear surface of the module cover 15, and will be described below in more detail.

Referring to FIG. 62, the link 910 (911, 912, 913) may elongate. In this case, the sheet 970 may include a plurality of sheets 970a, 970b, and 970c spaced apart from each other in a longitudinal direction of the link 910.

When the motion of the module cover 15 which is rolled on or unrolled from the roller 143 installed inside the housing 30 while descending or ascending in response to the pivot operation of the link 910 is considered, a possibility that the scratch or stain (ST) will be generated in the module cover 15 according to the pivot operation of the first arm 911 may be relatively high. That is, a time when or a possibility that the first arm 911 positioned above the arm joint 913 will be in contact with the module cover 15 may be relatively higher than the second arm 912 positioned below the arm joint 913.

For example, the number of sheets 970 coupled to the first arm 911 may be relatively larger than the number of sheets 970 coupled to the second arm 912. In this case, it is possible to effectively prevent the scratch or stain (ST) from being generated on the rear surface of the module cover 15 according to the pivot operation of the first arm 911.

Referring to FIG. 63, the sheet 970 may include a first sheet 970d and a second sheet 970e coupled to the first arm 911 and the second arm 912, respectively. The first sheet 970d and the second sheet 970e may elongate in the longitudinal directions of the first arm 911 and the second arm 912.

As a result, it is possible to effectively prevent the scratch or stain (ST) from remaining in the module cover 15 as the first arm 911 and the second arm 912 are in contact with the module cover 15 by the first sheet 970d and the second sheet 970e.

Referring to FIGS. 8 and 64, the guide bar 234 may be spaced apart from the roller 143 in a radial direction of the roller 143 and installed in the housing 30. In this case, the guide bar 234 are in contact with the front surface of the display panel to prevent the display panel 10 and the module cover 15 from being bent toward a rotary center of the roller 143. Further, the guide bar 234 may prevent the display panel 10 and the module cover 15 from flowing forward during the rolling or deployment operation.

The display panel 10 and the module cover 15 positioned on an upper side based on a boundary Bo crossing the center of the guide bar 234 in the front and rear direction FR may be positioned in line in the up and down direction. In this case, a first part 912a of the second arm 912 facing the rear surface of the module cover 15 may be spaced apart from the rear surface of the module cover 15 by a first gap GA1.

The display panel 10 and the module cover 15 positioned on a lower side based on the boundary Bo may be positioned to cross in the up and down direction UD. In this case, a second part 912b positioned on the lower side of the first part 912a of the second arm 912 may be spaced apart from the rear surface of the module cover 15 by a second gap GA2. In this case, the second gap GA2 may increase to be adjacent to the rotary center of the roller 143.

The first gap GA1 may be smaller than the second gap GA2. That is, a possibility that the scratch or stain (ST) will be generated in the module cover 15 by the first part 912a may be relatively higher than the second part 912b.

In this case, the sheet 970 is coupled to the first part 912a on the upper side of the guide bar 234 or the boundary Bo to prevent the scratch or stain (ST) from being generated in the module cover 15.

Referring to FIG. 65, the first arm 911 or the second arm 912 may include a seating portion 980 which forms a step while being dented backward in the first arm 911 or the second arm 912. In this case, a thickness of the first arm 911 or the second arm 912 may be t1 and a depth of the seating portion 980 may be t2. In addition, t2 may be smaller than t1.

The sheet 9710 may be coupled to the seating portion 980. In this case, the front surface of the sheet 971 may be spaced apart from the rear surface of the module cover 15 by a third gap GA3. For example, the front surface of the sheet 971 may be positioned in front of the front surface of the first arm 911 or the second arm 912. In this case, the thickness t3 of the sheet 971 may be larger than the depth t2 of the seating portion 980. Further, the first gap GA1 which is a gap between the front surface of the first arm 911 or the second arm 912 and the rear surface of the module cover 15 may be larger than the third gap GA3.

The sheet 971 may include an adhesive layer 971a and a coating layer 971b. Here, a sum of a thickness t31 of the adhesive layer 971a and a thickness t32 of the coating layer 971b may be t3. For example, the thickness t31 of the adhesive layer 971a may be 0.05 and the thickness t32 of the coating layer 971b may be 0.08 mm.

The adhesive layer 971a may be positioned in the rear of the coating layer 971b, and coupled to the seating portion 980 of the first arm 911 or the second arm 912. For example, the adhesive layer 971a may be an adhesive made of a silicon (Si) material.

The coating layer 971b may be coupled to the front surface of the adhesive layer 971a. The coating layer 971b forms the front surface of the sheet 971 to face while being spaced apart from the rear surface of the module cover 15. The front surface of the coating layer 971b may be spaced apart from the rear surface of the module cover 15 by the third gap GA3. A frictional coefficient of the coating layer 971b may be lower than a frictional coefficient of the first arm 911 or the second arm 912. The coating layer 971b may include a fiber material. For example, the coating layer 971b may include a teflon material. For example, a static frictional coefficient of a coating layer 972f for the module cover 15 may be 0.10 and a dynamic frictional coefficient may be 0.09. Further, a glass fiber 971c may be positioned inside the coating layer 971b. For example, the first arm 911 or the second arm 912 may include a metallic material such as aluminum (Al).

As a result, the rear surface of the module cover 15 is spaced apart from the front surface of the sheet 971 to prevent the scratch or stain (ST) from being generated in the module cover 15 due to the contact of the first arm 911 or the second arm 912 and the module cover 15. Further, even though the rear surface of the module cover 15 is in contact with the front surface of the sheet 971 with the flowing of the module cover 15, it is possible to prevent the scratch or stain (ST) from being generated on the rear surface of the module cover 15 by the sheet 971 made of a low-friction material.

Referring to FIG. 66, the sheet 972 may be coupled to the seating portion 980 and may face the rear surface of the module cover 15. The front surface of the sheet 972 may be spaced apart from the rear surface of the module cover 15 by a fourth gap GA4.

The sheet 972 may include rear adhesive layers 972a, 972b, and 972c, a soundproof layer 972d, a front adhesive layer 972e, and the coating layer 972f. Here, a sum of a thickness t41+t42+t43 of the rear adhesive layers 972a, 972b, and 972c, a thickness t44 of the soundproof layer 972d, a thickness t45 of the front adhesive layer 972e, and a thickness t46 of the coating layer 972f may be t4. For example, the thickness t41+t42+t43 of the rear adhesive layers 972a, 972b, and 972c may be 0.13 mm, the thickness t44 of the soundproof layer 972d may be 0.15 mm, the thickness t45 of the front adhesive layer 972e may be 0.05 mm, and the thickness t46 of the coating layer 972f may be 0.08 mm. In this case, t4 may be 0.41 mm.

The rear adhesive layers 972a, 972b, and 972c may be coupled to the seating portion 980 of the first arm 911 or the second arm 912. For example, the rear adhesive layers 972a, 972b, and 972c may include a first adhesive layer 972a of an acrylic material, a second film layer 972b of a polyethylene terephthalate (PET) material, and a third adhesive layer 972c of the acrylic material.

The first adhesive layer 972a may form the rear surface of the rear adhesive layer, and may be coupled to the seating portion 980. For example, the thickness t41 of the first adhesive layer 972a may be 0.04 mm. The second film layer 972b may be coupled to the front surface of the first adhesive layer 972a. For example, the thickness t42 of the second film layer 972b may be 0.05 mm. The third adhesive layer 972c may form the front surface of the rear adhesive layer, and may be coupled to the front surface of the second film layer 972b. For example, the thickness t43 of the third adhesive layer 972c may be 0.04 mm.

The soundproof layer 972d may be coupled to the front surface of the third adhesive layer 927c. The soundproof layer 972d may include a soundproof material. For example, the soundproof layer 972d may include a polyurethane or polyurethane foam material.

The front adhesive layer 972e may be coupled to the front surface of the soundproof layer 972d. For example, the front adhesive layer 972e may be an adhesive made of the silicon (Si) material.

The coating layer 972f may be coupled to the front surface of the front adhesive layer 972e. The coating layer 972f forms the front surface of the sheet 972 to face the rear surface of the module cover 15 while being spaced apart from the rear surface of the module cover 15. The front surface of the coating layer 972f may be spaced apart from the rear surface of the module cover 15 by the fourth gap GA4. For example, the first gap GA1 may be 0.08 mm and the depth t2 of the seating portion 980 may be 0.02 mm. In this case, the fourth gap GA4 may be 0.59 mm.

A frictional coefficient of the coating layer 972f may be lower than the frictional coefficient of the first arm 911 or the second arm 912. The coating layer 972f may include the fiber material. For example, the coating layer 972F may include the teflon material. For example, a static frictional coefficient of the coating layer 972f for the module cover 15 may be 0.10 and a dynamic frictional coefficient may be 0.09. Further, a glass fiber 972g may be positioned inside the coating layer 972f. For example, the first arm 911 or the second arm 912 may include the metallic material such as aluminum (Al).

For example, the depth t2 of the seating portion 980 may be 0.2 to 0.23 and the thickness of the sheet 972 may be 0.4 to 0.43 mm. In this case, the front surface of the sheet 972 and the rear surface of the module cover 15 may be spaced apart from each other by 0.5 to 0.7 mm.

As a result, the rear surface of the module cover 15 is spaced apart from the front surface of the sheet 972 to prevent the scratch or stain (ST) from being generated in the module cover 15 due to the contact of the first arm 911 or the second arm 912 and the module cover 15. Further, even though the rear surface of the module cover 15 is in contact with the front surface of the sheet 972 with the flowing of the module cover 15, it is possible to prevent the scratch or stain (ST) from being generated on the rear surface of the module cover 15 by the sheet 972 made of a low-friction material.

In addition, it is possible to prevent the frictional noise from being generated due to the trembling depending on the flowing of the module cover 15 or the link 910 as the rear surface of the module cover 15 is not excessively spaced apart from the front surface of the sheet 972. Further, the frictional noise generated by the soundproof layer 972d may be reduced.

Referring to FIG. 67, the sheet 973 may be coupled to the front surface of the first arm 911 or the second arm 912 and may face the rear surface of the module cover 15. The front surface of the sheet 973 may be spaced apart from the rear surface of the module cover 15 by a fifth gap GA5.

The sheet 973 may include a rear adhesive layer 973a, a soundproof layer 973b, a front adhesive layer 973c, and the coating layer 973d. Here, a sum of a thickness t51 of the rear adhesive layer 973a, a thickness t52 of the soundproof layer 973b, a thickness t53 of the front adhesive layer 973c, and a thickness t54 of the coating layer 973e may be t5. For example, the thickness t51 of the rear adhesive layer 973a may be 0.04 mm, the thickness t52 of the soundproof layer 973b may be 0.15 mm, the thickness t53 of the front adhesive layer 973c may be 0.05 mm, and the thickness t54 of the coating layer 973d may be 0.08 mm. In this case, t5 may be 0.32 mm.

The rear adhesive layer 973a may be coupled to the front surface of the first arm 911 or the second arm 912. For example, the rear adhesive layer 973a may be an adhesive made of the acrylic material.

The soundproof layer 973b may be coupled to the front surface of the rear adhesive layer 973a. The soundproof layer 973b may include the soundproof material. For example, the soundproof layer 973b may include the polyurethane or polyurethane foam material.

The front adhesive layer 973c may be coupled to the front surface of the soundproof layer 973b. For example, the front adhesive layer 973c may be an adhesive made of the silicon (Si) material.

The coating layer 973d may be coupled to the front surface of the front adhesive layer 973c. The coating layer 973d forms the front surface of the sheet 973 to face the rear surface of the module cover 15 while being spaced apart from the rear surface of the module cover 15. The front surface of the coating layer 973d may be spaced apart from the rear surface of the module cover 15 by the fifth gap GA5. In this case, the fifth gap GA5 may be 0.5 mm.

A frictional coefficient of the coating layer 973d may be lower than the frictional coefficient of the first arm 911 or the second arm 912. The coating layer 973d may include the fiber material. For example, the coating layer 973d may include the teflon material. For example, a static frictional coefficient of the coating layer 972f for the module cover 15 may be 0.10 and a dynamic frictional coefficient may be 0.09. Further, a glass fiber 973e may be positioned inside the coating layer 973d. For example, the first arm 911 or the second arm 912 may include the metallic material such as aluminum (Al).

As a result, the scratch or stain (ST) may be prevented from being generated on the rear surface of the module cover 15 by the sheet 973, and the frictional noise generated by the trembling depending on the flowing of the module cover 15 or the link 910 may be reduced.

According to one aspect of the present disclosure, there is provided a display device including: a roller which elongates; a display panel rolled on or unrolled from the roller; a module cover positioned in the rear of the display panel; a foldable link adjacent to a rear surface of the module cover, and pivoted around a pivot axis which is in line with a front and rear direction and folded or unfolded in an up and down direction; and a sheet coupled to the foldable link between the module cover and the foldable link, in which a frictional coefficient of the sheet is lower than the frictional coefficient of the foldable link.

Further, according to another aspect of the present disclosure, a front surface of the sheet may be positioned in front of the front surface of the foldable link, and the frictional coefficient of the front surface of the sheet may be lower than the frictional coefficient of the front surface of the foldable link.

Further, according to another aspect of the present disclosure, the sheet may further include a coating layer forming the front surface, and an adhesive layer positioned in the rear of the coating layer and coupled to the foldable link, and the coating layer may be spaced apart from a rear surface of the module cover.

Further, according to another aspect of the present disclosure, the coating layer may include a teflon material.

Further, according to another aspect of the present disclosure, the sheet may further include a soundproof layer positioned between the coating layer and the adhesive layer, and including a soundproof material.

Further, according to another aspect of the present disclosure, the soundproof layer may include a polyurethane foam material.

Further, according to another aspect of the present disclosure, the foldable link may further include a seating portion which forms a step while being dented backward in the foldable link, and the sheet may be coupled to the seating portion.

Further, according to another aspect of the present disclosure, a depth of the seating portion may be smaller than a thickness of the sheet, and the front surface of the sheet may be spaced apart from the rear surface of the module cover.

Further, according to another aspect of the present disclosure, the front surface of the sheet and the rear surface of the module cover may be spaced apart from each other by a length of 0.5 to 0.7 mm.

Further, according to another aspect of the present disclosure, the depth of the seating portion may be 0.2 to 0.23 mm, and the thickness of the sheet may be 0.4 to 0.43 mm.

Further, according to another aspect of the present disclosure, the foldable link may elongate, and the sheet may further include a plurality of sheets spaced apart from each other in a longitudinal direction of the foldable link.

Further, according to another aspect of the present disclosure, the display device may further include: a housing accommodating the roller therein; and a guide bar spaced apart from the roller in a radial direction of the roller and installed in the housing, and being in contact with the front surface of the display panel, and the sheet may be positioned above the guide bar when the display panel and the module cover are maximally unrolled from the roller.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A display device comprising:
a roller which elongates;
a display panel configured to roll or unroll from the roller;
a module cover positioned in a rear portion of the display panel;
a foldable link adjacent to a rear surface of the module cover, and configured to pivot around a pivot axis which is in line with a front direction and a rear direction and to fold or unfold in an up direction or a down direction, respectively; and
a sheet coupled to the foldable link between the module cover and the foldable link,
wherein the sheet includes a coating layer forming a front surface of the sheet and facing the module cover,
wherein the coating layer contains a glass fiber, and wherein a frictional coefficient of the coating layer is lower than a frictional coefficient of a front surface of the foldable link.

2. The display device of claim 1, wherein
the front surface of the sheet protrudes from the front surface of the foldable link.

3. The display device of claim 1, wherein the sheet further includes:
an adhesive layer positioned in a rear portion of the coating layer and coupled to the foldable link, and
wherein the coating layer is spaced apart from a rear surface of the module cover.

4. The display device of claim 3, wherein the coating layer includes a Poly TetraFluoroEthylene material.

5. The display device of claim 3, wherein the sheet further includes a soundproof layer positioned between the coating layer and the adhesive layer, the soundproof layer including a soundproof material.

6. The display device of claim 5, wherein the soundproof layer includes a polyurethane foam material.

7. The display device of claim 1, wherein the foldable link further includes a seating portion which forms a step by being recessed backward on the front surface of the foldable link, and
wherein the sheet is coupled to the seating portion.

8. The display device of claim 7, wherein a depth of the seating portion is smaller than a thickness of the sheet, and
wherein the front surface of the sheet is spaced apart from the rear surface of the module cover.

9. The display device of claim 8, wherein the front surface of the sheet and the rear surface of the module cover are spaced apart from each other by a length of 0.5 to 0.7 mm.

10. The display device of claim 9, wherein the depth of the seating portion is 0.2 to 0.23 mm, and
wherein the thickness of the sheet is 0.4 to 0.43 mm.

11. The display device of claim 1, wherein the foldable link is configured to elongate, and
wherein the sheet further includes a plurality of sheets spaced apart from each other in a longitudinal direction of the foldable link.

12. The display device of claim 1, further comprising:
a housing accommodating the roller therein; and
a guide bar spaced apart from the roller in a radial direction of the roller and installed in the housing, the guide bar being in contact with the front surface of the display panel,
wherein the sheet is positioned above the guide bar when the display panel and the module cover are maximally unrolled from the roller.

* * * * *